United States Patent [19]

Yoneda

[11] Patent Number: 5,388,065
[45] Date of Patent: Feb. 7, 1995

[54] SEMICONDUCTOR INTEGRATED CIRCUIT

[75] Inventor: Masato Yoneda, Tokyo, Japan

[73] Assignee: Kawasaki Steel Corporation, Kobe, Japan

[21] Appl. No.: 883,595

[22] Filed: May 14, 1992

[30] Foreign Application Priority Data

| May 16, 1991 | [JP] | Japan | 3-111771 |
| May 21, 1991 | [JP] | Japan | 3-116163 |
| Aug. 30, 1991 | [JP] | Japan | 3-219687 |
| Sep. 11, 1991 | [JP] | Japan | 3-232073 |
| Sep. 19, 1991 | [JP] | Japan | 3-239890 |

[51] Int. Cl.$^6$ ............................................. G11C 13/00
[52] U.S. Cl. ............................ 365/49; 365/190; 365/189.01; 365/154; 365/185
[58] Field of Search ............... 365/49, 190, 189.01, 365/154, 182, 185

[56] References Cited

U.S. PATENT DOCUMENTS

| 3,701,980 | 10/1972 | Mundy. | |
| 3,750,115 | 7/1973 | Mundy. | |
| 3,846,766 | 11/1974 | Nojima et al. | |
| 5,051,948 | 9/1991 | Watabe et al. | 365/49 |

FOREIGN PATENT DOCUMENTS 1-194196  4/1989  Japan.

OTHER PUBLICATIONS

Carlstedt, E. A., IEEE Journal of Solid–State Circuits, vol. 8, No. 5, Oct. 1973, New York US, pp. 338–343.
"Design of CMOS VLSI", pp. 167–169 and 176–177, Edited by Tetsuya Iizuka and Supervised by Takuo Sugano, Baifukan, 1989.

Primary Examiner—Eugene R. LaRoche
Assistant Examiner—Huan Hoang
Attorney, Agent, or Firm—Oliff & Berridge

[57] ABSTRACT

A semiconductor integrated circuit is a CAM memory which comprises at least one memory cell including a first storage unit for defining the electrical connection and otherwise the non-connection between a first data line and a match line and a second storage unit for defining the electrical non-connection and otherwise the connection between a second data line and the match line, and a control word line for controlling said first and second storage units in the memory cell, the match line corresponding to at least one of the control word lines, the control word line being used to effect the connection and otherwise non-connection between each of said first and second data lines and the match line in accordance with the definition of connections of said first and second storage units. Moreover, the storage unit can be composed of a coupler of a nonvolatile memory element such as a MONOS-type nonvolatile memory element, PROM, EPROM EEPROM, UVE-PROM and a like, and the memory cell further may include at least one selective transistor. The CAM memory comprises at least one of potential detecting means of defecting an electric potential of the match line, holding means for holding the result of detection in response to each control word line and preventing means for preventing the through current between the memory cells in conformity with and in nonconformity with the retrieval data.

77 Claims, 33 Drawing Sheets

F I G. 7
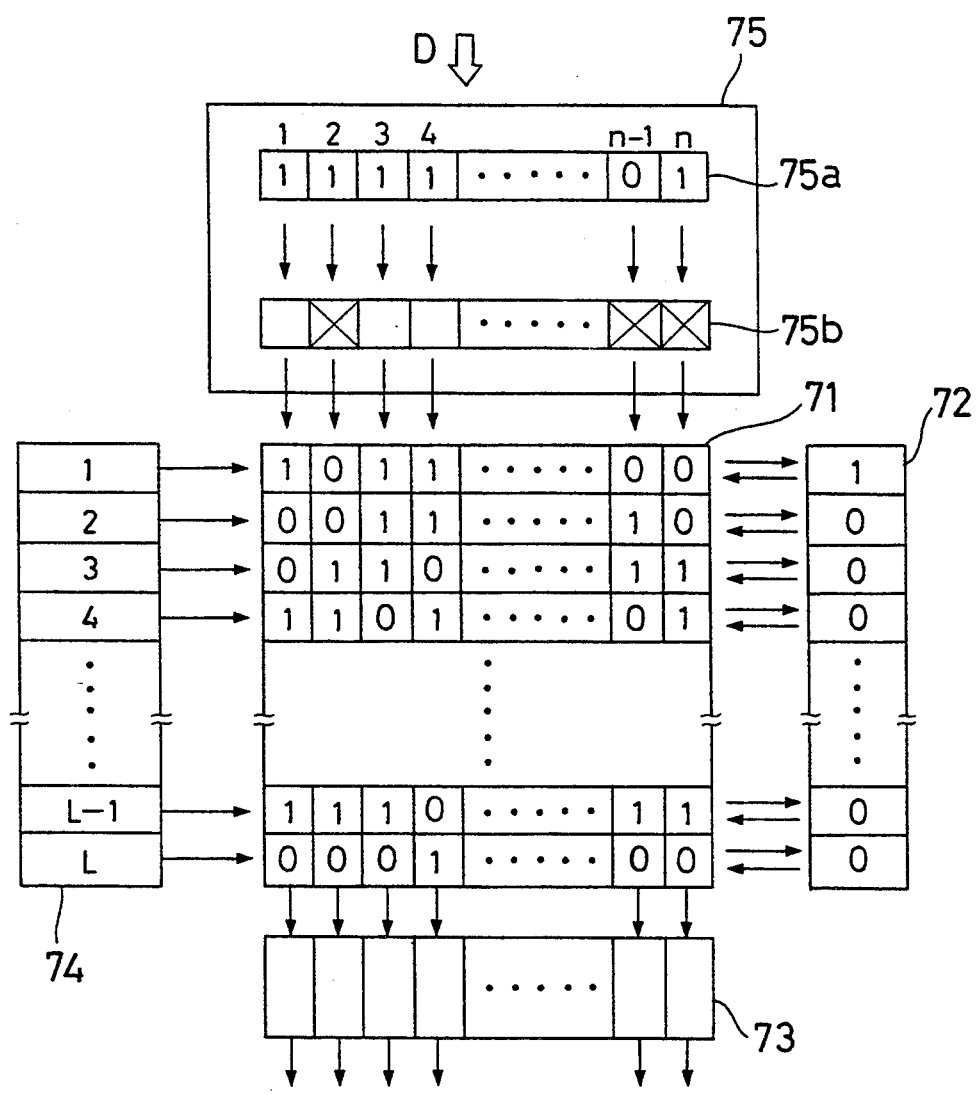

SEMICONDUCTOR INTEGRATED CIRCUIT

BACKGROUND OF THE INVENTION

The present invention relates to CAM (Content Addressable Memory).

Heretofore, complete parallel CAMs (Content Addressable Memories), which are also called associative memories, have been widely known as semiconductor storage circuits having the functions of performing the identity detection of retrieval data and stored data concurrently in terms of all bits and outputting the storage address of identity data or data (see "*Design of Super LSI,*" pp 176–177, edited by Tetsuya Iizuka and supervised by Takuo Sugano, Baifukan).

However, the bitwise configuration of a typical conventional CAM memory comprising SRAM cells and exclusive NOR circuits has made it impossible to provide CAM having a large-sized cell and consequently a capacity at a level fit for practical use.

In many IC cards that have recently been commercialized as personal data bases, for instance, no CAM has been arranged as stated above. In such an IC card, an arrangement has been made to find out data for the intended purpose by sequentially retrieving data one after another from ROM (Read Only Memory) in which the data are prestored. For this reason, the greater the number of data becomes, as in language dictionary such as Japanese and English-Japanese dictionaries, the more it requires time to retrieve data. In other words, what has high- speed, flexible retrieval functions is still nonexistent.

If all data are made retrievable at a time as in the case of CAM, not by retrieving data one by one with the aid of software from the conventional ROM and the like used to store the data in the prior art, data retrieval from the IC card equipped with a large capacity ROM may be implemented with flexibility at high speed.

U.S. Pat. No. 3,701,980 (October 1972) and Japanese Patent Laid-Open No. 194196/1989, for instance, suggest the possibility of large capacity associative memories. The former U.S patent discloses a CAM memory cell construction with DRAM as a base, having a set of ordinary 2-bit memories, whereas the latter discloses CAM with an EPROM nonvolatile memory as a base, also having a set of ordinary 2-bit EPROM memories. Consequently, both of them can be subjected to integration larger in scale than that of CAM with SRAM as a base.

Notwithstanding, the construction with DRAM as a base still poses a problem in view of its area size. In the case of CAM with EPROM as a base, flexible write/-read is impossible.

As set forth above, there has not yet been proposed a means effective in giving birth to a large scale integrated flexible CAM.

BRIEF SUMMARY OF THE INVENTION

In view of the foregoing problems, it is an object of the present invention to provide a semiconductor integrated circuit as a flexible, large scale integrated CAM wherein a high-speed, large capacity data base can be built up.

In view of the foregoing problems, it is another object of the present invention to provide a semiconductor integrated circuit which permits data to be retrieved from a Large number of memory cells without electrical and mutual interference, simultaneously with the building-up of a high-speed, large capacity data base.

What is claimed is:

To achieve above-described objects of the present invention, there is provided by its first aspect of the present invention a semiconductor integrated circuit comprising a memory cell including a first storage unit for defining the electrical connection and otherwise the non-connection between a first data line and a match line and a second storage unit for defining the electrical non-connection and otherwise the connection between a second data line and said match line, at least a selective transistor provided between at least one of said first and second storage units of the memory cell and said match line or between said first and second storage units and said first and second data lines, and a control word line for controlling said selective transistor, said control word line being used to effect the connection and otherwise non-connection between each of said first and second data lines and said match line in accordance with the definition of connections of said first and second storage units. Preferably, said match line further has potential detecting means for detecting an electric potential of said match line.

There is provided by its second aspect of the present invention a semiconductor integrated circuit comprising a plurality of retrieval memory word blocks, said block including a set of a memory cell having a first storage unit for defining the electrical connection and otherwise the non-connection between a first data line and a match line and a second storage unit for defining the electrical non-connection and otherwise the connection between a second data line and said match line, at least a selective transistor provided between at least one of said first and second storage units of the memory cell and said match line or between said first and second storage units and said first and second data lines, and a control word line for controlling said selective transistor, with said first data line, said second data line and said match line as those which are commonly used for said plurality of retrieval memory word blocks, and a potential detecting means for detecting an electric potential of said common match line connected to couplers of the first and second storage units of the memory in the plurality of retrieval memory word blocks, said selective transistors therein or couplers of the selective transistors of the memory cells therein, control word line being used to effect connection and otherwise non-connection between each of said first and second data lines and said match line in accordance with the definition of connections of said first and second storage units.

Preferably, in each aspect, said storage unit for defining the electrical connection is composed of a coupler. Preferably, said storage unit is composed of a nonvolatile memory element. Preferably, both said first and second storage units are composed of a nonvolatile memory element and each nonvolatile memory element is connected to each selective transistor. Preferably, said nonvolatile memory element is a MONOS-type nonvolatile memory element.

Preferably, said match line further has fixing means for fixing an electric potential of said match line.

Preferably, said control word line further has potential non-fixing means and connection means for connecting to said match line, said connection means and said potential non-fixing means are made active at the time of data retrieval operation, and the potential variation of said match line is positively corelated to that of said control word line, wherein it is preferred in the first aspect that said selective transistor is a unidirectional element.

Preferably, in the second aspect, said semiconductor integrated circuit further comprises a common connection line connected to couplers of the first and second storage units of the memory in the plurality of retrieval memory word blocks, said selective transistors therein or couplers of the selective transistors of the memory cells therein, and a unidirectional element provided between said common connection line and said match line. Preferably, said semiconductor integrated circuit further comprises fixing means for fixing an electric potential of said common connection line.

Preferably, said semiconductor integrated circuit further comprises a common connection line connected to couplers of the first and second storage units of the memory in the plurality of retrieval memory word blocks, said selective transistors therein or couplers of the selective transistors of the memory cells therein, a control element provided between said common connection line and said match line, and a connection means for connecting the gate electrode of said control element to said match line.

Preferably, in each aspect, said unidirectional element and said control element have a threshold voltage higher than that of any peripheral element.

Preferably, in the second aspect, said semiconductor integrated circuit further comprises holding means for holding the result of detection made by said potential detecting means on each retrieval memory word block. Preferably, said semiconductor integrated circuit further comprises means for driving the respective control word lines of said retrieval memory word blocks in order predetermined.

There is provided by its third aspect of the present invention a semiconductor integrated circuit comprising a memory cell including a first storage unit for defining the electrical connection and otherwise the non-connection between a first data line and a match line and a second storage unit for defining the electrical non-connection and otherwise the connection between a second data line and said match line, a control word line for controlling said first and second storage units in the memory cell, at least a selective transistor provided between said first and second storage units of the memory cell and said match line or between said first and second storage units and said first and second data lines, and a control line for controlling said selective transistor, said control word line and said control line being used to effect the connection and otherwise non-connection between each of said first and second data lines and said match line in accordance with the definition of connections of said first and second storage units. Preferably, said match line further has potential detecting means for detecting an electric potential of said match line.

There is provided by its fourth aspect of the present invention a semiconductor integrated circuit comprising a plurality of retrieval memory word blocks, said block including a set of a memory cell having a first storage unit for defining the electrical connection and otherwise the non-connection between a first data line and a match line and a second storage unit for defining the electrical non-connection and otherwise the connection between a second data line and said match line and a control word line for controlling said first and second storage units in the memory cell, with said first data line, said second data line and said match line as those which are commonly used for said plurality of retrieval memory word blocks, and a potential detecting means for detecting an electric potential of said match line, said control word line being used to effect the connection and otherwise non-connection between each of said first and second data lines and said match line in accordance with the definition of connections of said first and second storage units. Preferably, said semiconductor integrated circuit further comprises at least one selective transistor provided between said match line and a coupler for coupling said first and second storage units and a control line for controlling said selective transistor, said control word line and control line being used to effect the connection and otherwise non-connection between each of said first and second data lines and said match line in accordance with the definition of connections of said first and second storage units.

Preferably, said semiconductor integrated circuit further comprises a common connection line connected to couplers of the first and second storage units of the memory in the plurality of retrieval memory word blocks,wherein said one selective transistor provided between one end of said common connection line and said match line. Preferably, said semiconductor integrated circuit further comprises fixing means for fixing an electric potential of said common connection line.

Preferably, said semiconductor integrated circuit further comprises holding means for holding the result of detection made by said potential detecting means on each retrieval memory word block. Preferably, said semiconductor integrated circuit further comprises means for driving the respective control word lines of said retrieval memory word blocks in order predetermined.

Preferably, in each of the third and fourth aspects, said storage unit is composed of a nonvolatile memory element. Preferably, both said first and second storage units are composed of a nonvolatile memory element and a connection line of both said nonvolatile memory elements is connected to one selective transistor. Preferably, said nonvolatile memory element is at least one selected from the group consisting of EPROM, EEPROM and UVEPROM.

Preferably, one of both said first and second storage units in the memory cell is a depression transistor and another of them is a enhancement transistor.

Preferably, said match line further has fixing means for fixing an electric potential of said match line.

Preferably, said selective transistor is a unidirectional element. Preferably, said semiconductor integrated circuit further comprises a unidirectional element provided between said match line and first and second storage units, coupler thereof or said selective transistor.

Preferably, said control line of the selective transistor which functions as a control element further has potential non-fixing means and connection means for connecting to said match line. Preferably, said control word line and said control line of said selective transistor further have potential non-fixing means and connection means for connecting to said match line, said connection means and said potential non-fixing means are made active at the time of data retrieval operation, and the potential variation of said match line is positively corelated to that of said control word line. Preferably, said unidirectional element and said selective transistor which functions the control element are what has a threshold voltage higher than that of any peripheral element.

There is provided by its fifth aspect of the present invention a semiconductor integrated circuit comprising a first transistor chain having a plurality of transistors connected in series, a first data line connected to one end of said first transistor chain, a match line connected to the other end of said first transistor chain, a second transistor chain having a plurality of transistors connected in series, a second data line connected to one end of said second transistor chain, said match line connected to the other end of said second transistor chain, potential detection means for detecting the electrical potential of said match line.

Preferably, in the fifth aspect, said further comprises a selective transistor imposed between the other end of said first transistor chain and said match line, and a selective transistor imposed between the other end of said second transistor chain and said match line.

Preferably, said control line for connecting both gate electrodes of at least one chain control transistor included in transistors constituting said first transistor chain and at least one chain control transistor included in transistors constituting said second transistor chain further has potential non-fixing means and connection means for connecting to said match line, said connection means and said potential non-fixing means are made active at the time of data retrieval operation, and the potential variation of said match line is positively corelated to that of said control line.

Preferably, enhancement or depression transistors constitute said first and second transistor chains depending on the storage data, and preferably, an enhancement or depression transistor forms at least one of the transistors constituting said transistor chains as a chain control transistor, irrespective of said storage data.

Preferably, nonvolatile transistors constitute the principal parts of said first and second transistor chains, and preferably, an enhancement or depression transistor forms at least one of the transistors constituting said transistor chains as a chain control transistor.

Preferably, said semiconductor integrated circuit further comprises a plurality of word lines for driving respective gates from the outermost transistors among the transistors constituting said first and second transistor chains on one side toward the other side, said plurality of word lines being commonly used for said first and second transistor chains, and holding means for selectively holding the results of retrieval from said potential detection means, said holding means corresponding to control word lines other than what is used for controlling said chain control transistor out of said plurality of control word lines for common use, and preferably, said semiconductor integrated circuit further comprises means for driving the respective word lines of said retrieval memory word blocks in order predetermined.

Preferably, said semiconductor integrated circuit further comprises fixing means for fixing electric potentials of said other ends of said first and second transistor chains, respectively. Preferably, said selective transistor is a unidirectional element. Preferably, said unidirectional element is what has a threshold voltage higher than that of any peripheral element.

Preferably, said semiconductor integrated circuit further comprises connection means for connecting said match line to one control line connecting to the gate electrodes of said two selective transistor connected to said first and second selective transistor chains. Preferably, said selective transistors connected to the other ends of said first and second transistor chains have a threshold voltage higher than that of any peripheral circuit.

Preferably, said match line further has fixing means for fixing an electric potential of said match line.

There is provided by its sixth aspect of the present invention a semiconductor integrated circuit comprising a first transistor, a first signal line connected to one of source and drain electrodes of said first transistor, connection control means for controlling the electrical connection and otherwise the non-connection between a first signal and a control word line connected to a gate electrode of the first transistor, potential non-fixing means for non-fixing said control word line, wherein said potential non-fixing means and said connection control means are made active, and said first transistor is caused to function as a unidirectional element.

BRIEF DESCRIPTION OF THE DRAWINGS

FIG. 7 is a conceptual drawing of a CAROM configuration having a different memory array in another embodiment of the semiconductor integrated circuit according to the present invention.

DETAILED DESCRIPTION OF THE INVENTION

The present invention is described below in greater detail.

First, referring to a first mode as shown in FIGS. 1 to 10 inclusive, a semiconductor integrated circuit according to the first and third aspects of the present invention is described in detail.

In a semiconductor integrated circuit according to the first mode of the present invention, a memory cell comprising a pair of first and second storage areas (corresponding to the first and second storage units of the present invention),is provided with a first and a second data line, for example a bit line and a bit bar line. The bit line or bit bar line can be coupled electrically to a match line via a selective transistor within the memory cell, depending on coupling means for determining the definition of the connections of the first storage unit or area (e.g. connection) or second storage unit or area (e.g. non-connection) within the memory cell such as a coupler and a nonvolatile memory element, a control word line and a control line.

Moreover, the coupling means is electrically coupled to the bit line or the bit bar line in accordance with the data which have to be stored, that is, the definition of the connections in the memory cell. Therefore, when the memory data stored in the memory cell conforms to the retrieval data, the same electric potential is always supplied from the bit or the bit bar line to the match line. When the memory data stored in the memory cell conversely differs from the retrieval data, a different electric potential is supplied from the bit line or bit bar line to the match line.

In the semiconductor integrated circuit according to the present invention, the above-stated characteristics are utilized for the data retrieval of many memory cells at a time. Therefore, the data retrieval of a large capacity memory with many memory cells arranged in the form of an array can be made at extremely high speed.

The preferred embodiments of the semiconductor integrated circuit according to the first mode of the present invention is described below in greater detail with reference to the accompanying drawings.

Figure 1:
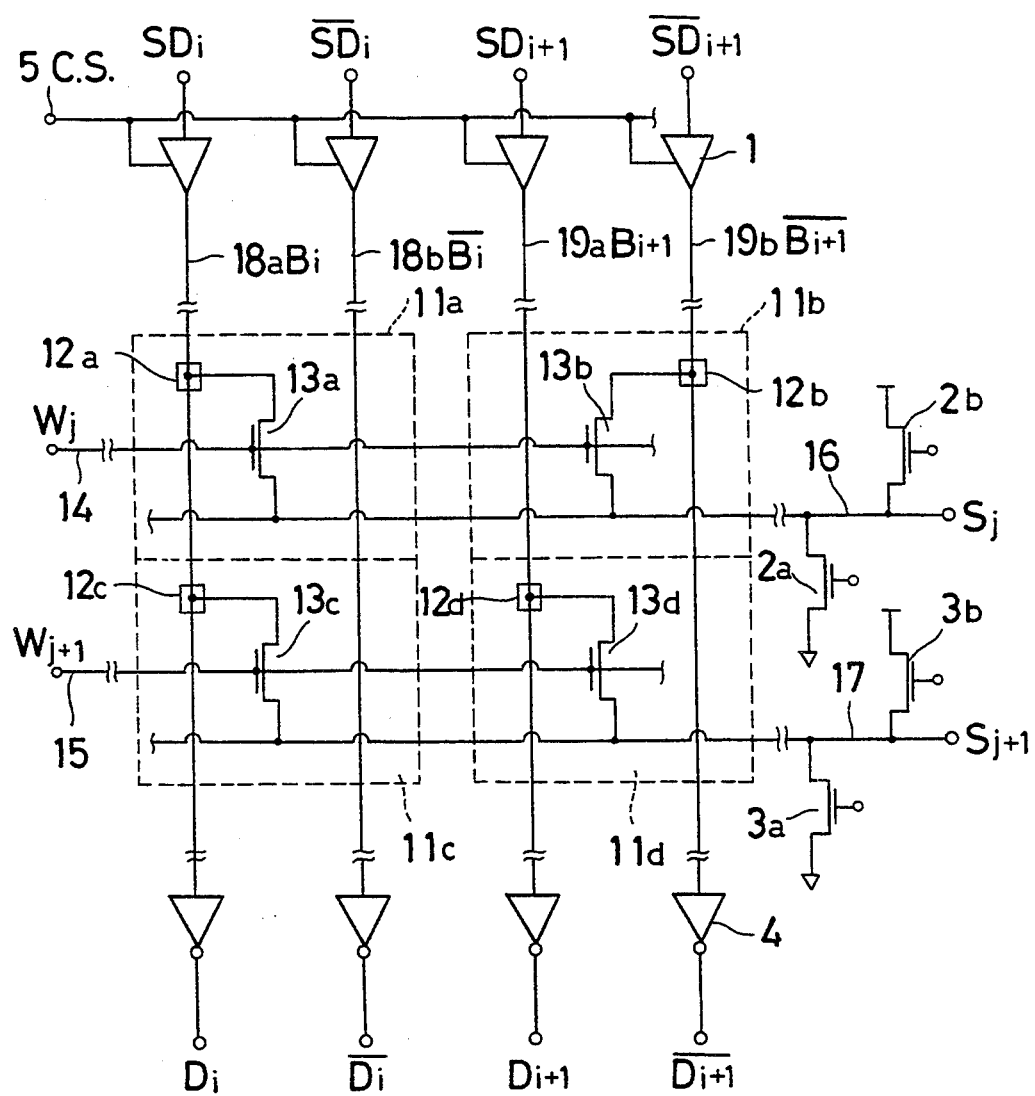
FIG. 1 is a circuit diagram of a memory array in an embodiment of a semiconductor integrated circuit embodying the present invention.

FIG. 1 is a circuit diagram of a memory array that shows a semiconductor integrated circuit according to an embodiment of the first mode of the first aspect of the present invention, wherein CAROM (Content Addressable Read Only Memory) with a ROM shown in FIG. 1 as a base is employed. The configuration and operation of CAROM is subsequently described. However, the present invention is not limited this embodiment.

First, 1-bit memory cells as component units of CAROM will be described. As shown in FIG. 1, the memory cells 11a and 11b represent ROM data states 0 and 1 written to the memory cells, respectively. The memory cell 11a comprises a bit line ($B_i$) 18a, a bit bar line ($\overline{B_i}$) 18b, a selective transistor 13a and a retrieval sensing line (corresponding to the match line) ($S_j$) 16. In order to make this memory cell store 1 or 0 data, a coupler 12a is used to electrically connect one of the electrodes (the drain or source electrode) of the selective transistor 13a to the bit line ($B_i$) 18a or the bit bar line ($\overline{B_i}$) 18b. In this case, the memory cell 11a is connected to the bit line ($B_i$) 18a and a coupler 12b is used to connect the adjoining memory cell 11b to a bit bar line ($\overline{B_{i+1}}$) 19b. Moreover, the other electrode of the selective transistor 13a is coupled to the retrieval sensing line ($S_j$) 16, whereas the control electrode (the gate electrode) of the selective transistor 13a is connected to a word line ($W_j$) 14 for selecting the memory cell 11a.

The other electrode of a selective transistor 13b of the adjoining memory cell 11b to be selected by the same word line ($W_j$) 14 is also connected to the retrieval sensing line ($S_j$) 16. The retrieval sensing line ($S_j$) 16 can be connected by a grounding transistor 2a and a pull-up transistor 2b to the ground potential or the supply power electric potential.

As set forth above, what makes this ROM memory configuration greatly different from the prior art includes the presence of the bit bar line, the fact that the retrieval sensing line is switched by the grounding transistor 2a or the pull-up transistor 2b to the ground potential or the supply power potential, and that there is created a floating state to which neither ground nor supply power potential is connected. Both transistor 2a and 2b constitute the electric potential fixing means for fixing the electric potential of the retrieval sensing line. The thus electric potential variation may be detected by the electric potential detection means such as a sense amplifier described after.

The operation of CAROM thus configured is subsequently described. Referring to a timing chart of FIG. 2, a description is given of an exemplary driving method when use is made of an ordinary ROM. First, the retrieval sensing lines ($S_j$) 16, ($S_{j+1}$) 17 are fixed by the grounding transistors 2a, 3a to the grounding potential. Subsequently, four data $SD_i$, $SD_i$, $SD_{i+1}$, $SD_{i+1}$, of two sets of FIG. 1 are totally set at high ("1"). Then the data control line (C.S) 5 is set high ("1"). All of the four tri-state buffers 1 are thus set active by the control signal and the two bit lines ($B_i$) 18a, ($B_{i+1}$) 19a and the two bar line ($B_i$) 18b, ($B_{i+1}$) 19b are totally precharged with high ("1") (see a section up to time T of (a)-(c) of FIG. 2).

Figure 2:
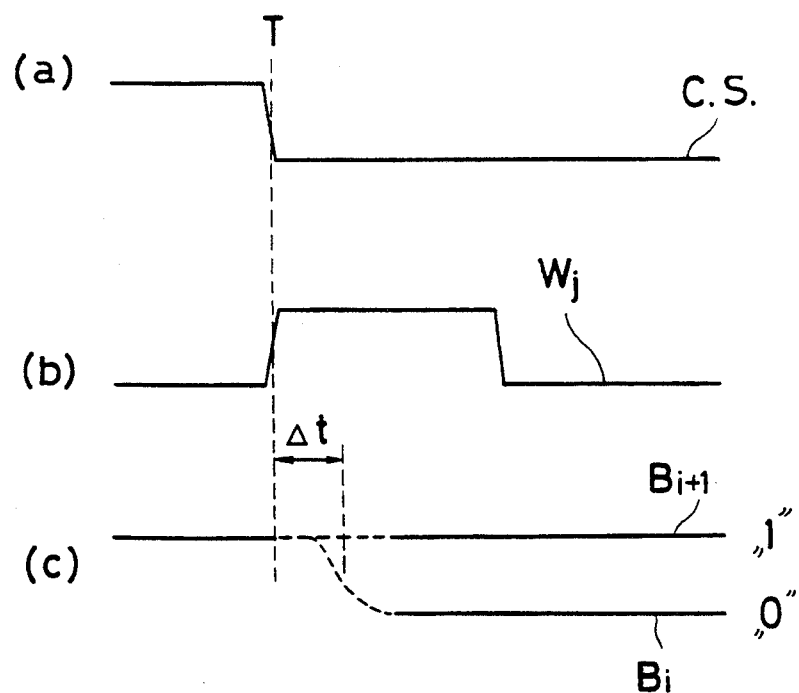
FIG. 2 is a timing chart showing the operating timing of the memory array of FIG. 1.

Next, when the data control line (C.S.) is cut at time T of FIG. 2 and held low ("0"), the four tri-state buffers 1 are turned off. However, four of the bit lines and the bit bar lines respectively remain high ("1"). When the word line ($W_j$) 14 is set high ("1"), the selective transistors 13a, 13b are turned on and each of the bit line ($B_i$) 18a and the bit bar line ($B_{i+1}$) 19b is connected to the retrieval sensing line ($S_j$) 16. On the other hand, the retrieval sensing line ($S_j$) 16 is fixed by the grounding transistor 2a to the ground potential. Consequently, the bit line ($B_i$) 18a and the bit bar line ($B_{i+1}$) 19b that have been precharged with high ("1") are cause to lose the charge and set at the ground potential, that is, set low ("0"). On the contrary, the bit bar line ($B_i$) 18b and the bit line ($B_{i+1}$) 19a remains high ("1") (see after time T of FIGS. 2(b) and (c)).

As a result, while the bit line ($B_i$) 18a is set low ("0"), on the contrary, the bit line ($B_{i+1}$) 19a remains high ("1") in potential and the outputs $D_i$ and $D_{i+1}$ of an inverter 4 output 1 and 0 as inverted outputs of these values, respectively.

Figure 3:
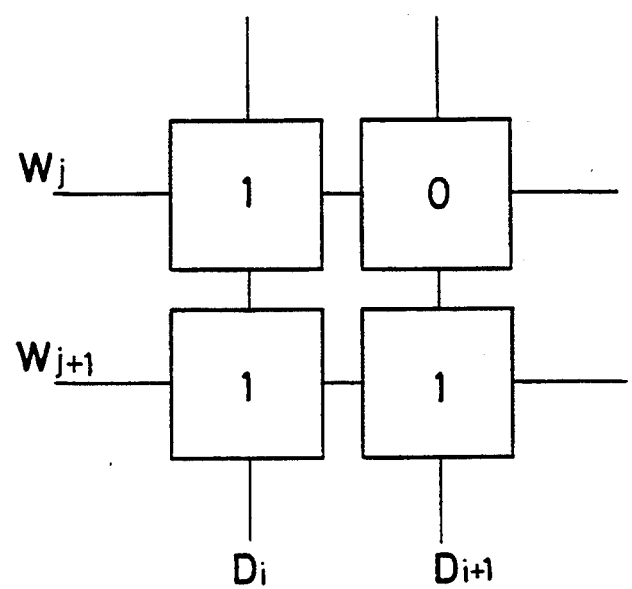
FIG. 3 is a conceptual drawing showing exemplary memory data in the memory array of FIG. 1.

In other words, "1" and "0" are seen to have been written to the memory cells 11a and 11b, respectively. When data in the memory cells 11c, 11d are read likewise, they are turn out to be "1" and "1." FIG. 3 illustrates these memory data in a simple form.

A description is subsequently given of the subject matter of the present invention, that is, a technique of implementing identity retrieval of these data. Referring to FIG. 1 first, a description is given of a case where 1, 0, data on the same word line in ROM having data shown in FIG. 3 are retrieved by means of a timing chart of FIG. 4.

(1) First, the retrieval sensing lines 16, 17 in this example are precharged by the pull-up transistors 2b, 3b with high ("1"). Moreover, identity retrieval data of 1 and 0 are added to data $SD_i$ and $SD_{i+1}$, respectively. Needless to say, 0 and 1 are applied to data $SD_i$ and $SD_{i+1}$ as inverted data, respectively. However, the values of the bit and bit bar lines are not restricted (see up to time $T_1$ of FIG. 4).

(2) Subsequently, the data control line (C.S.) 5 becomes high ("1") and four of the above-mentioned data $SD_i$, $SD_i$, $SD_{i+1}$, $SD_{i+1}$ are applied to the bit and bit bar lines, respectively. As a result, the potential of the bit line ($B_i$) 18a and that of the other bit line ($B_{i+1}$) 19a are fixed to high ("1") and low ("0") after a delay of $\Delta t_1$, respectively. Simultaneously, the bit bar line ($B_i$) 18b and the bit bar line ($B_{i+1}$) 19b of the inverted signal line become low ("0") and high ("1"), respectively. These bit lines and bit bar lines are changed from the high electric potential or the low electric potential to the floating state after the time $T_2$ when the data control line (C.S.) 5 becomes low "0" and are caused to keep the charge precharged or discharged between the time $T_1$ and $T_2$. Moreover, two retrieval sensing lines ($S_j$) 16, ($S_{j+1}$) 17 are also caused by the precharge transistors 2b, 3b temporarily held ON to keep the precharged charge and remain high ("1") (see the section between time $T_1$ and $T_3$ of FIG. 4).

(3) The word line ($W_j$) 14 and ($W_{j+1}$) 15 become high ("1") at time $T_3$ in this state. The operation of each set of word lines ($W_j$) 14, ($W_{j+1}$) 15 (or each of the retrieval sensing lines ($S_j$) 16, ($S_{j+1}$) 17) in this state is considered.

With respect to the memory cell 11a selected by the word line ($W_j$) 14, both the bit bar line ($B_i$) 18b and the retrieval sensing line ($S_j$) 16 are held high ("1") and the selective transistor 13a is held OFF. With respect to the memory cell 11b, both the bit bar line ($B_{i+1}$) 19b and the retrieval sensing line ($S_j$) 16 are also held high ("1") and the selective transistor 13b is also held OFF. The potential of the retrieval sensing line ($S_j$) 16 is not caused by the two memory cells 11a, 11b selected by the word line ($W_j$) 14 to vary and the retrieval sensing line ($S_j$) 16 keeps high ("1").

A description is subsequently given of the effect of the memory cells 11c, 11d selected by the other word line ($W_{j+1}$) 15 on the electric potential of the retrieval sensing line ($S_{j+1}$) 17. As stated above, the selective transistor 13c is initially held OFF as both the bit line ($B_i$) 18a and the retrieval sensing line ($S_{j+1}$) 17 have high ("1") electric potential. In the case of the memory cell 11d, however, it is in a different state. In other words, the selective transistor 13d of the memory cell 11d is connected to the bit line ($B_{i+1}$) 19a discharged to low ("0") potential. For this reason, part of the charge of the retrieval sensing line ($S_{j+1}$) 17 precharged with high ("1") moves to this bit line ($B_{i+1}$) 19a, whereby the redistribution of the charge occurs. At this time, the potential Vs of the retrieval sensing line ($S_{j+1}$) 17 and the potential VB of the bit line ($B_{i+1}$) 19a can be obtained from the following equation:

$$Vs = VB = \{Cs/(Cs+CB)\} \times V_{dd} \qquad (1)$$

wherein Cs represents the capacity of the retrieval sensing line ($S_{j+1}$) 17, CB the capacity of the bit line ($B_{1+1}$) 19a and $V_{dd}$ the power voltage.

Normally, in this equation (1), Cs is far larger than CB ($C_S << C_B$), and these potentials become almost low ("0"). However, there is a slight rise in voltage ($\Delta V$ volt) (see after time $T_3$ of FIG. 4).

In other words, each of the word lines ($W_j$) 14 and ($W_{j+1}$) 15 becomes high ("1"), whereby the retrieval sensing line ($S_j$) 16 connected to a memory cell (the memory cell 11a corresponds to "1" and the memory cell 11b to "0") which agrees with retrieval data ($SD_i=1$, $SD_{i+1}=0$) maintains the initially set precharged state (high state ("1")), while the retrieval sensing line ($S_{j+1}$) 17 connected to a memory cell (the memory cell 11c corresponds to "1" and the memory cell 11d to "1") which disagrees with the retrieval data changes from the precharged state to the low state.

Therefore, it is possible to retrieve all data simultaneously according to this changed or unchanged state.

The circuit of this embodiment which include an additional function will be described hereafter. In the above configuration, the redistribution of the charge between the bit line or the bit bar line and the retrieval sensing line may occur upon retrieval of identity data. As a matter of course, as stated above, there will be no problem if the capacity of the bit line (or the bit bar line) is made larger than that of the retrieval sensing line. However, there is another method to secure the operation of the device which comprises more circuits to eliminate the need to take into consideration the redistribution. This method will be described in the following.

First, the difference from the previous method lies in the tri-state buffer to which data for retrieval $SD_i$, $\overline{SD_i}$, $SD_{i+1}$ and $\overline{SD_{i+1}}$ are inputted. In other words, in the first embodiment of the present invention shown in FIG. 1, when these data do not agree with memory cell data in the ROM, the charge of the retrieval sensing line precharged in advance is pulled out to make it low ("0"). However, the bit line for pulling out the charge falls into a floating state after being discharged to low ("0"). For this reason, the redistribution of the charge causes a slight rise from the low potential ("0").

Then, if the above point is taken into consideration, it is understood that only bit lines or bit bar lines applied by data having a potential (low ("0")) in the previous case opposite to the potential of the retrieval sensing line preset for retrieval are surely fixed to a low potential ("0") always by driving and not by placing them in the floating state upon retrieval, thus preventing the redistribution of the charge.

Figure 5:
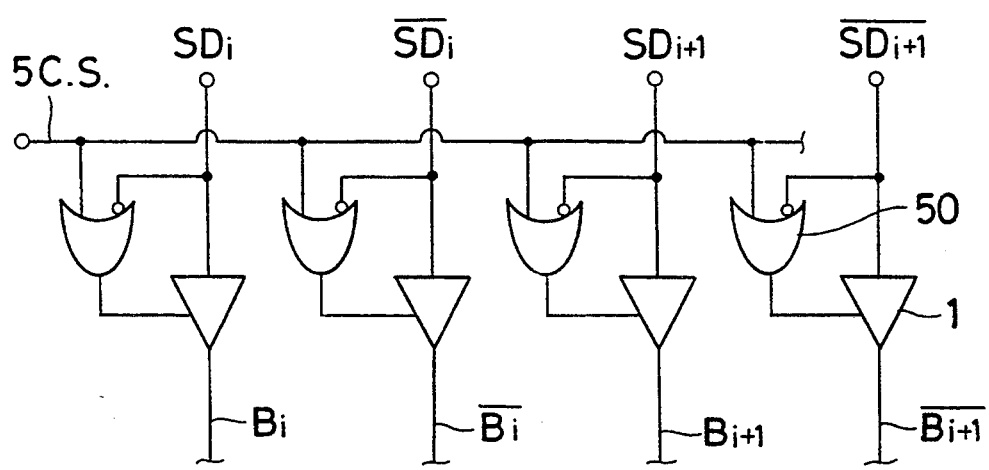
FIG. 5 is a partial circuit diagram showing part of another embodiment of the semiconductor circuit according to the present invention.

An embodiment for implementing this system is a circuit shown in FIG. 5. The data control line (C.S.) 5 is connected via a control gate 50 to a control gate of the tri-state buffer 1 (Three state buffer) for controlling the tri-state buffer 1 which drives the bit lines $B_i$ and $B_{i+1}$ or the bit bar lines $\overline{B_i}$ and $\overline{B_{i+1}}$. The inverted signal of data is inputted to the other input of this control gate 50. Therefore, as in the previous embodiment, even if the data control line (C.S.) 5 becomes low ("0"), the output of the control gate 50 becomes high ("1") only for bit lines having low input data, and the tri-state buffer 1 is held ON.

Table 1 is obtained when this example is applied to the previous embodiment. Table 1 shows changes in the value of each of data $SD_i$, $\overline{SD_i}$, $SD_{i+1}$ and $\overline{SD_{i+1}}$, and the state of the respective bit lines or bit bar lines when the data control line (C.S.) 5 is high ("1") and low ("0").

bit line $\overline{B_i}$ and the bit bar line $B_{i+1}$ having been applied by a high ("1") voltage maintain a high ("1") charge.

Figure 4:
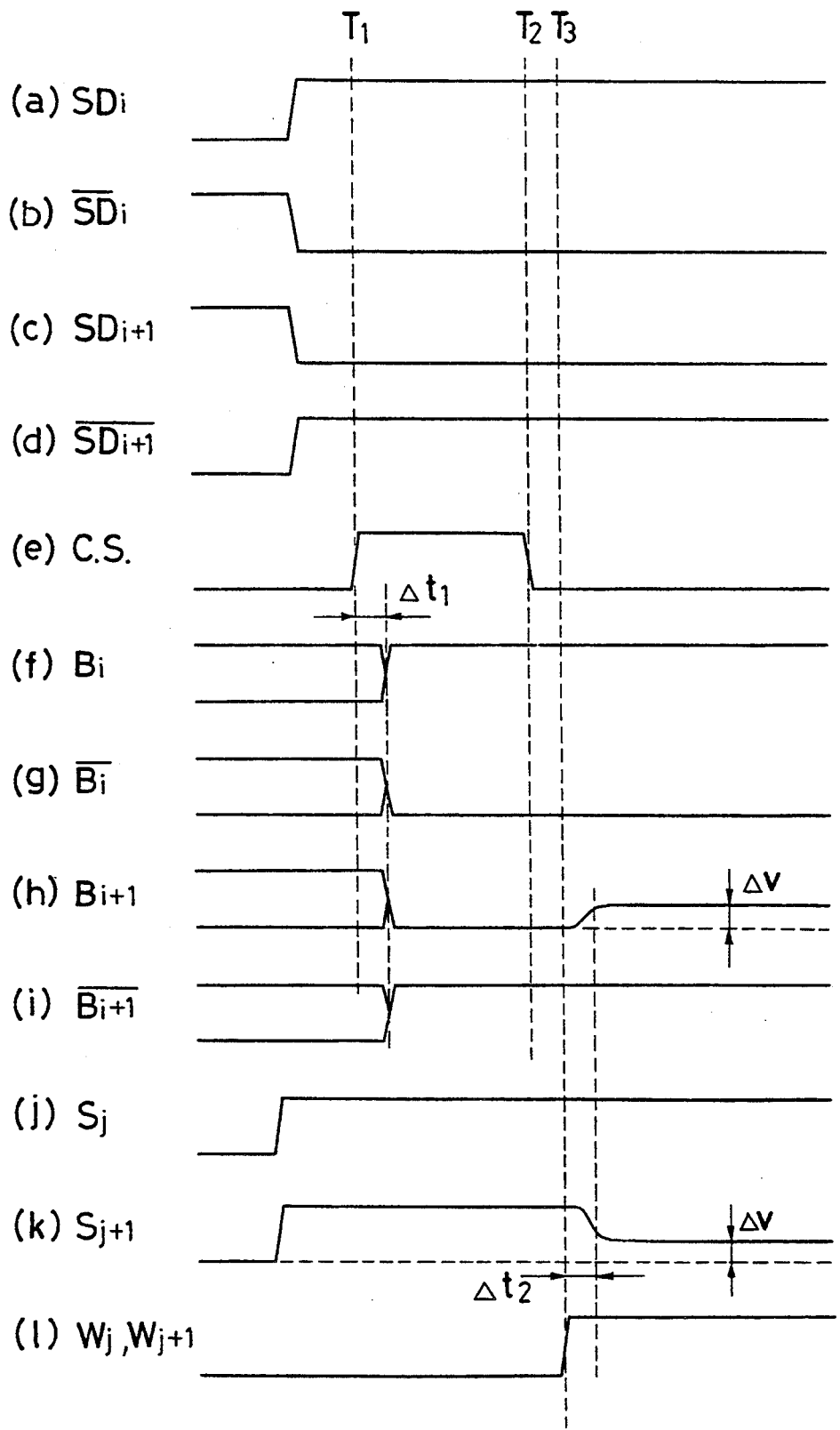
FIG. 4 is a timing chart showing data retrieval timing
Figure 6:
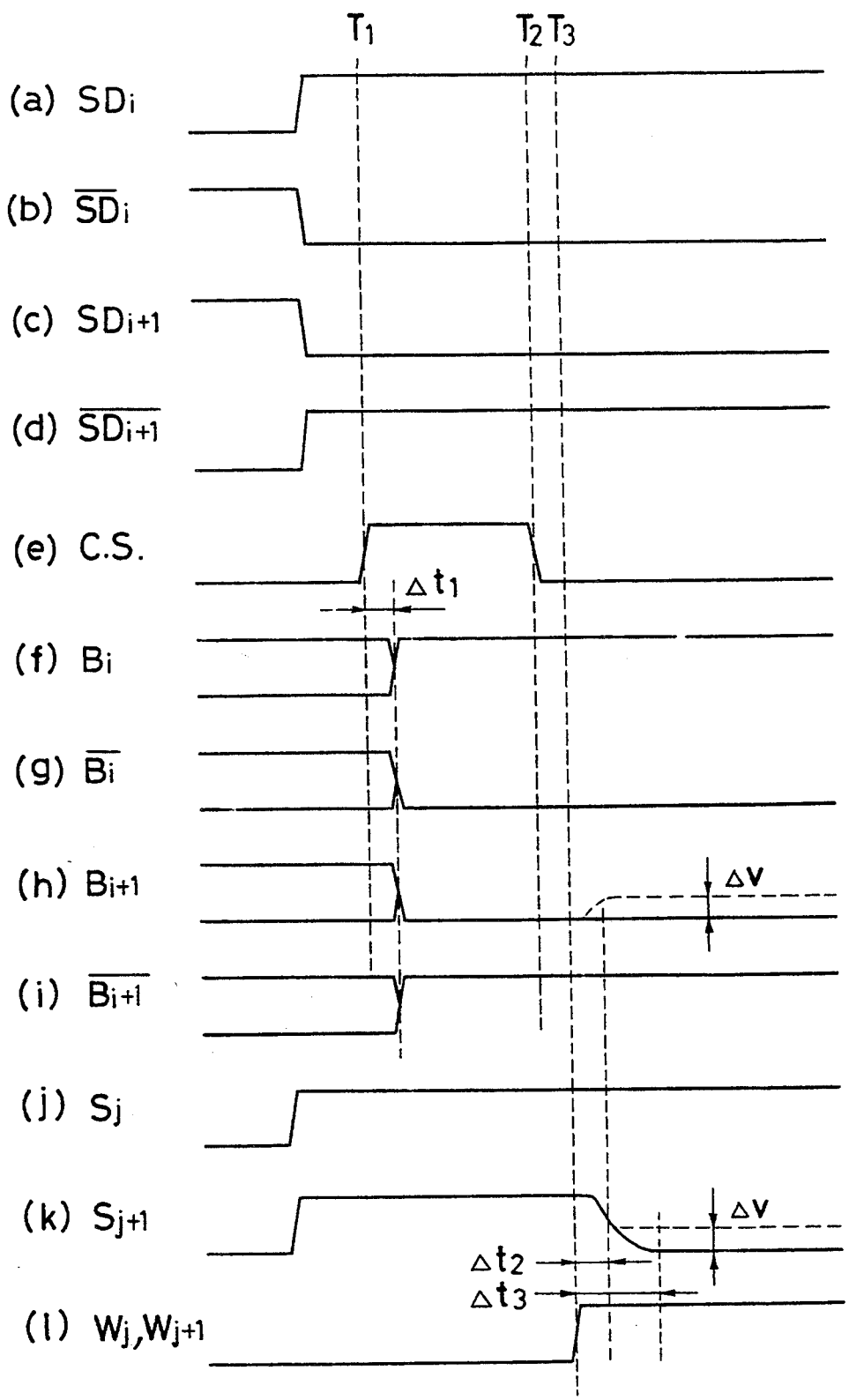
FIG. 6 is a timing chart showing exemplary data retrieval timing of the semiconductor integrated circuit of FIG. 5.

As a result, the timing chart changes in such way that shown in FIG. 6. The difference from the timing chart of FIG. 4 is that after the data control line (C.S.) 5 of FIG. 6 (c) becomes low ("0") after time $T_2$, the bit bar line ($\overline{B_i}$) and the bit line ($B_{i+1}$) are driven (potentially fixed) to low ("0"). Therefore, the word line of FIG. 6(e) becomes high ("1") at time $T_3$, and the retrieval sensing line ($S_{j+1}$) 17 and the bit line ($B_{i+1}$) 19a are connected and fixed to a low ("0") potential even if the precharge enters the bit line ($B_{i+1}$) 19a. After $\Delta t_3$ of FIG. 6, the retrieval sensing line ($S_{j+1}$) 17 is also fixed to a low ("0") potential.

The second embodiment of the present invention has been described in the foregoing. For caution's sake, as shown in FIG. 5, a buffer always held ON, not the tri-state buffer which is controlled by the data value, is conceived. Namely, in the previous example, only bit lines applied by a low ("0") voltage are always driven. The case where bit lines applied by a high ("1") voltage are driven at the same time will be described below.

At this time, when retrieval begins, and the word line ($W_{j+1}$) 15 becomes high ("1"), both of the select transistors 13c and 13d of the memory cells 11c and 11d are turned on, and both of the bit line ($B_i$) 18a and the bit line ($B_{i+1}$) 19a are connected to the retrieval sensing line ($S_{j+1}$) 17. However, the potentials of these bit lines are fixed to high ("1") and low ("0"), respectively, thus causing a short circuit due to a voltage difference.

In addition, since the retrieval sensing line is precharged with high ("1"), the bit lines or the bit bar lines are always fixed to a low ("0") potential when applied by a low voltage. The bit lines may be fixed conversely. In other words, the retrieval sensing line is discharged to low ("0"), and the bit lines or the bit bar lines during retrieval may be fixed to a high ("1") potential when applied by a high voltage.

FIG. 7 shows an embodiment of an overall CAROM configuration having a memory array according to the present invention. In FIG. 7, reference numeral 71 denotes a CAROM array portion, 74 an address decoder for gaining access to this CAROM array and what is used to drive the above-mentioned word line, 73 a sense amplifier for reading out at the operation of the ROM, and 72 an identity detection circuit for deciding whether retrieval data match or inequal on receiving a signal from a retrieval sensing line corresponding to each of the memory words.

Further, reference numeral 75 denotes a data/mask register portion comprising a data register 75a for storing n bits of retrieval input data from 1 to n and a mask

TABLE 1

|  | $SD_i$ | $B_i$ | $\overline{SD_i}$ | $\overline{B_i}$ | $SD_{i+1}$ | $B_{i+1}$ | $\overline{SD_{i+1}}$ | $\overline{B_{i+1}}$ |
|---|---|---|---|---|---|---|---|---|
| C.S. = 1 | 1 | 1 | 0 | 0 | 0 | 0 | 1 | 1 |
| C.S. = 0 | 1 | — (holding) | 0 | 0 | 0 | 0 | 1 | — (holding) |

It is understood from this table that when the data control line (C.S.) 5 is high ("1"), a voltage corresponding to the value of each of data $SD_i$, $\overline{SD_i}$, $SD_{i+1}$, and $\overline{SD_{i+1}}$ is directly applied to the respective bit lines $B_i$ and $B_{i+1}$ or the respective bit bar lines $\overline{B_i}$ and $\overline{B_{i+1}}$. In contrast, when the data control line (C.S.) 5 changes to low ("0"), the bit bar line $\overline{B_i}$ and the bit line $B_{i+1}$ having been applied by a low ("0") voltage continue to be applied by a low ("0") voltage. On the other hand, the register 75b for designating retrieval data on which bit data of the n-bit data matches the bit data of the CAROM array 71. In this example, only the first, third and fourth bits of the n-bit data are intended for retrieval bit, so that any bit marked with X is optional (1 or 0). The first bit of the input data stored in the data register 75a is 1, so are the third and fourth bit, the rest is totally masked. Consequently, the results obtained from the identity retrieval carried out at a time with respect to the CAROM array 71 show that only the identity detection circuit 72 with an address number being 1 is 1 and the rest is 0. Needless to say, a plurality of identity data may be detected, depending on the retrieval data. In this case, matching data may be output by providing priority order under a certain rule.

Figure 8:
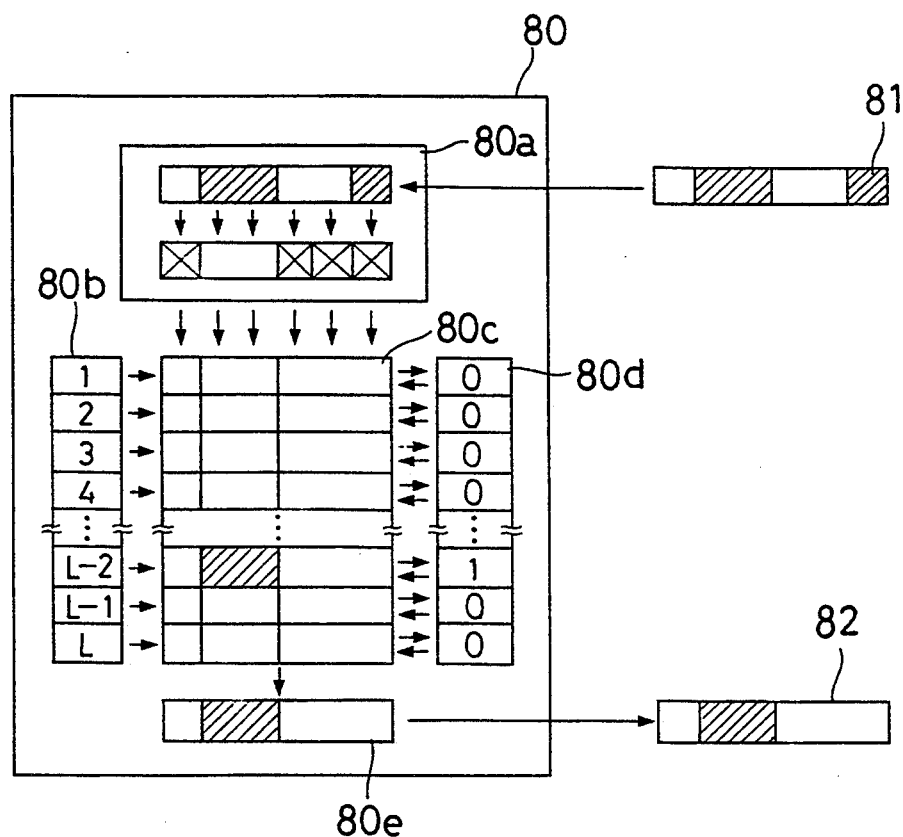
FIG. 8 is a diagram illustrating the operation of CAROM in the semiconductor integrated circuit of FIG. 7.
Figure 9:
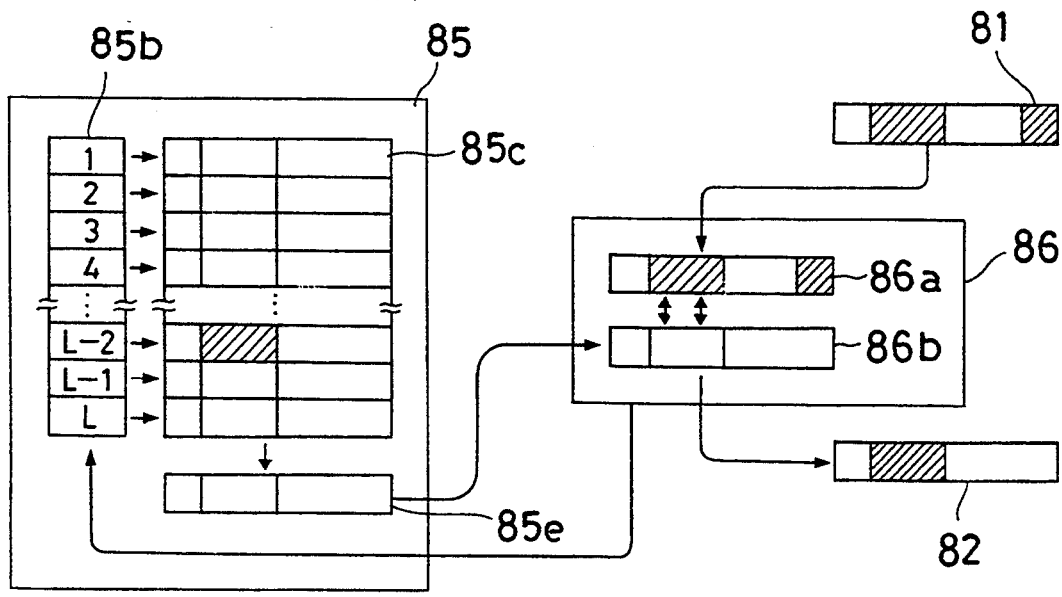
FIG. 9 is a diagram illustrating the operation of a prior art CAROM.

FIG. 8 illustrates a case where CAROM embodying the present invention is used for database retrieval and FIG. 9 a conventional method of retrieval.

In the conventional method, input data 81 for retrieval is first fed to a register 86a of CPU 86. Subsequently, CPU 86 sends an address signal to ROM 85 as a database, whereby data are output from a memory array 85c word by word. This operation is performed sequentially by incrementing the address 1 by 1 each time until identity data is found. In this example, identity data is seen to have been detected at the (L - 2)th address for the first time. However, the greater the number of data in the ROM 85 becomes (the greater L becomes), the more it requires time for retrieval time. For this reason, it has become inevitable to provide circuits for practical use with retrieval data and retrieval speed in moderation while the data size of ROM 85 is reduced. Therefore, requirements have not always been met.

However, the use of LSI having this configuration of the present invention makes possible extremely high speed data retrieval (over 102 times higher in speed) while same degree of integration as conventional ROM is maintained. Reference numeral 80 denotes CAROM as the semiconductor integrated circuit embodying the present invention, which comprises as in FIG. 7 a data/mask register 80a, an address decoder 80b, a CAROM array (memory array) 80c, an identity retrieval/circuit block 80d and a sense amplifier 80e. As is obvious from FIG. 8, no components such as CPU are not necessarily required as in the case of FIG. 9 as far as retrieval is only concerned.

Figure 10:
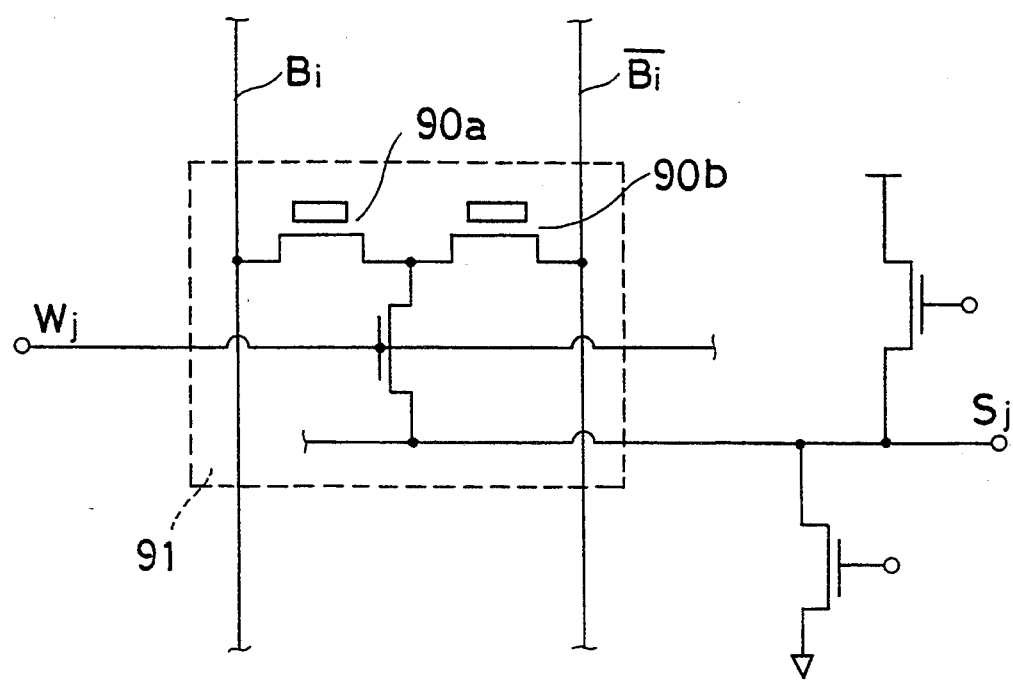
FIG. 10 is a circuit diagram of a memory cell with a nonvolatile memory as a base in other embodiment of the semiconductor integrated circuit according to the present invention.

The foregoing is based on the present invention with ROM as a base and the idea is not limited to this embodiment. The anti-fuse technology employed for field programmable gate arrays (FPGA) recently commercialized, for instance, may be used to form the coupling portion between the bit lines or the bit bar lines of FIG. 1. In addition, use can be made of a fuse or a transistor switch with which electrical connection/non-connection is programmable. Moreover, a nonvolatile memory such as MONOS memories may be used as a coupler. The only one-bit configuration of the memory using MONOS memory element is shown in FIG. 10, because this embodiment using MONOS is not different from above-described embodiments so far with respect to the configuration and operation. What make this memory configuration different from the first and second embodiments of the first mode of the present invention described above is only that the nonvolatile memories 90a and 90b are formed to the coupling portion in the memory cell.

CAM according to the present invention may be used as one of the component parts of the semiconductor integrated circuit of the present invention. Actually, there is CPU incorporating ROM and by altering a portion of CAM based on SRAM as special LSI for searching LAN addresses at high speed, more addresses can be integrated. Even in this case, what is based on the nonvolatile memory reloadable in the field as described in the last embodiment of the present mode seems superior because of greater freedom.

As is obvious from the description according to the first mode of the present invention in the foregoing pages, in the first and third aspects of the present invention, the provision of an extremely compact CAM with ROM or the nonvolatile memory as a base is thus accomplished. The CAM based on ROM as described in the embodiment of the semiconductor integrated circuit according to the present invention can be configurated only by adding one bit bar line for each memory cell as compared to NOR-type ROM of the prior art. Moreover, what is based on the nonvolatile memory can be made of one-bit CAM memory cell with two nonvolatile memories. The CAM extremely higher in integration than the conventional SRAM can be configured.

The above-described embodiments of the first mode of the present invention relate to the semiconductor integrated circuit in which each gate electrode of the selective transistor in each memory cell is connected to the control word line. However, it should be understood that the present invention is not limited to three embodiments described above and that it is applicable to the after-described semiconductor integrated circuit according to anyone of the third to fifth aspects of the present invention in which both of the first and second storage areas in each memory cell are made of a nonvolatile memory such as a EPROM and EEPROM, the gate electrodes of these nonvolatile memories are connected to the control word line and the gate electrode of the selective transistor is connected to the control line.

Referring to a second mode as shown in FIGS. 11 to 18 inclusive, a detailed description is subsequently given of a semiconductor integrated circuit according to the first, second, third, fourth and fifth aspects of the present invention.

In a semiconductor integrated circuit according to the second mode of the present invention, a memory cell comprising a pair of first and second storage areas is provided with a first and a second data line, for example a bit line and a bit bar line. The bit line or bit bar line can be coupled electrically to a match line having an electric potential detecting function via a selective tranisistor within the memory cell, depending on coupling means for determining the definition of the connections of the first stage area (e.g. connection) or second storage area (e.g. non-connection) within the memory cell such as a coupler and a nonvolatile memory element, a control word line and a control line.

Moreover, the coupling means is electrically coupled to the bit line or the bit bar line in accordance with the data which have to be stored, that is, the definition of the connections in the memory cell. Therefore, when the memory data stored in the memory cell conforms to the retrieval data, the same electric potential is always supplied from the bit line or the bit bar line to the match line. When the memory data stored in the memory cell conversely differ from the retrieval data, a different electric potential is supplied from the bin line or bit bar line to the match line having the electric potential detecting function.

In this mode of the present invention, one match line having the electric potential detecting function may be provided for one control word line as the first and third aspects of the present invention and can also be provided for a plurality of the control word lines as the second, fourth and fifth aspect of the present invention.

In the semiconductor integrated circuit according to the present invention, the above-stated characteristics are utilized for the data retrieval of many memory cells at a time. Therefore, the data retrieval of a large capacity memory with many memory cells arranged in the form of an array can be made at extremely high speed.

The preferred embodiments of the semiconductor integrated circuit according to the second mode of the present invention is described below in greater detail with reference to the accompanying drawings.

Figure 11:
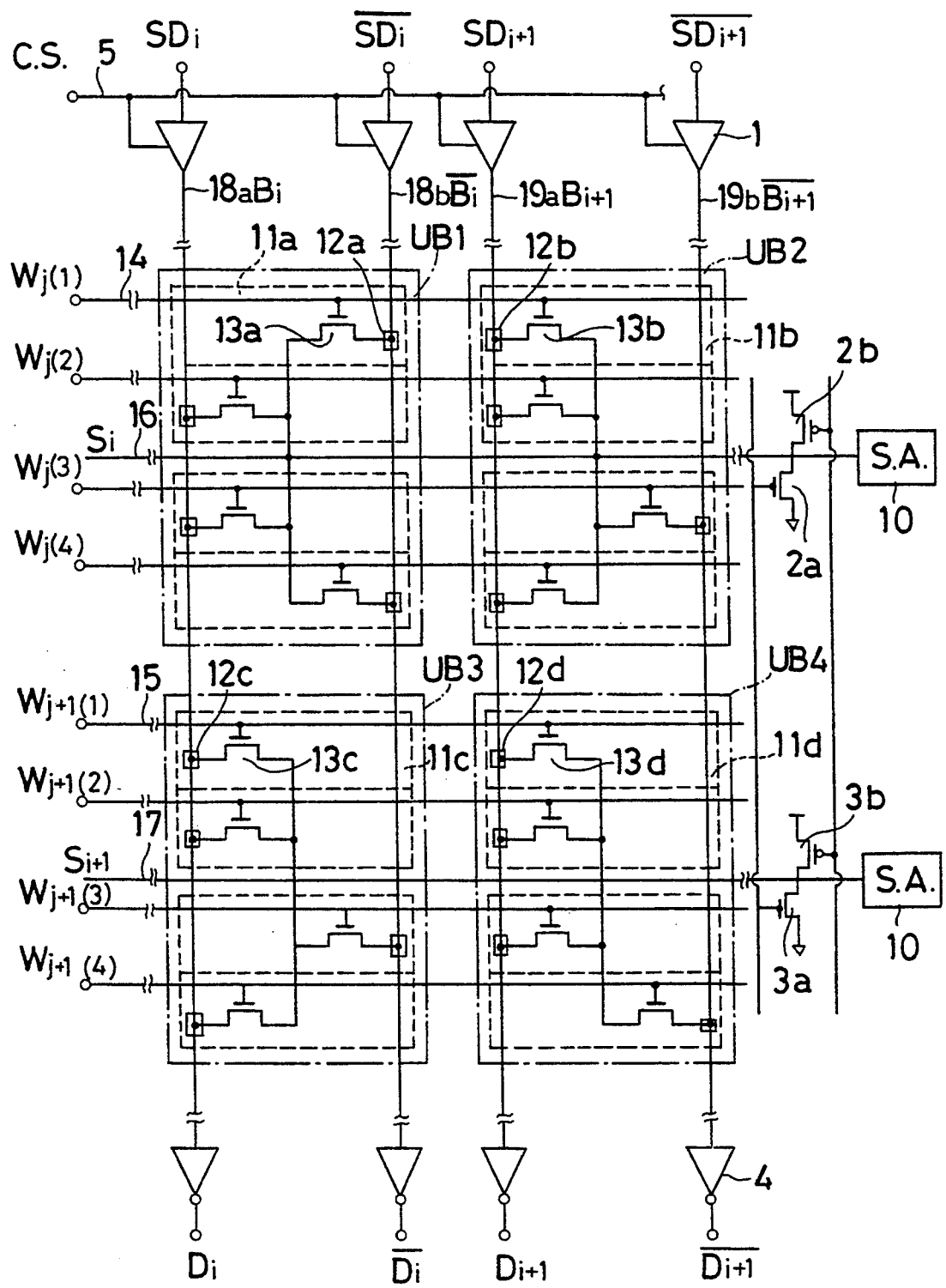
FIG. 11 is a circuit diagram of a NOR-type memory array in other embodiment of the semiconductor integrated circuit according to the present invention.

FIG. 11 is a circuit diagram of a memory array in a semiconductor integrated circuit according to the second mode of the second aspect of the present invention, wherein CAROM (Content Addressable Read Only Memory) with a NOR-type ROM (see "Design of CMOS super LSI," pp 167–169, edited by Tetsuya Iizuka and supervised by Takuo Sugano, Baifukan) shown in FIG. 11 as a base is employed. The configuration and operation of CAROM will subsequently be described. However, the present invention is not limited to this embodiment.

First, 1-bit memory cells as component units of CAROM will be described. As shown in FIG. 11, the memory cells 11a and 11b represent ROM data states 0 and 1 written to the memory cells, respectively. The memory cell 11a comprises a bit line ($B_i$) 18a, a bit bar line ($B_i$) 18b, a selective transistor 13a and a retrieval sensing line ($S_j$) 16. In order to make this memory cell store 1 or 0 data, a coupler 12a is used to electrically connect one of the electrodes (the drain or source electrode) of the selective transistor 13a to the bit line ($B_i$) 18a or the bit bar line ($B_i$) 18b. In this case, the memory cell 11a is connected to the bit bar line ($B_i$) 18b and a coupler 12b is used to connect the adjoining memory cell 11b to a bit line ($B_{i+1}$) 19a. Moreover, the other electrode of the selective transistor 13a is coupled to the retrieval sensing line ($S_j$) 16 connected to a sense amplifier 10, whereas the control electrode (the gate electrode) of the selective transistor 13a is connected to a word line ($W_{j(1)}$) 14 for selecting the memory cell 11a.

The other electrode of a selective transistor 13b of the adjoining memory cell 11b to be selected by the same word line ($W_{j(1)}$) 14 is also connected to the retrieval sensing line ($S_j$) 16. The retrieval sensing line ($S_j$) 16 can be connected by a grounding transistor 2a and a pull-up transistor 2b to the ground potential or the supply power electric potential, the sense amplifier 10 being provided at the following stage.

As set forth above, what makes this ROM memory configuration greatly different from the prior art includes the presence of the bit bar line, the fact that the retrieval sensing line is switched by the grounding transistor 2a or the pull-up transistor 2b to the ground potential or the supply power potential, and that there is created a floating state to which neither ground nor supply power potential is connected so that the potential variation may be detected by the sense amplifier 10.

The operation of CAROM thus configured is subsequently described. Referring to a timing chart of FIG. 12, a description is given of an exemplary driving method when use is made of an ordinary ROM. First, the retrieval sensing lines ($S_j$) 16, ($S_{j+1}$) 17 are fixed by the grounding transistors 2a, 3a to the grounding potential. Subsequently, four data of data $SD_i$, $SD_i$, $SD_{i+1}$, $SD_{i+1}$ of two sets of FIG. 11 are totally set at high ("1"). Then the data control line (C.S) 5 is set high ("1"). All of the four tri-state buffers 1 are thus set active by the control signal and the two bit lines ($B_i$) 18a, ($B_{i+1}$) 19a and the two bit bar lines ($B_i$) 18b, ($B_{i+1}$) 19b are totally precharged with high ("1"). Needless to say, the word lines ($W_{j(2)}$, $W_{j(3)}$, $W_{j(4)}$, $W_{j+1(1)}$, $W_{j+1(2)}$, $W_{j+1(3)}$, $W_{j+1(4)}$) are totally held low ("0") (see a section up to time T of (a)–(c) of FIG. 12).

Figure 12:
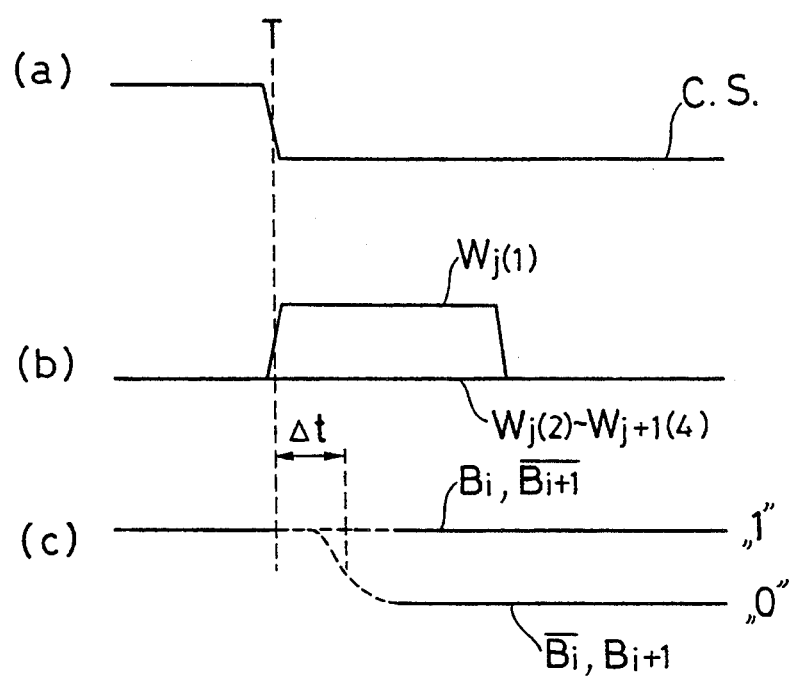
FIG. 12 is a timing chart showing the operating timing of the memory array of FIG. 11.

When the data control line (C.S.) is cut at time T of FIG. 12 and held low ("0"), the four tri-state buffers 1 are turned off. However, four of the bit lines and the bit bar lines respectively remain high ("1"). When the word line ($W_{j(1)}$) 14 is set high ("1"), the selective transistors 13a, 13b are turned on and each of the bit bar line ($B_i$) 18b and the bit line ($B_{i+1}$) 19a is connected to the retrieval sensing line ($S_j$) 16. On the other hand, the retrieval sensing line ($S_j$) 16 is fixed by the grounding transistor 2a to the ground potential. Consequently, the bit bar line ($B_i$) 18b and the bit line ($B_{i+1}$) 19a that have been precharged with high ("1") are cause to lose the charge and set at the ground potential, that is, set low ("0"). On the contrary, the bit line ($B_i$) 18a and the bit bar line ($B_{i+1}$) 19b remains high ("1") (see after time T of FIGS. 12(b) and (c)).

As a result, while the bit line ($B_i$) 18a remain high ("1"), the bit line ($B_{i+1}$) 19a is set low ("0") in potential and the outputs $D_i$ and $D_{i+1}$ of an inverter 4 output 0 and 1 as inverted outputs of these values, respectively.

In other words, "0" and "1" are seen to have been written to the memory cells 11a and 11b, respectively. When data in the memory cells 11c, 11d are read likewise, they are turn out to be "1" and "1." FIG. 13 illustrates these memory data in a simple form.

Figure 13:
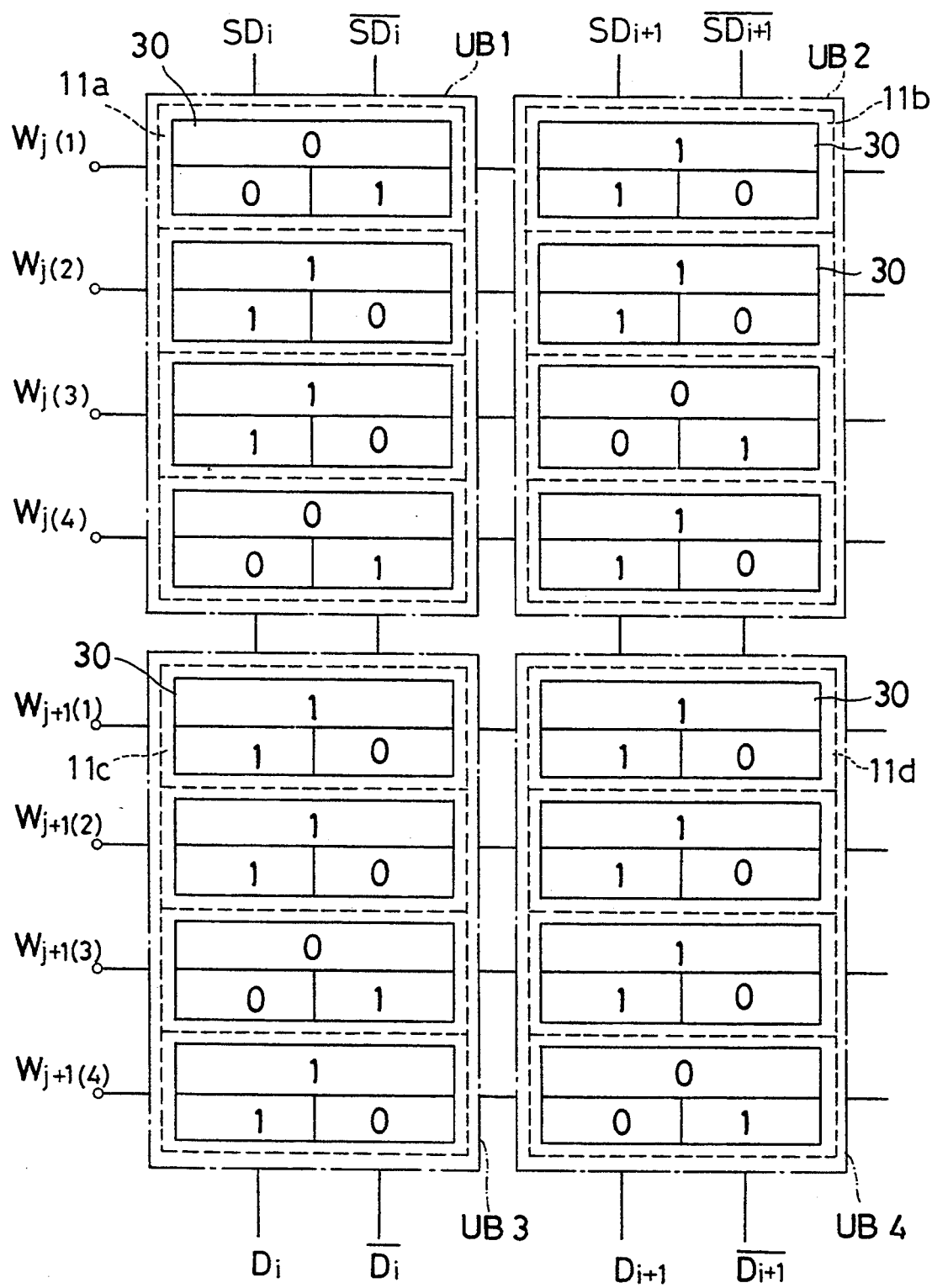
FIG. 13 is a conceptual drawing showing exemplary memory data in the memory array of FIG. 11.
Figure 14:
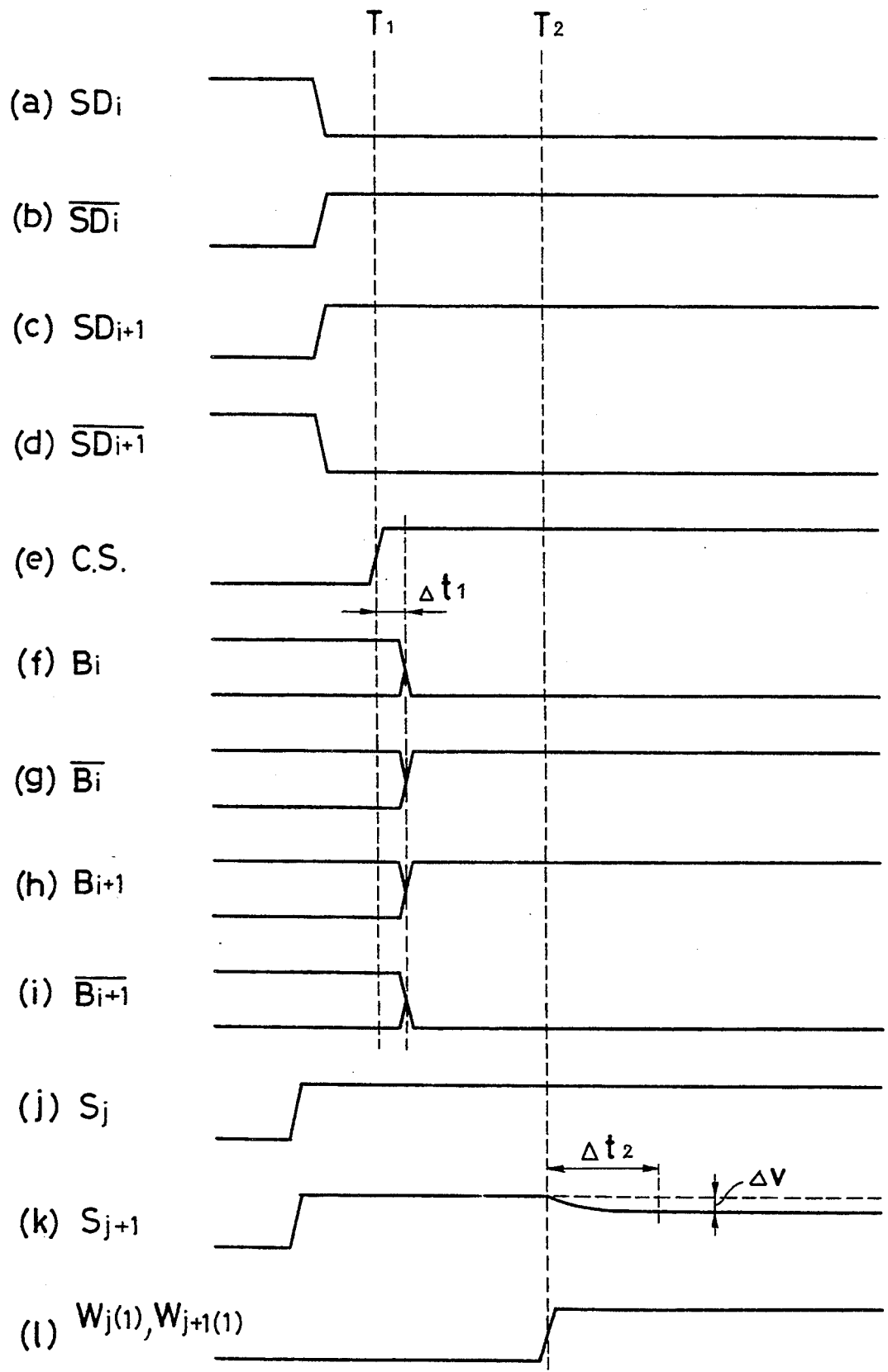
FIG. 14 is a timing chart showing exemplary data retrieval timing of the memory array of FIG. 11.

If each of the memory cell tables 30 of FIG. 13 is carefully looked at, there are three numerals (in the upper row, and left and right lower rows) written therein. In a case corresponding to the memory cell 11a of FIG. 11 (the word line ($W_{j(1)}$) of the upper leftmost memory cell table of FIG. 13), for instance, there are shown "0" in the upper row, "0" in the lower left row and "1" in the lower right row. These numerals in the lower left and right rows represent data $D_i$ and $D_i$ at the time the memory data are read respectively, whereas what is in the upper row represents data $D_i$.

The above-mentioned method of reading the memory does not always necessitate two of the bit and bit bar lines. In other words, either one is sufficient for the original operation of ROM at the time only memory data is read and the 1-bit memory cell of ROM may be used as a 2-bit one. A selective transistor having the same function as that of the selective transistor 13a of the memory cell 11a of FIG. 11 is arranged at a position adjacent to the latter. The drain electrode of this transistor is connected to the bit line ($B_i$) 18a and the source electrode thereof is connected to the retrieval sensing line ($S_j$) 16 and further the control gate electrode thereof is connected to the control word line ($W_{j(1)}$) in order that the memory data is read as stated above. Then the precharged charge of the bit line ($B_i$) 18a is caused to flow into the ground potential via the newly provided selective transistor and the retrieval sensing line ($S_j$) 16 and consequently held low ("0"), whereby an inverted signal high ("1") is obtained from the inverter 4.

In other words, the ROM memory array of FIG. 11 is quite similar to an array in the conventional NOR-type ROM. However, regular data and inverted data are written to the adjacent 2-bit memory selected by the same word line to express one bit with these two data as a set for the purpose of high-speed data retrieval according to the present invention. In the example shown in FIG. 11, there has been employed a bit configuration method which depends on whether or not transistors are configured in the conventional form. However, any other conventional bit configuration method through contact, diffusion, injection and the like is possible. Moreover, it is not necessarily needed to make memory cells with two bits as a set adjacent to each other.

In this example, four parallel memory cells are connected to each retrieval sensing line ($S_j$, $S_{j+1}$) fixed to the ground potential in parallel on a bit line basis at the time memory data is read, so that a large scale integrated CAM can be produced.

A description is subsequently given of the subject matter of the present invention, that is, a technique of implementing identity retrieval of a 2- bit set of data. Referring to FIG. 11 first, a description is given of a case where 1, 0 data on the same word line in ROM having data shown in FIG. 13 are retrieved by means of a timing chart of FIG. 14.

(1) First, the retrieval sensing lines 16, 17 in this example are precharged by the pull-up transistors 2b, 3b with high ("1"). Moreover, identity retrieval data of 0 and 1 are added to data $SD_i$ and $SD_{i+1}$, respectively. Needless to say, 1 and 0 are applied to data $SD_i$ and $SD_{i+1}$ as inverted data, respectively. However, the values of the bit and bit bar lines are not restricted (see up to time $T_1$ of FIG. 14).

(2) Subsequently, the data control line (C.S.) 5 becomes high ("1") and four of the above-mentioned data $SD_i$, $SD_i$, $SD_{i+1}$, $SD_{i+1}$ are applied to the bit and bit bar lines, respectively. As a result, the potential of the bit line ($B_i$) 18a and that of the other bit line ($B_{i+1}$) 19a are fixed to low ("0") and high ("1") after a delay of $\Delta t1$, respectively. Simultaneously, the bit bar line ($B_i$) 18b and the bit bar line ($B_{i+1}$) 19b of the inverted signal line become high ("1") and low ("0"), respectively. Moreover, two of the retrieval sensing lines ($S_j$) 16, ($S_{j+1}$) 17 are also caused by the precharge transistors 2b, 3b temporarily held ON to keep the precharged charge and remain high ("1") (see the section after time $T_1$ of FIG. 14).

(3) The word line ($W_{j(1)}$) 14 and ($W_{j+1(1)}$) 15 in this state become high ("1") at time $T_2$. The operation of each set of word lines ($W_{j(1)}$) 14, ($W_{j+1(1)}$) 15 (or each of the retrieval sensing lines ($S_j$) 16, ($S_{j+1}$) 17) in this state is considered.

With respect to the memory cell 11a selected by the word line ($W_{j(1)}$) 14, both the bit bar line ($B_i$) 18b and the retrieval sensing line ($S_j$) 16 are held high ("1") and the selective transistor 13a is held OFF. With respect to the memory cell 11b, both the bit bar line ($B_{i+1}$) 19b and the retrieval sensing line ($S_j$) 16 are also high ("1") and the selective transistor 13b is also held OFF. The potential of the retrieval sensing line ($S_j$) 16 is not caused by the two memory cells 11a, 11b selected by the word line ($W_{j(1)}$) 14 to vary and the retrieval sensing line ($S_j$) 16 keeps high ("1").

A description is subsequently given of the effect of the memory cells 11c, 11d selected by the other word line ($W_{j+i(1)}$) 15 on the electric potential of the retrieval sensing line ($S_{j+1}$) 17. The selective transistor 13d is initially held OFF as both the bit line ($B_{i+1}$) 19a and the retrieval sensing line ($S_{j+1}$) 17 have high ("1") electric potential. In the case of the memory cell 11c, however, it is in a different skate. In other words, the selective transistor 13c of the memory cell 11c is connected to the bit line ($B_i$) 18a fixed to low ("0") electric potential. For this reason, the selective transistor 13c is turned on and the charge of the retrieval sensing line ($S_{j+1}$) 17 precharged with high ("1") moves to the bit line ($B_i$) 18a, whereby its electric potential begins to drop.

When the potential of the retrieval sensing line ($S_{j+1}$) 17 drops and further becomes lower by the then threshold voltage $V'_{TH}$ of the selective transistor 13d (higher than normal $V_{TH}$ due to the substrate bias effect of N-channel MOS) than the gate voltage $V_{w1}$ applied to the word line ($W_{j+1(1)}$) 15 connected to the gate electrode of the selective transistor 13d, the selective transistor 13d is turned on and the high ("1") voltage of the bit line ($B_{j+1}$) is applied. Therefore, the potential of the retrieval sensing line ($S_{j+1}$) 17 ultimately settles at the value determined by resistance division due to the ON resistance of the selective transistors 13d, 13c and the like.

However, there is produced a d.c. (direct current) path from the bit line ($B_{i+1}$) 19a at the supply potential to the bit line ($B_i$) 18a at the ground potential then. Consequently, the potential of the retrieval sensing line ($S_{j+1}$) 17 has to be detected by the sense amplifier (S.A.) 10 before the voltage drops up to a potential ($V_{w1} - V'_{TH}$) at which the selective transistor 13d is turned on so as to remove the path. If $V_{w1} - V'_{TH}$ is set at about 2.5 V, for instance, by lowering the gate voltage $V_{w1}$ of the selective transistor 13d at the time of data retrieval, it will be easier to restrain the generation of the d.c. path resulting from the trailing of the word lines ($W_{j(1)}$, $W_{j+1(1)}$) thereafter.

In other words, the match line ($S_j$) 16 coupled to the memory cells (memory cell $11a = 0$, memory cell $11b = 1$) conforming to the retrieval data ($SD_i = 0$, $SD_{i+1} = 1$) maintains the initially set precharged state (high ("1")) when the word lines ($W_{j(1)}$) 14, ($W_{j+1(1)}$) 15 are set high ("1"). On the other hand, the retrieval sensing line ($S_{j+1}$) 17 coupled to the memory cells (memory cell $11c = 1$, memory cell $11d = 1$) not in conformity with the retrieval data causes a potential drop of $\Delta V$ from the precharged state. The sense amplifier (S.A.) 10 is used to retrieve these state of change and unchange, so that the conformity and nonconformity of the data become detected at high speed.

In this embodiment, the plurality (four in this case) of memory cells per bit line are connected to one retrieval sensing line for the purpose of large scale integration so as to form one unit block (UB1-UB4). During the data identity retrieval operation, one word line is always selected from among these unit blocks (UB1-UB4) and simultaneous retrieval is effected over the plurality of unit blocks. Therefore, the operation has to be repeated N times or the number of 2-bit sets of memory cells constituting the unit block (UB1-UB4) (equal to the number of word lines in each unit block), that is, four times as in the example shown and the retrieval result is stored every identity retrieval operation. When there is only one 2-bit set of memory cells in one unit block (UB1-UB4) as a special case, the data retrieval of the whole memory cell can be completed in one operation.

While the CAM with NOR-type ROM as a base according to the present invention has the construction described on the foregoing pages, ROM is capable of writing data only once. For instance, an embodiment applied to the nonvolatile memory is described in the following. A unit block (UB1) of NOR-type CAM memory cell applied to MONOS-type nonvolatile memory elements. The CAM shown in FIG. 15 has substantially the same retrieval technique and construction as the first embodiment of the second mode shown in FIG.

Figure 15:
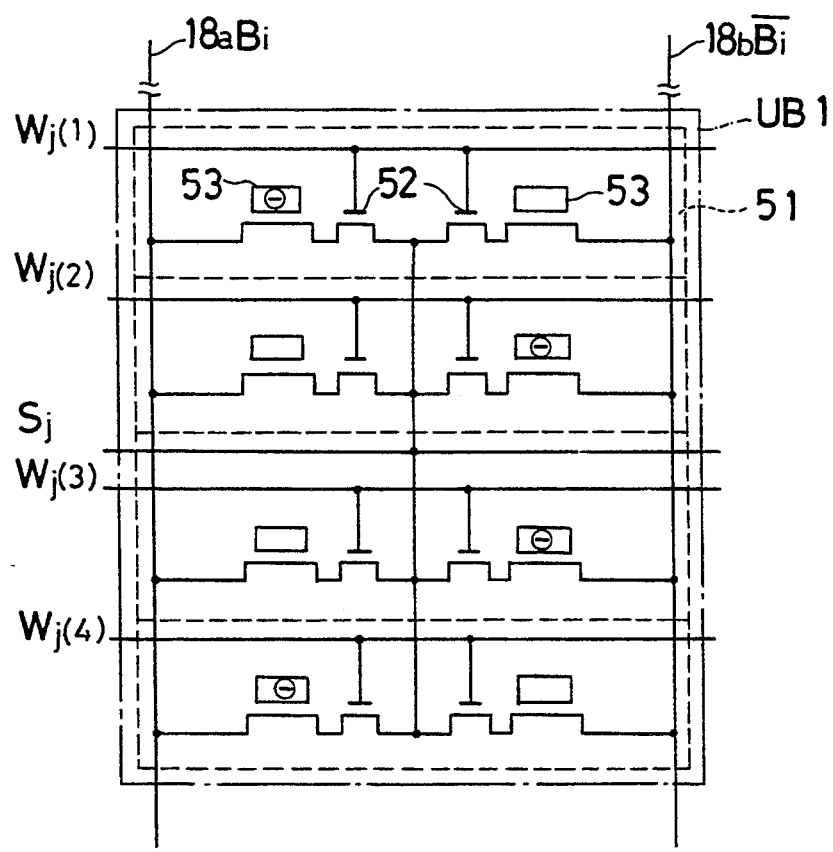
FIG. 15 is a circuit diagram of a memory block with a nonvolatile memory as a base in other embodiment of the semiconductor integrated circuit according to the present invention.

11, so that the unit block shown in FIG. 15 is taken in consideration to be applied to the unit block (UB1) as it is.

However, each one bit memory comprising the selective transistor 52 and the memory gate 53 is interposed between the bit line (B$_i$) 18a and retrieval sensing line (S$_j$) and between the bit bar line (B$_j$) 18b and retrieval sensing line (S$_j$) in corresponding area to each one bit of the memory cell with 2-bit as a set (see FIG. 15).

As any known MONOS memory is usable, a detailed description will be omitted. Switching characteristics may be made variable by injecting electrons into a memory gate to increase the gate threshold value in order to form an enhancement type MOS or discharging electrons to form a depression type MOS.

Therefore, for setting the memory data such as ROM shown in FIG. 11, the gates marked minus in the memory gates 53 by injecting electrons thereinto to form enhancement type are turned off and other gates to form depression type are turned of.

The semiconductor integrated circuits according to the third and fourth aspect of the present invention using EPROM, E$^2$PROM or the like are substantially the same construction as this embodiment described above, and the data retrieval methods thereof are the same as the first embodiment of the second mode, so that a detailed description will be omitted. The features of these embodiments include making possible the reloading of data and its application to databases and the like is quite promising due to the fact that not only data reloading but also high-speed retrievable of optional data is possible.

Moreover, memory areas of the present mode are the same as that of the prior art, theses memories with two bits as a set and use can also be made of memories which have a high degree of freedom in that some of them have one memory cell with two bits as a set and the remainder has one memory cell with one bit.

Figure 16:
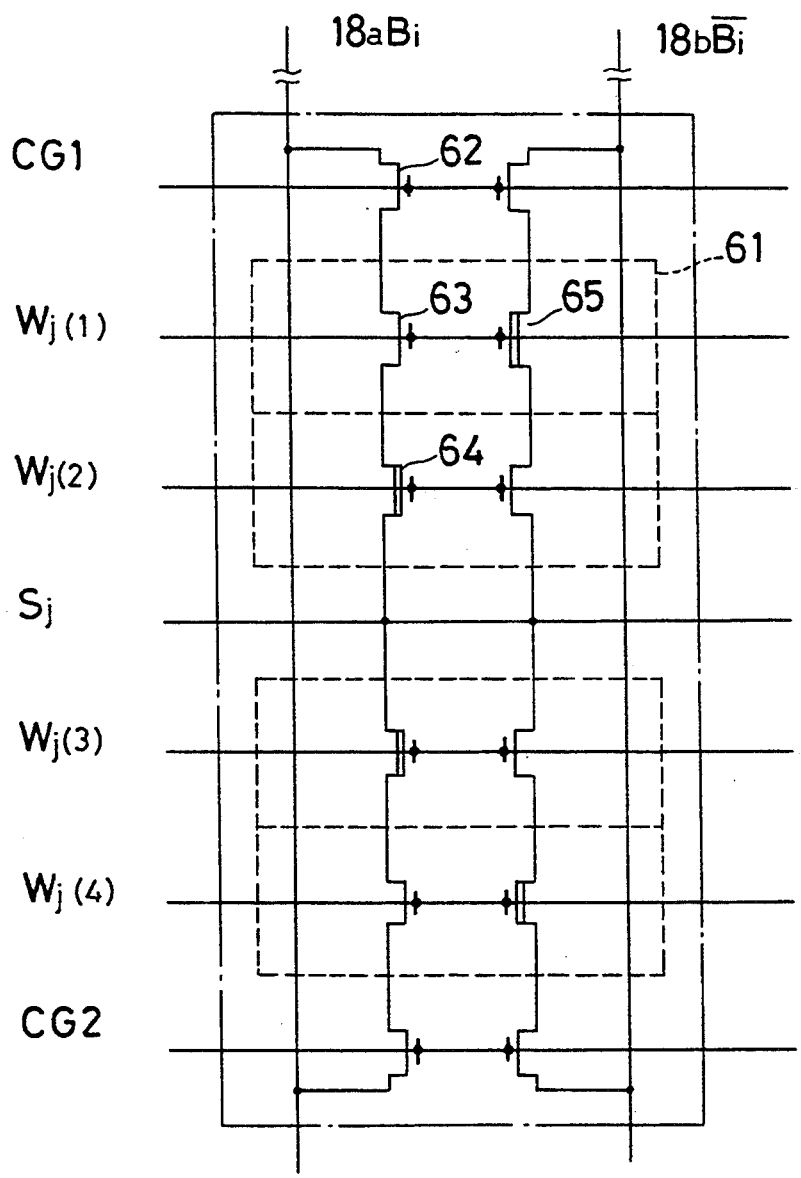
FIG. 16 is a circuit diagram of a memory block with NAND-type ROM as a base in other embodiment of the semiconductor integrated circuit according to the present invention.

Although NOR-type ROM has been used as a base in the first embodiment, in case of the semiconductor integrated circuit according to the fifth aspect of the present invention, as will be described later, the application of NAND-type ROM, as called, is shown in FIG. 16.

A circuit diagram of a memory configuration with NAND-type ROM replaced from NOR-type ROM shown in FIG. 11 is shown in FIG. 16 for the simplification.

Each memory cell is made with two bits as a set and either enhancement transistor or depression transistor represents either "0" or "1". For example, the control gate 62, enhancement transistor 63 representing the data "0" and depression transistor 64 representing the data "1" are connected in series to the retrieval sensing line (S$_j$).

In the read out operation, two word lines (W$_{j(1)}$, W$_{j(2)}$) of the enhancement transistor 63 and depression transistor 64 connected in series each other on the non-selection state are both high "1", so that both transistor 63 and 64 are held ON out of all relation to either enhancement type or depression type. On the contrary, on the non-selection state in this first embodiment, all word lines are low ("0") and have a entirely opposite polarity to this embodiment.

Next, the word line (W$_{j(1)}$ is held low "0" and selected, and the control gate (C.G. 1) is also held high "1". The enhancement transistor 63 selected by the word line (W$_{j(1)}$) is then turned off, so that the bit line (B$_j$) 18a and the retrieval sensing line (S$_j$) are not made to conduct.

On the contrary, the adjacent depression transistor 63 remains ON, so that the bit bar line (B$_j$) 18b and the retrieval sensing line (S$_j$) are connected and are both low ("0"). By descent of word line of the memory cell selected in this way, either the enhancement type or the depression type is discriminated. After the read out operation is understood in this way, the CAM memory is composed of one memory with adjacent two bits memory as a set selected by the same word line and having the opposite polarity each other as in same way of the first embodiment of the second mode the data retrieval of the CAM memory can be effected as in same case of the first embodiment by controlling the potential of the retrieval sensing line (match line).

While what is made of two memory transistors connected in series is described above, the more transistors are increased, the high integration of the CAM is effected. Moreover, it is comparatively easy that the CAM with E$^2$PROM is developed from the CAM with NAND type ROM as a base.

In the NOR-type memory cell shown in FIG. 15, the selective transistor 52 is connected to the retrieval sensing line (S$_j$). The present invention, however, is not limited to this particular case and the selective transistor 52 may be connected to the bit line (B$_i$) 18a or the bit bar line (B$_j$) 18b.

Further, in the NAND-type memory cell shown in FIG. 16, the control gates 62 connected to the bit line (B$_i$) 18a and the bit bar line (B$_j$) 18b can function as the selective transistors described above. Moreover, in this embodiment, the control gates 62 may be interposed or the newly selective transistors different from the control gates 62 between the retrieval sensing line S$_j$ and the depression transistor 64 whose gate electrode is connected to the word line W$_{j(2)}$ and between said line S$_j$ and the enhancement transistor whose gate electrode is connected to the same word line W$_{j(2)}$, and this configuration is applicable to CAM memory utilizing the nonvolatile memory such as the EEPROM described after.

Figure 17:
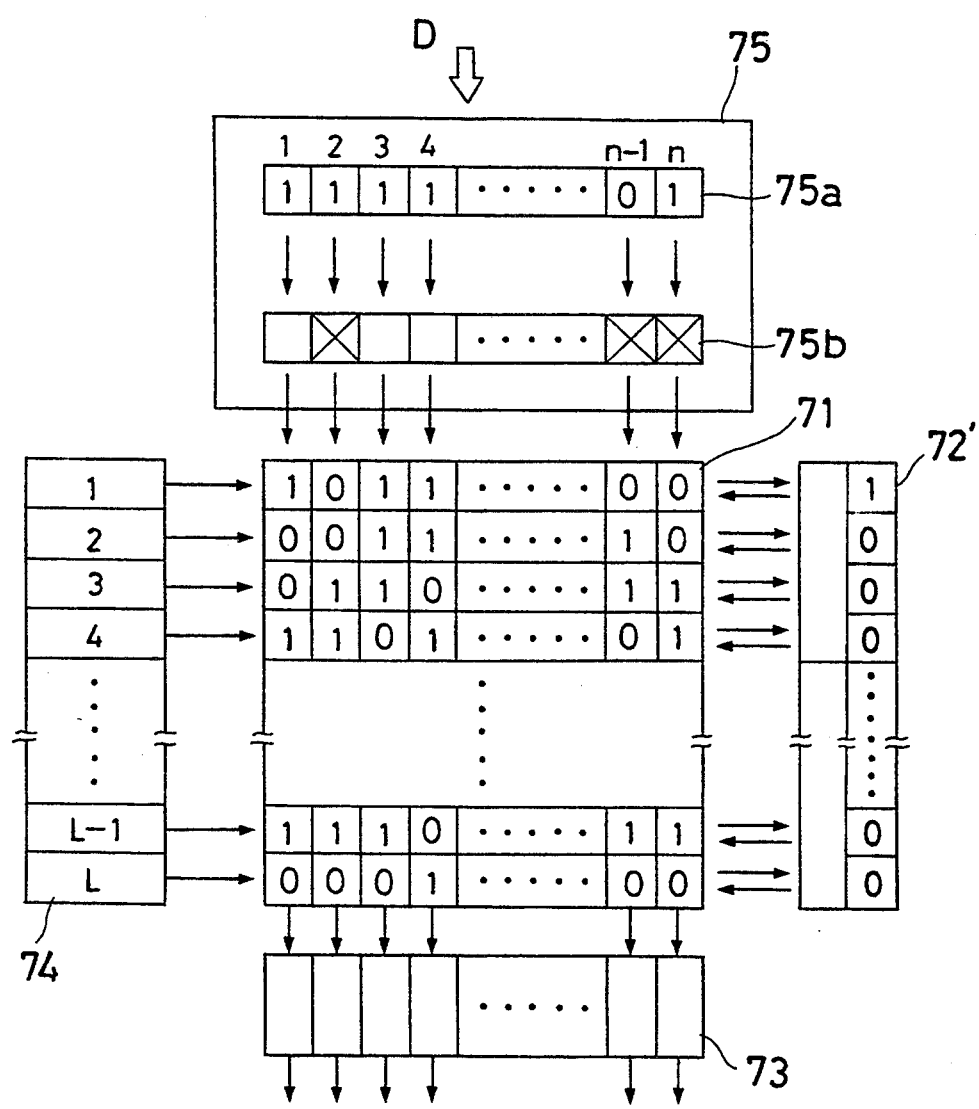
FIG. 17 is a conceptual drawing showing a CAROM configuration having a different memory array in other embodiment of the semiconductor integrated circuit according to the present invention.

FIG. 17 shows an embodiment of an overall CAM configuration having a memory array according to the present invention. In FIG. 17, reference numeral 71 denotes a CAM array portion, 74 an address decoder for gaining access to this array and what is used to drive the above-mentioned word line, 73 a sense amplifier for reading out at the operation of the ROM, and 72' an identity detection circuit for deciding whether retrieval data match or in equal on receiving & signal from a retrieval sensing line corresponding to each of the memory words and a decoder circuit. Further, numeral 75 denotes a data/mask register portion. The embodiment of the overall CAROM configuration shown in FIG. 17 has essentially the same construction as the embodiment of the overall CAROM configuration shown in FIG. 11 except for the identity detection and decoder circuit 72' instead of the identity detection circuit 72. Therefore, in the embodiment as shown in FIG. 17, a detailed description is not given. Here, the results obtained from the identity retrieval carried out four times on a block basis with respect to the CAM array 71 show that only the identity detection and decoder circuit 72' with an address number being 1 is 1 and the rest is 0. Needless to say, a plurality of identity data may be detected, depending on the retrieval data. In this case, matching data may be output by providing priority order under a certain rule.

Figure 18:
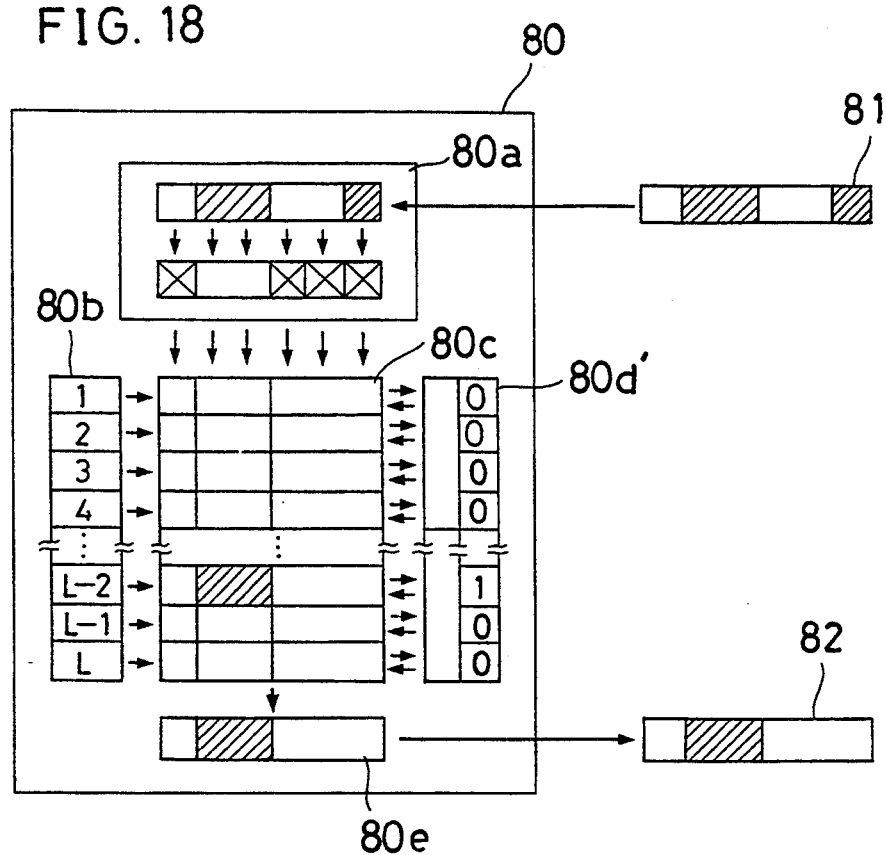
FIG. 18 is a diagram illustrating the operation of CAROM in the semiconductor integrated circuit of FIG. 17.

FIG. 18 illustrates a case where CAM embodying the present invention is used for database retrieval.

Reference numeral 80 denotes CAROM as the semiconductor integrated circuit embodying the present invention, which comprises as in FIG. 17 a data/mask register 80a, an address decoder 80b, a CAM array (memory array) 80c, an identity retrieval/decoder block 80d' and a sense amplifier 80e. As is obvious from FIG. 18, no components such as CPU are not necessarily required as in the case of FIG. 9 described above as far as retrieval is only concerned. However, the use of LSI makes possible extremely high speed data retrieval (over $10^2$ times higher in speed) while same degree of integration as conventional ROM is maintained.

The foregoing is based on the present invention with ROM as a base and the idea is not limited to this embodiment. As state above, the various electrically connecting means can be used as a coupler to form the coupling portion and the above-described CAM can be used as one of the component parts of the semiconductor integrated circuit of the present invention.

As is obvious from the description given in reference to the second mode of the present invention, the provision of an extremely compact CAM with ROM or a nonvolatile memory as a base is thus accomplished. It is extremely easy that the configuration of CAM based on ROM or a nonvolatile memory as described in an embodiment of the semiconductor integrated circuit according to the present invention can be attained by use made of one memory with two bits a set. Therefore, the CAM can be easily used in part as one memory with one bit as a set or one memory with two bits as a set and can be made as the memory capable of high-speed retrieval and having greater freedom. The CAM extremely higher in integration than the conventional SRAM can be configurated.

Referring to the third mode shown in FIGS. 19 and 20, a detailed description is subsequently given of an semiconductor integrated circuit according to the present invention.

In the semiconductor integrated circuit according to the third mode of the present invention, a first data line and a second data line are provided. The possible electrical connection between these first and second data lines and a match line via a control word line (or a data read control line) depends on the definition of the connections of a first storage cell (e.g. connection) and a second storage cell (e.g. non-connection). The storage cell corresponds to the storage unit of the present invention.

Moreover, the first data line sets the high (or low) conversely sets the low (or high) potential thereof, whereas the match line is precharged with the high (or low) potential. On condition that the control word line remains active, the potential of the match line does not vary as the first data line is held high, though the connection between the first data line and the match line depends on the snake of the first storage cell to be connected. This is defined as the conformity of retrieval data with storage cell data.

Conversely, the first data line and the second data line set the low potential and the opposed high potential, respectively. Similarly, first data line at the low potential and the match line precharged with the high potential are discharged and set at the low potential when the match line is precharged with the high potential and when the control word line is made active. This state is defined as the non-conformity of retrieval data with storage cell data.

It is thus possible to detect the conformity and non-conformity of data as the potential of the match line varies with the state of the retrieval data and the storage cell.

Moreover, the retrieval data are prevented from interfering with each other as the variation of the potential of the match line positively correlate with that of the potential of the control line then.

Since data can be retrieved from a number of memory cells at a time without mutual interference by making use of the above-mentioned characteristics in the semiconductor integrated circuit according to the present invention, data can be retrieved from a large capacity memory with a number of memory cells disposed in the format of an array.

Figure 19:
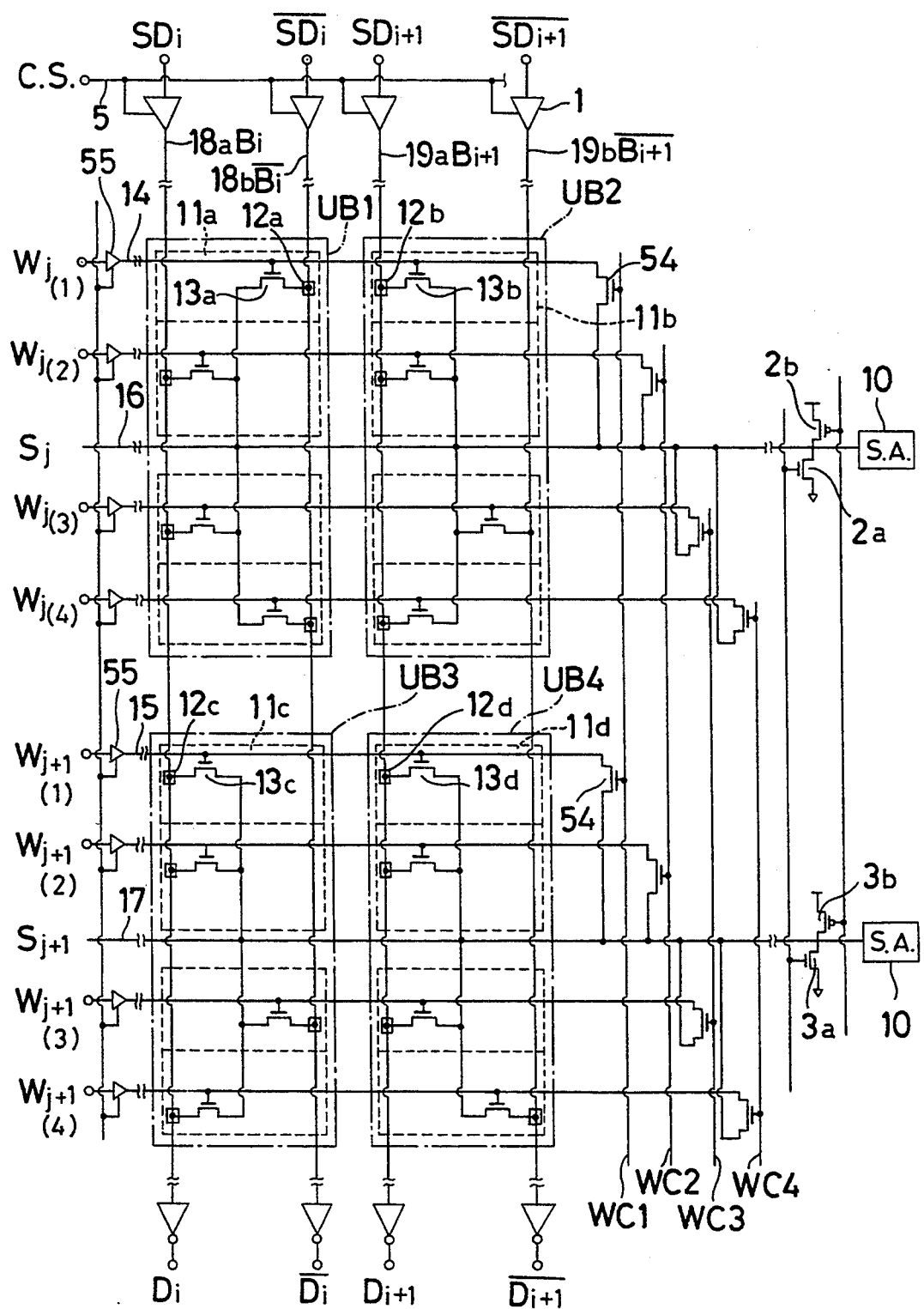
FIG. 19 is a circuit diagram of a NOR-type memory array in other embodiment of the semiconductor integrated circuit according to the present invention.
Figure 20:
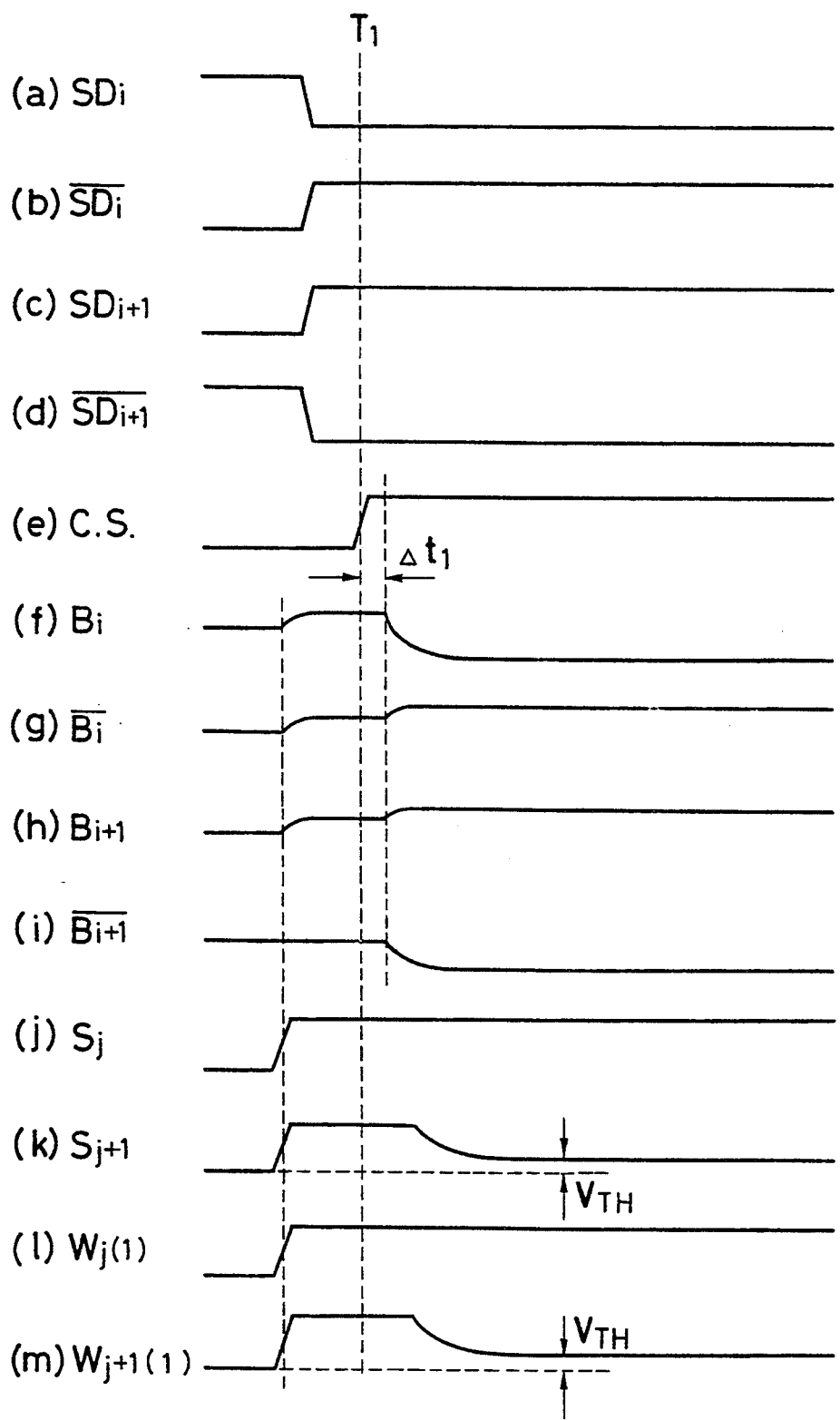
FIG. 20 is a timing chart showing exemplary data retrieval timing of the memory array of FIG. 19.

FIG. 19 is a circuit diagram of an exemplary NOR-type CAROM array showing the semiconductor integrated circuit according to the third mode of the second aspect of the present invention. The CAROM array shown in FIG. 19 is similar in configuration to the CAROM array of FIG. 11, excluding a transistor 54 for setting each of the control word line and the retrieval sensing line afloat and a tri-state buffer 55 defined to the sixth aspect of the present invention, wherein like reference characters designate like or corresponding component parts, and the detailed description of them will be omitted.

A description is subsequently given of an exemplary novel arrangement with respect to a method of controlling generation of the above-mentioned d.c. path.

What makes this embodiment different from FIG. 11 is than there are provided four transistors 54 for connecting respective four word lines ($W_{j(1)}$, $W_{j(2)}$, $W_{j(3)}$, $W_{j(4)}$) and a retrieval sensing line ($S_j$) 16. The four transistors 54 are so controlled that four kinds of control signal WC1, WC2, WC3, WC4 cause them to be turned on/off independently. The transistor 54 turned on by the control signal WC1, for instance, connects the word line $W_{j(1)}$ and the retrieval sensing line ($S_j$) 16.

As an ordinary ROM memory for use, ROM data can be read likewise as seated above by totally making non-active the four kinds of control signal lines. Referring to a timing chart of FIG. 20, a description will mainly given of the operation of controlling a d.c. path at the time of identity data retrieval.

(1) First, the retrieval sensing lines 16, 17 are precharged by the pull-up transistors 2b, 3b with high ("1"). A transistor 50 is turned on by setting high ("1") the control signal line WC1, whereas the word line $W_{j(1)}$ and the word line $W_{j+1(1)}$ are also set high ("1"). However, the data control line (C.S.) 5 is held low ("0") and four of the tri-state buffers 1 are held OFF. Although the values of data $SD_i$, $SD_i$, $SD_{i+1}$, $SD_{i+1}$ are not restricted at this time, data are preset for them in this case. The four selective transistors 13a, 13b, 13c, 13d are turned on in this state and charges up the bit bar line ($B_i$) 18b, the bit line $B_{i+1}$) 19a, the bit line ($B_i$) 18a and the bit line ($B_{i+1}$) 19a. Since these selective transistors are N-channel transistors, each of them is charged up from the source side (retrieval sensing line side) to the drain side (bit line or bit bar line side). Consequently, the threshold voltage $V_{TH}$ of the transistor is caused to rise because of the substrate bias effect and the charge-up potential does not rise up to the supply voltage. The charge-up potential is substantially 0.8 V on the assumption that the supply voltage and the normal threshold voltage $V_{TH}$ are 5 V and 3.6 V, respectively. Moreover, the bit bar line $(B_{i+1})$ 19b remains afloat (see up to time $T_1$ of FIG. 20).

(2) Subsequently, the word line $(W_{j(1)})$ 14 and the word line $(W_{j+1(1)})$ 15 are cue off the high ("1") potential and set afloat; for instance, this can be attained by connecting the word lines $W_{j(1)}$–$W_{j+1(4)}$ to a tri-state buffer 55 or the inverter. However, the control signal WC1 is held high ("1"), and the retrieval sensing line $(S_j)$ 16 and the word line $(W_{j(1)})$ 14 are set afloat while these are electrically connected by the transistor 54. Needless to say, the pull-up transistor 2b has already been turned off then. Similarly the retrieval sensing line $(S_{j+1})$ 17 and the word line $(W_{j+1(1)})$ are connected together and set floating-high.

When the data control line (C.S.) 5 is set high ("1"), the four data $SD_i$, $SD_i$, $SD_{i+1}$, $SD_{i+1}$ are applied to the respective bit and bit bar lines. As a result of the potential of the bit line $(B_i)$ 18a and the other bit line $(B_{i+1})$ 19a are respectively fixed to low ("0") and high ("1") after a delay of $\Delta t_1$. Simultaneously, the bit bar line $(B_i)$ 18b and the bit bar line $(B_{i+1})$ 19b of these inverted signal lines are set high ("1") and low ("0"), respectively.

The operation of each of the words lines $(W_{j(1)})$ 14, $(W_{j+1(1)})$ 15 in this state is considered.

First, any of the gate, source, drain electrodes of the selective transistors 13a, 13b of the memory cells 11a, selected by the word line $(W_{j(1)})$ is held high ("1") and these transistors 13a, 13b are held OFF. Therefore, the potential of the retrieval sensing line $(S_j)$ 16 is not caused to vary and held high ("1").

A description will subsequently be given of the effect of the memory cells 11c, 11d selected by the other word line $(W_{j+1(1)})$ 15 on the potential of the retrieval sensing line $(S_{j+1})$17. The potential of the bit line $(B_i)$ 18a is driven by the tri-state buffer 1 to low ("0"). The potential of the gate and source electrodes of the selective transistor 13c of the memory cell 11c is held floating-high ("1"). Consequently, the selective transistor 13c is turned on and the charge of the retrieval sensing line $(S_j)$ 17 is discharged and pulled down to the low ("0") potential.

The potential drop of the retrieval sensing line $(S_{j+1})$ 17 in the preceding embodiment then is seen to have turned on the selective transistor 13d from a certain potential. However, the transistor 50 keeps connecting the retrieval sensing line $(S_{j+1})$ 17 to the word line $(W_{j+1(1)})$ 15. Consequently, the potential of the word line $(W_{j+1(1)})$ also drops as thee of the retrieval sensing line $(S_{j+1})$ 17 drops, whereby the potential difference $\Delta V$ between the source electrode (on the side of the retrieval sensing line $(S_{j+1})$ 17) and the gate electrode (word line $(W_{j+1(1)})$ 15) or the selective transistor 13d can be minimized. While the potential on the drain electrode side (bit line $(B_{j+1})$ 19a) is held high ("1"), the potential difference $\Delta V$ ($< V_{TH}$) is maintained. Even when the potential of the retrieval sensing line $(S_{j+1})$ 17 drops from high ("1") to low ("0"), the gate potential will never hold constantly what is higher by the difference of the threshold voltage than the source or drain potential. Even when the potential of the retrieval sensing line $(S_{j+1})$ 17 drops, the selective transistor 13d will never be turned on constantly. It is therefore possible to retrain cell-to-cell interference up to not a problematical level. In this case, the potential of the retrieval sensing line $(S_{j+1})$ 17 drops to a level at which the selective transistor 13c is turned off, that is, up to the threshold voltage $V_{TH}$ of the transistor (see after time $T_1$ of FIG. 20).

As is obvious from the third mode described above, the present invention is intended to attain a extremely compact CAM with ROM or a nonvolatile memory as a base. CAM as the semiconductor integrated circuit of the present invention on the basis of ROM or the nonvolatile memory cited by way of example can readily be obtained practically by means of one memory with two bits as a set. It is therefore possible to provide CAM readily usable as a 1-bit or 2-bit memory partially and this makes it possible to provide a free, high-speed data retrieval memory which has the degree of not only integration but also freedom greater than what is conventionally based on SRAM.

Needless to say, the configuration of the semiconductor integrated circuit according to the sixth aspect of the present invention described in this mode is applicable to other the first to five aspects of the present invention.

Referring to a fourth mode as shown in FIGS. 21 to 24 inclusive, a detailed description is subsequently given of a semiconductor integrated circuit according to the second and fourth aspects of the present invention.

In a semiconductor integrated circuit according to the fourth mode of the present invention, a memory cell comprising a pair of first and second storage areas is provided with a first and a second data line. The first or second data line can be coupled electrically to a match line connected to a sense amplifier having an electric potential detecting function, depending on the contents of the first or second storage area within the memory cell.

Moreover, the first or second data line is connected to the match line in conformity with the contents of the storage area in the memory cell. When the stored data conforms to the retrieval data, the same electric potential is always supplied from the first or second data line to the match line. When the contents stored in the memory cell conversely differ from the retrieval data, a different electric potential is supplied from the first or second data line to the match line.

The supply of electric potential to the match line in this way is effected for one line of memory cells selected by the one control word line and the sense amplifier connected to the match line detects the same electric potential supplied to the match line when the data stored in all these memory cells conform to the retrieval data and detects a different electric potential when they do not conform to each other. The result is temporarily stored in a holding means such as a storage register corresponding to a driven word line. The word lines are thus driven sequentially and the sense amplifier of each unit causes the result to be stored in the corresponding storage register.

The control word lines are driven in such a way that those in each set (unit) is driven in predetermined order on a unit basis. The contents of many memory cells can thus be retrieved at high speed with a minimum number of sense amplifiers.

Figure 21:
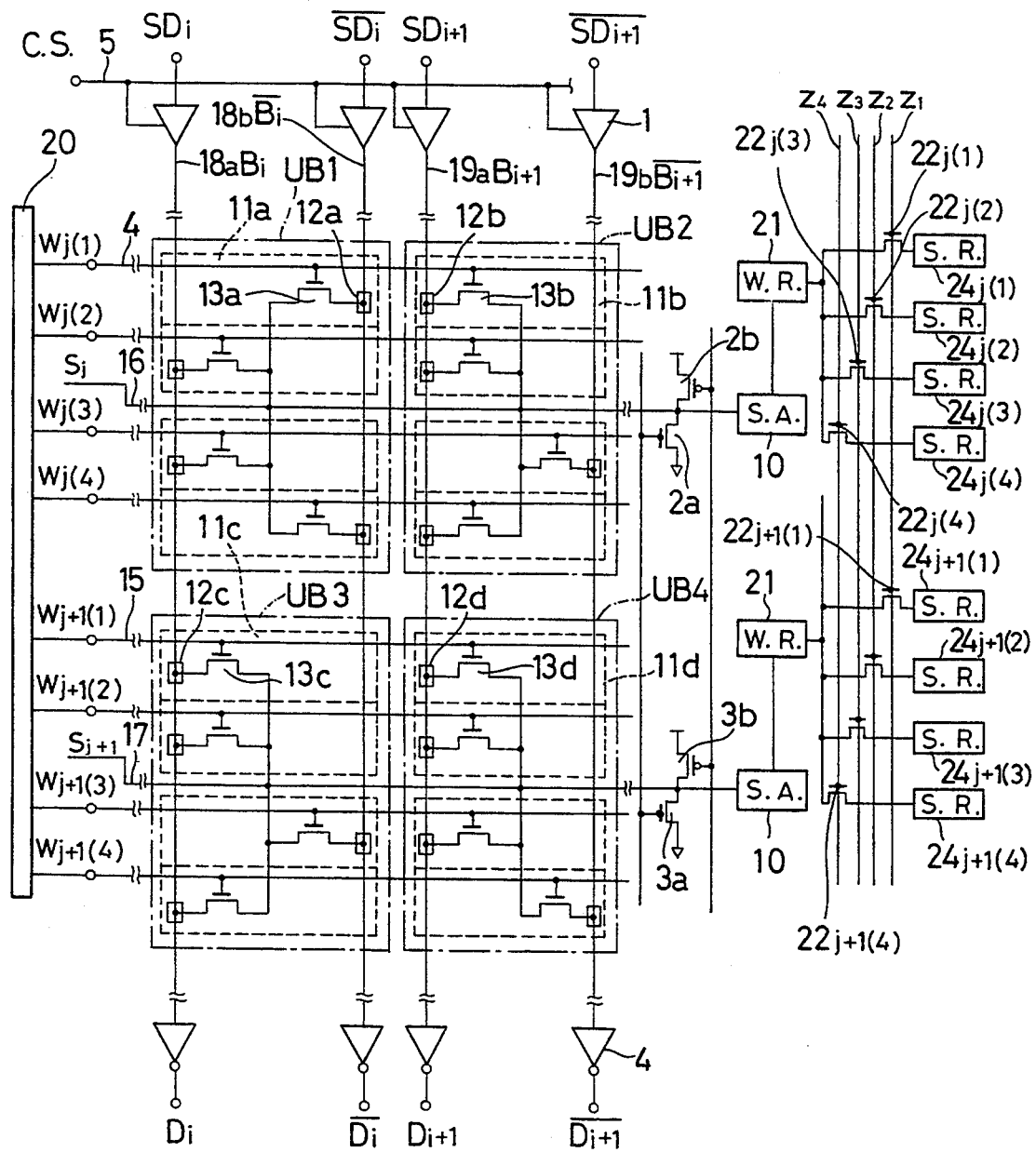
FIG. 21 is a circuit diagram of a NOR-type memory array in other embodiment of the semiconductor integrated circuit according to the present invention.

FIG. 21 is a circuit diagram of a NOR-type CAROM array that shows a semiconductor integrated circuit according to an embodiment of the fourth mode of the present invention. The CAROM array shown in FIG. 21 has essentially the same construction as the CAROM array shown in FIG. 11 expect for an address decoder 20 to which each of the control word lines is connected, a working register 21 connected to the sense amplifier and storage resisters (corresponding to the holding means of the present invention) connected to the working register 21 and provided in accordance with the control word lines, so that the constituent elements which are common to both drawings are identified by like numerals and will not be described in detail.

As shown in FIG. 21, the word lines 14, 15 are connected to the address decoder 20. On the other hand, the sense amplifier 10 is connected to the working register (W. R.)21. The working registers 21 are provided in such a way that they correspond to respective word lines 14 ($W_{j(1)}$, $W_{j(2)}$, $W_{j(3)}$, $W_{j(4)}$), 15 ($W_{j+1(1)}$, $W_{j+1(2)}$, $W_{j+1(3)}$, $W_{j+1(4)}$) and connected to respective storage registers $24_{j(1)}$, $24_{j(2)}$, $24_{j(3)}$, $24_{j(4)}$, $24_{j+1[1]}$, $24_{j+1[2]}$, $24_{j+1[3]}$ and $24_{j+1[4]}$ for (temporarily) storing the detected results of conformity or nonconformity of the data in the memory cells selected by the respective word lines with the retrieval data given to the bit lines 18a, 19a via respective transistors $22_{j(1)}$, $22_{j(2)}$, $22_{j(3)}$, $22_{j(4)}$, $22_{j+1(1)}$, $22_{j+1(2)}$, $22_{j+1(3)}$, $22_{j+1(4)}$ to be turned on in response to the drive timing of the respective word lines.

Figure 22:
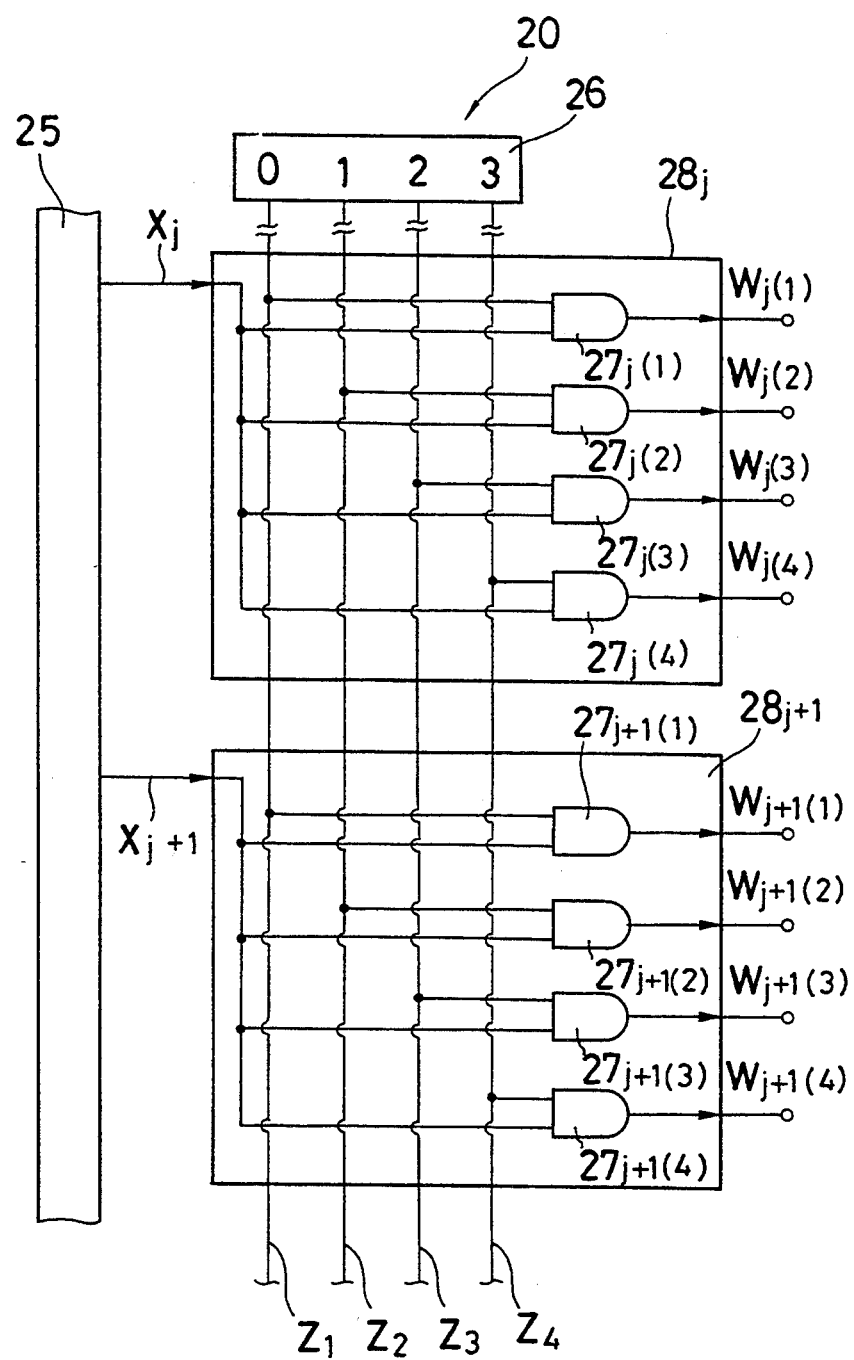
FIG. 22 is a diagram of an address decoder of the memory array of FIG. 21.

As shown in FIG. 22, the address decoder 20 comprises a host decoder 25, a 4-output low order decoder 26 as shown therein, and AND circuits $27_{j(1)}$, $27_{j(2)}$, $27_{j(3)}$, $27_{j(4)}$ for ANDing the output line $X_j$ of the host decoder 25 provided correspondingly for each of the output lines $Z_1$, $Z_2$, $Z_3$, $Z_4$ from the low order decoder 26 with each of the output lines $Z_1$, $Z_2$, $Z_3$, $Z_4$. The output lines of the AND circuit $27_{j(1)}$, $27_{j(2)}$, $27_{j(3)}$, $27_{j(4)}$ constitute a unit $28_j$ with the word lines $W_{j(1)}$, $W_{j(2)}$, $W_{j(3)}$, $W_{j(4)}$. A unit $28_{j+1}$ comprises AND circuits $27_{j+1(1)}$-$27_{j+1(4)}$ for ANDing $X_{j+1}$ with $Z_1$, $Z_2$, $Z_3$, $Z_4$, respectively making word lines $W_{j+1(1)}$-$W_{j+1(4)}$ output lines and is disposed in parallel to the unit $28_j$.

A method of driving the word lines $W_{j(1)}$-$W_{j(4)}$ comprises the steps of holding the output lines $X_j$, $X_{j+1}$ of the host decoder 25 low ("0"), also preferably holding the output lines $Z_1$-$Z_4$ of the low order decoder 26 low ("0"), then holding the output lines $X_j$, $X_{j+1}$ of the host decoder 25 high ("1") and holding the output line $Z_1$ of the low order decoder 26 high ("1"). The AND circuits $27_{j(1)}$, $27_{j+1(1)}$ then output the high state ("1") and drive the word lines $W_{j(1)}$, $W_{j+1(1)}$. At this time, the word lines $W_{j(2)}$-$W_{j(4)}$, $W_{j+1(2)}$-$W_{j+1(4)}$ as the output lines of the AND circuits $27_{j(2)}$-$27_{j(4)}$, $27_{j+1(2)}$-$27_{j+1(4)}$ remain low ("0") as the output lines $Z_2$-$Z_4$ of the low order decoder 26 remain low ("0"). When the reading or identity retrieval of the memory cells (11a, 11b, 11c, 11d) selected by the word lines $W_{j(1)}$, $W_{j+1(1)}$ is terminated, the output line $Z_1$ of the low order decoder 26 is held low and so are the word lines $W_{j(1)}$, $W_{j+1(1)}$. Subsequently, the output line $Z_2$ of the low order decoder 26 is also held high and causes the word lines $W_{j(2)}$, $W_{j+1(2)}$ to be driven. In this way, the output lines of the low order decoder 26 are sequentially held high, whereby the word lines are sequentially driven.

As set forth above, what makes this ROM memory configuration greatly different from the prior art includes the presence of the bit bar line, the fact that the retrieval sensing line is switched by the grounding transistor 2a or the pull-up transistor 2b to the ground electric potential or the supply power electric potential, and that there is created a floating state to which neither ground nor supply power electric potential is connected so that the electric potential variation may be detected by the sense amplifier 10.

The above-mentioned difference is also attributed to the fact that with the plurality (four as illustrated in FIG. 21) of word lines $W_{j(1)}$-$W_{j(4)}$ as a unit, they are driven in predetermined order and while each unit has one match line $S_j$ and one sense amplifier 10 for one identity retrieval, the plurality of units are used to store the results of identity retrieval of the stored data of the memory cells selected by the word lines with the retrieval data in the corresponding storage register S.R. at the time of identity retrieval.

The operation of CAROM thus configured is subsequently described. Referring to a timing chart of FIG. 23, a description is given of an exemplary driving method when use is made of an ordinary ROM. First, the retrieval sensing lines ($S_j$) 16, ($S_{j+1}$) 17 are fixed by the grounding transistors 2a, 3a to the grounding electric potential. Subsequently, four date $SD_i$, $SD_i$, $SD_{i+1}$, $SD_{i+1}$, of two sets of FIG. 21 are totally set at high ("1"). Then the data control line C.S) 5 is set high ("1"). All of the four tri-state buffers (three state buffers) 1 are thus see active by the control signal and the two bit lines ($B_i$) 18a, ($B_{i+1}$) 19a and the two bit bar lines($B_i$) 18b, ($B_{i+1}$) 19b are totally precharged with high ("1"). Needless to say, the output lines ($X_j$, $X_{j+1}$) of the host decoder 25 in the address decoder 20 are totally held low ("0") at this time, whereas the outputs of the AND circuits $27_{j(1)}$-$27_{j(4)}$, $27_{j+1(1)}$-$27_{j+1(4)}$ are totally held low ("0"). Therefore, the word lines ($W_{j(1)}$, $W_{j(2)}$, $W_{j(3)}$, $W_{j(4)}$, $W_{j+1(1)}$, $W_{j+1(2)}$, $W_{j+1(3)}$, $W_{j+1(4)}$) are totally held low ("0") (see a section up to time T of (a)–(b) of FIG. 23).

Figure 23:
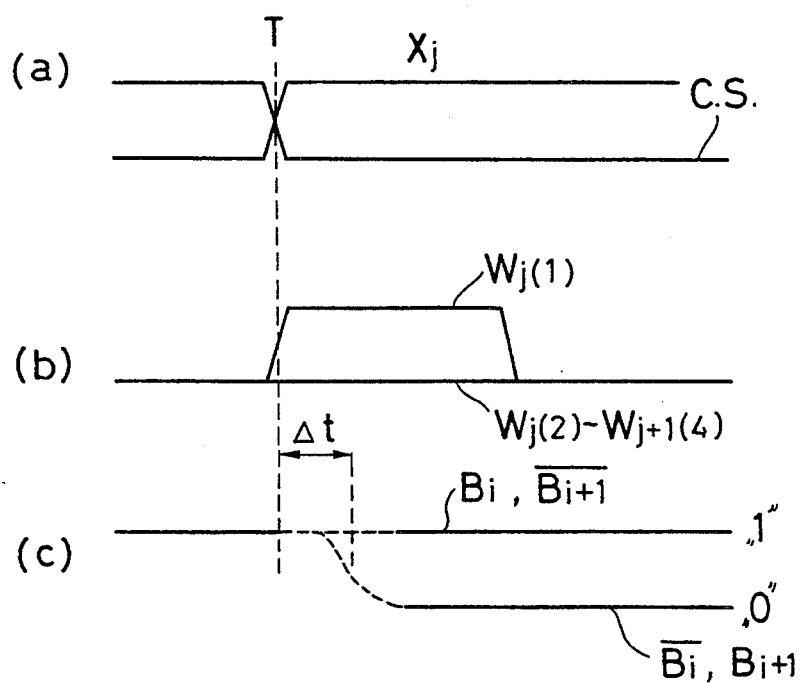
FIG. 23 is a timing chart showing the exemplary operating timing of the memory array of FIG. 21.
Figure 24:
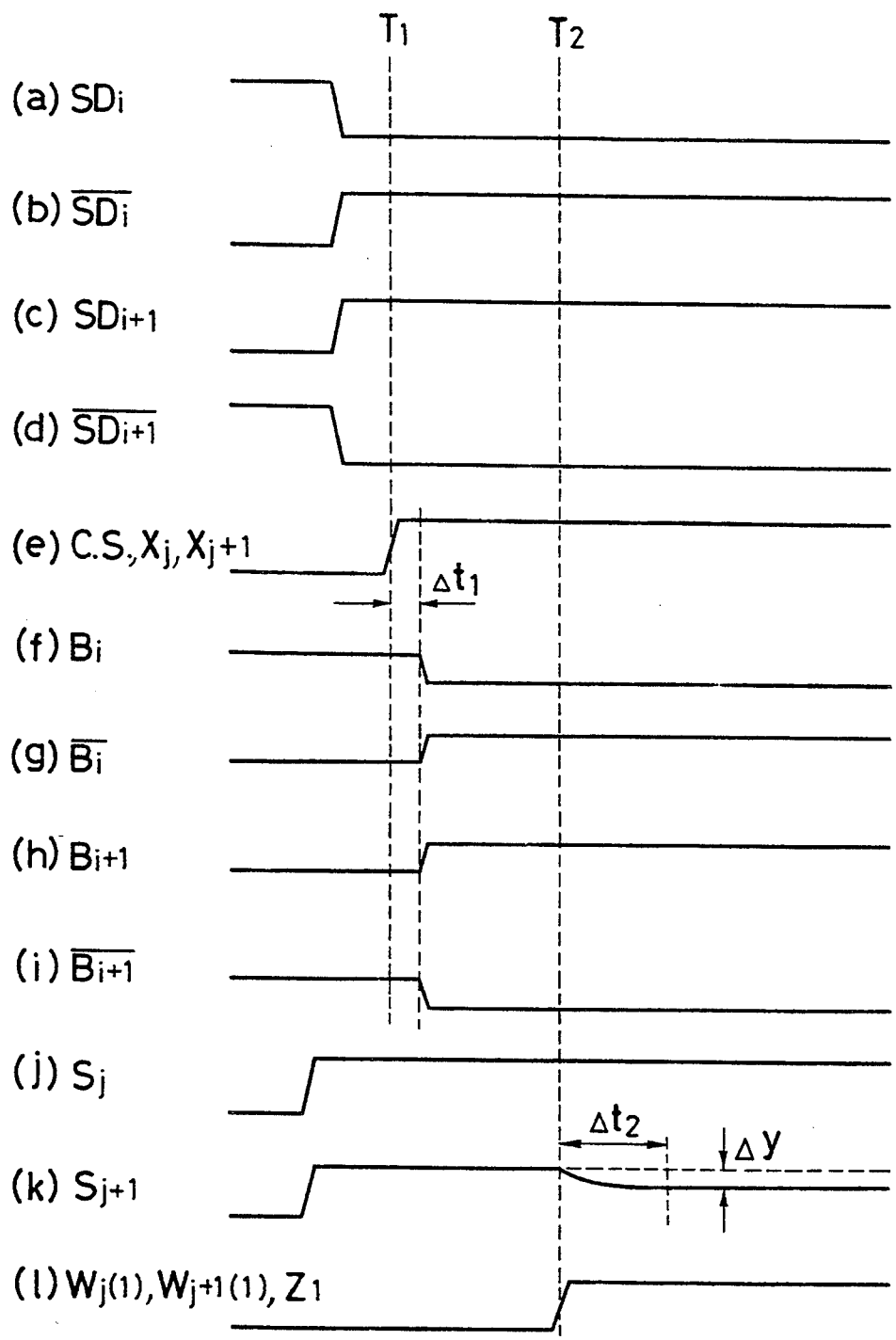
FIG. 24 is a timing chart showing exemplary data retrieval timing of the memory array of FIG. 21.

When the data control line (C.S.) is cut at time T of FIG. 23 and held low ("0"), the four tri-state buffers 1 are turned off. However, four of the bit lines and the bit bar lines respectively remain high ("1"). When the output line $X_j$ of the host decoder 25 of the address decoder 20 is sen high ("1" and when the output line $Z_1$ of the low order decoder 26 is also set high ("1"), the AND circuit $27_{j(1)}$ supplies high ("1") to the word line ($W_{j(1)}$) 14. When the word line ($W_{j(1)}$) 14 is set high ("1"), the selective transistors 13a, 13b are turned on and each of the bit bar line ($B_i$) 18b and the bit line ($B_{i+1}$) 19a is connected to the retrieval sensing line ($S_j$) 16. On the other hand, the retrieval sensing line ($S_j$) 16 is fixed by the grounding transistor 2a to the ground electric potential. Consequently, the bit bar line ($B_i$) 18b and the bit line ($B_{i+1}$) 19a that have been precharged with high ("1") are cause to lose the charge and set at the ground electric potential, that is, set low ("0"). On the contrary, the bit line ($B_i$) 18a and the bit bar line ($B_{i+1}$) 19b remains high ("1") (see after time T of FIGS. 23(b) and (c)).

As a result, while the bit line ($B_i$) 18a remain high ("1"), the bit line ($B_{i+1}$) 19a is set low ("0") in electric potential and the outputs $D_i$ and $D_{i+1}$ of an inverter 4 output 0 and 1 as inverted outputs of these values, respectively.

In other words, "0" and "1" are seen to have been written to the memory cells 11a and 11b, respectively. When data in the memory cells 11c, 11d are read likewise, they are turn out to be "1" and "1." FIG. 13 illustrates these memory data in a simple form.

If each of the memory cell tables 30 of FIG. 13 is carefully looked at, there are three numerals (in the upper row, and left and right lower rows) written therein. In a case corresponding to the memory cell 11a of FIG. 21 (the word line ($W_{j(1)}$) of the upper leftmost memory cell table of FIG. 13), for instance, there are shown "0" in the upper row, "0" in the lower left row and "1" in the lower right row. These numerals in the lower left and right rows represent data $D_i$ and $D_i$ at the time the memory data are read respectively, whereas what is in the upper row represents the data $D_i$.

The above-mentioned method of reading the memory does not always necessitate two of the bit and bit bar lines. In other words, either one is sufficient for the original operation of ROM at the time only memory data is read and the 1-bit memory cell of ROM may be used as a 2-bit one. A selective transistor having the same function as that of the selective transistor 13a of the memory cell 11a of FIG. 21 is arranged at a position adjacent to the latter. The drain electrode of this transistor is connected to the bit line ($B_i$) 18a and the source electrode thereof is connected to the retrieval sensing line ($S_j$) 16 and further the control gate electrode thereof is connected to the word line ($W_{j(1)}$) in order that the memory data is read as stated above. Then the precharged charge of the bit line ($B_i$) 18a is caused to flow into the ground electric potential via the newly provided selective transistor and the retrieval sensing line ($S_j$) 16 and consequently held low ("0"), whereby an inverted signal high ("1") is obtained from the inverter 4.

In other words, the ROM memory array of FIG. 21 is quite similar to an array in the conventional NOR-type ROM. However, regular data and inverted data are written to the 2-bit memory selected by the same word line to express one bit with these two data as a set for the purpose of high-speed data retrieval according to the present invention. In the example shown in FIG. 21, there has been employed a bit configuration method which depends on whether or not transistors are configured in the conventional form. However, any other conventional bit configuration method through contact, diffusion, injection and the like is possible. Moreover, it is not necessarily needed to make memory cells with two bits as a set adjacent to each other.

In this example, four parallel memory cells are connected to each retrieval sensing line ($S_j$, $S_{j+1}$) fixed to the ground electric potential in parallel on a bit line basis at the time memory data is read. Moreover, storage registers corresponding to the respective word lines are provided and the output of the sense amplifier is latched on a word basis, so that a large scale integrated CAM with excellent area efficiency can be produced.

A description is subsequently given of the subject matter of the present invention, that is, a technique of implementing identity retrieval of a 2- bit set of data. Referring to FIG. 21 first, a description is given of a case where 1, 0 data on the same word line in ROM having data shown in FIG. 13 are retrieved by means of a timing chart of FIG. 24.

(1) First, the retrieval sensing lines 16, 17 in this example are precharged by the pull-up transistors 2b, 3b with high ("1"). Moreover, identity retrieval data of 0 and 1 are added to data $SD_i$ and $SD_{i+1}$, respectively. Needless to say, 1 and 0 are applied to data $SD_i$ and $SD_{i+1}$ as inverted data, respectively. However, the values of the bit and bit bar lines are not restricted (see up to time $T_1$ of FIG. 24).

(2) Subsequently, the data control line (C.S.) 5 becomes high ("1") and four of the above-mentioned data $SD_i$, $\overline{SD}_i$, $SD_{i+1}$, $\overline{SD}_{i+1}$ are applied to the bit and bit bar lines, respectively. As a result, the electric potential of the bit line ($B_i$) 18a and that of the other bit line ($B_{i+1}$) 19a are fixed to low ("0") and high ("1") after a delay of $\Delta t_1$, respectively. Simultaneously, the bit bar line ($\overline{B}_i$) 18b and the bit bar line ($\overline{B}_{i+1}$) 19b of the inverted signal line become high ("1") and low ("0"), respectively. Moreover, two of the retrieval sensing lines ($S_j$) 16, ($S_{j+1}$) 17 are also caused by the precharge transistors 2b, 3b temporarily held ON to keep the precharged charge and remain high ("1") (see the section after time $T_1$ of FIG. 24).

(3) As stated above, the address decoder 20 in this state makes the word line ($W_{j(1)}$) 14, ($W_{j+1(1)}$) 15 high ("1") at time $T_2$. The operation of each set of word lines ($W_{j(1)}$) 14, ($W_{j+1(1)}$) 15 (or each of the retrieval sensing lines ($S_j$) 16, ($S_{j+1}$) 17) in this state is considered.

With respect to the memory cell 11a selected by the word line ($W_{j(1)}$) 14, both the bit bar line ($\overline{B}_i$) 18b and the retrieval sensing line ($S_j$) 16 are held high ("1") and the selective transistor 13a is held OFF. With respect to the memory cell 11b, the selective transistor 13b is also held OFF and the electric potential of the retrieval sensing line ($S_j$) 16 is not caused by the two memory cells 11a, 11b selected by the word line ($W_{j(1)}$) 14 to vary and the retrieval sensing line ($S_j$) 16 keeps high ("1"). Consequently, the electric potential of the retrieval sensing line ($S_j$) 16 that has been detected by the sense amplifier 10 results in high ("1") and this represents an identity state. This state is stored in the working register (W.R) 21 and the storage register $24_{j(1)}$ via the transistor $22_{j(1)}$ driven by a signal line $Z_1$ is held high ("1").

A description is subsequently given of the effect of the memory cells 11c, 11d selected by the other word line ($W_{j+1(1)}$) 15 on the electric potential of the retrieval sensing line ($S_{j+1}$) 17. As stated above, the selective transistor 13d is initially held OFF as both the bit line ($B_{i+1}$) 19a and the retrieval sensing line ($S_{j+1}$) 17 have high ("1") electric potential. In the case of the memory cell 11c, however, it is in a different state. In other words, the selective transistor 13c of the memory cell 11c is connected to the bit line ($B_i$) 18a fixed to low ("0") electric potential. For this reason, the selective transistor 13c is turned on and the charge of the retrieval sensing line ($S_{j+1}$) 17 precharged with high ("1") moves to the bit line ($B_i$) 18a, whereby its electric potential begins no drop.

When the electric potential of the retrieval sensing line ($S_{j+1}$) 17 drops and further becomes lower by the then threshold voltage $V'_{TH}$ of the selective transistor 13d (higher than normal $V_{TH}$ due to the substrate bias effect of N-channel MOS) than the gate voltage $V_{w1}$ applied to the word line ($W_{j+1(1)}$) 15 connected to the gate electrode of the selective transistor 13d, the selective transistor 13d is turned on and the high ("1") voltage of the bit line ($B_{j+1}$) is applied. Therefore, the electric potential of the retrieval sensing line ($S_{j+1}$) 17 ultimately settles at the value determined by resistance division due to the ON resistance of the selective transistors 13d, 13c and the like (see section after time $T_2$ of FIG. 24).

However, there is produced a d.c. (direct current) path from the bit line ($B_{i+1}$) 19a at the supply electric potential to the bit line ($B_i$) 18a at the ground electric potential then. Consequently, the electric potential of the retrieval sensing line ($S_{j+1}$) 17 has to be detected by the sense amplifier (S.A.) 10 before the voltage drops up to a electric potential ($V_{w1}-V'_{TH}$) at which the selective transistor 13d is turned on so as to remove the path. If $V_{w1}-V'_{TH}$ is set at about 2.5 V, for instance, by lowering the gate voltage $V_{w1}$ of the selective transistor 13d at the time of data retrieval, it will be easier to restrain the generation of the d.c. path resulting from the trailing of the word lines ($W_{j(1)}$, $W_{j+1(1)}$) thereafter.

In other words, the match line ($S_j$) 16 coupled to the memory cells (memory cell 11$a$=0, memory cell 11$b$=1) conforming to the retrieval data ($SD_i$=0, $SD_{i+1}$=1) maintains the initially set precharged state (high ("1")) when the word lines ($W_{j(1)}$) 14, ($W_{j+1(1)}$) 15 are see high ("1"). On the other hand, the retrieval sensing line ($S_{j+1}$) 17 coupled to the memory cells (memory cell 11$c$=1, memory cell 11$d$=1) not in conformity with the retrieval data causes a electric potential drop of $\Delta V$ from the precharged state. The sense amplifier (S.A.) 10 is used to retrieve these state of change and unchange, so that the conformity and nonconformity of the data become detected at high speed. In addition, the results can be stored in the storage registers S.R.) 24$_{j(1)}$, 24$_{j+1(1)}$ corresponding to the respective word lines ($W_{j(1)}$) 14, ($W_{j+1(1)}$) 15.

In this mode, the plurality (four in this case) of memory cells per bit line are connected to one retrieval sensing line for the purpose of large scale integration so as to form one unit block (UB1-UB4). During the data identity retrieval operation, one word line is always selected by the address decoder 20 from among these unit blocks (UB1-UB4) and simultaneous retrieval is effected over the plurality of unit blocks. Therefore, the operation has to be repeated N times or the number of 2-bit sets of memory cells constituting the unit block (UB1-UB4) (equal to the number of word lines in each unit block), that is, four times as in the example shown and the retrieval result is stored in the storage register provided for the corresponding word line and driven simultaneously with the corresponding word line. With only this arrangement, it is possible to provide a large scale integrated CAM. When there is only one 2-bit set of memory cells in one unit block (UB1 -UB4) as a special case, the data retrieval of the whole memory cell can be completed in one operation. However, no large scale integration is feasible in such a case.

As is obvious from the description given in reference to the fourth mode of the present invention, the provision of an extremely compact CAM with ROM or a nonvolatile memory as a base is thus accomplished. In this mode, identity retrieval can be carried out by one match line and one sense amplifier with the memory cells selected by the plurality of word lines as a unit. As the word lines of the respective units are driven one after another in predetermined order simultaneously on a unit basis to store the result of identity retrieval of one line of memory cells selected by the same word line in the storage register corresponding to the word line, high-speed retrieval is possible with a small number of sense amplifiers. The circuit can thus be scaled down.

Referring FIGS. 25 to 30 inclusive, semiconductor integrated circuits according to a fifth and a sixth mode of the present invention are subsequently described in detail.

In a semiconductor integrated circuit according to the fifth mode of the present invention, the source electrode side of one memory cell is connected to a common source line and formed with a pair of memories (corresponding to the storage units of the present invention) having opposite storage states, for instance, nonvolatile memories. With respect of a plurality of memory cells to be selected by different control word lines, the common source line for coupling the source electrodes of both memories is connected to a match line via a unidirectional element. With respect to the pair of memories, the drain electrode of one memory is connected to a first data line (e.g. a bit line), whereas the drain electrode of the other memory is connected to a second data line (e.g. a bit bar line). When the retrieval data supplied to the first and second data lines match the stored data in the opposite state stored in each memory, the memory connected to the first or second data line at the same electric potential as that of the match line is turned on with the electric potential of the match line left unchanged. When they disagree to each other, the memory connected to the first or second data line having a electric potential different from that of the match line is turned on. As a result, the charge is caused to move from, for instance, the match line to the data line (pulling out) and the electric potential of the match line changes, that is, drops. The sense amplifier is then used to detect the change of the electric potential of the match line so as to carry out identity retrieval of retrieval data and data what have been stored in the memory cells.

At this time, the plurality memory cells in a row are selected by the same control word line and even though the electric potential of the match line is caused to change (drop) because of the inequality memory cell as a mixture of the memory cell matching the retrieval data and the inequality memory cell exists in the memory cells, the charge is not caused to move (charge) from, for instance, the data line to the match line as the unidirectional element is held between the match line and the common source line. Consequently, different data lines are prevented from electrically interfering with each other.

In this case, the threshold voltage of the unidirectional element for use is set higher than that of the peripheral element to keep the voltage applied between the source electrode and the drain electrode of the storage area at a predetermined level without providing an external low voltage supply and a step-down circuit. As a result, an ordinary power supply, for instance, 5-V power supply may be used to raise the charge of the whole semiconductor integrated circuit (chip) and to prevent software write in the storage area.

In a semiconductor integrated circuit according to the sixth mode of the present invention, the common source line in the semiconductor integrated circuit of the fifth mode is connected to one match line via a transistor as a control element and a electric potential fixing means is connected to the match line. The electric potential fixing means is used to ground the match line accordingly when data is read as usual and the data stored in the memory cell is made readable by rendering the connection means nonactive and setting the gate of the transistor in the control element to a high electric potential so as to turn it on. On the other hand, the pull-up transistor is used to precharge the match line at the time of identity retrieval and the connection means is used to connect the match line and the gate of the transistor as the control element so as to make the combination function as a unidirectional element. The memory cells are thus restrained from interfering with each other to make identity retrieval possible. In this way, the number of elements to be connected to the plurality of common source lines in the semiconductor integrated circuit according to the present invention is decreased. In addition a layout area is also reducible.

In the semiconductor integrated circuits according to anyone of the aspects and embodiments of the present invention, the above-stated characteristics are utilized for the data retrieval of many memory cells at a time without mutual interference. Therefore, the data retrieval of a large capacity memory with many memory cells arranged in the form of an array can be made at extremely high speed.

Referring to preferred modes illustrated in the accompanying drawings, specific semiconductor integrated circuits according to the fifth and sixth mode of the present invention are subsequently described in detail.

Figure 25:
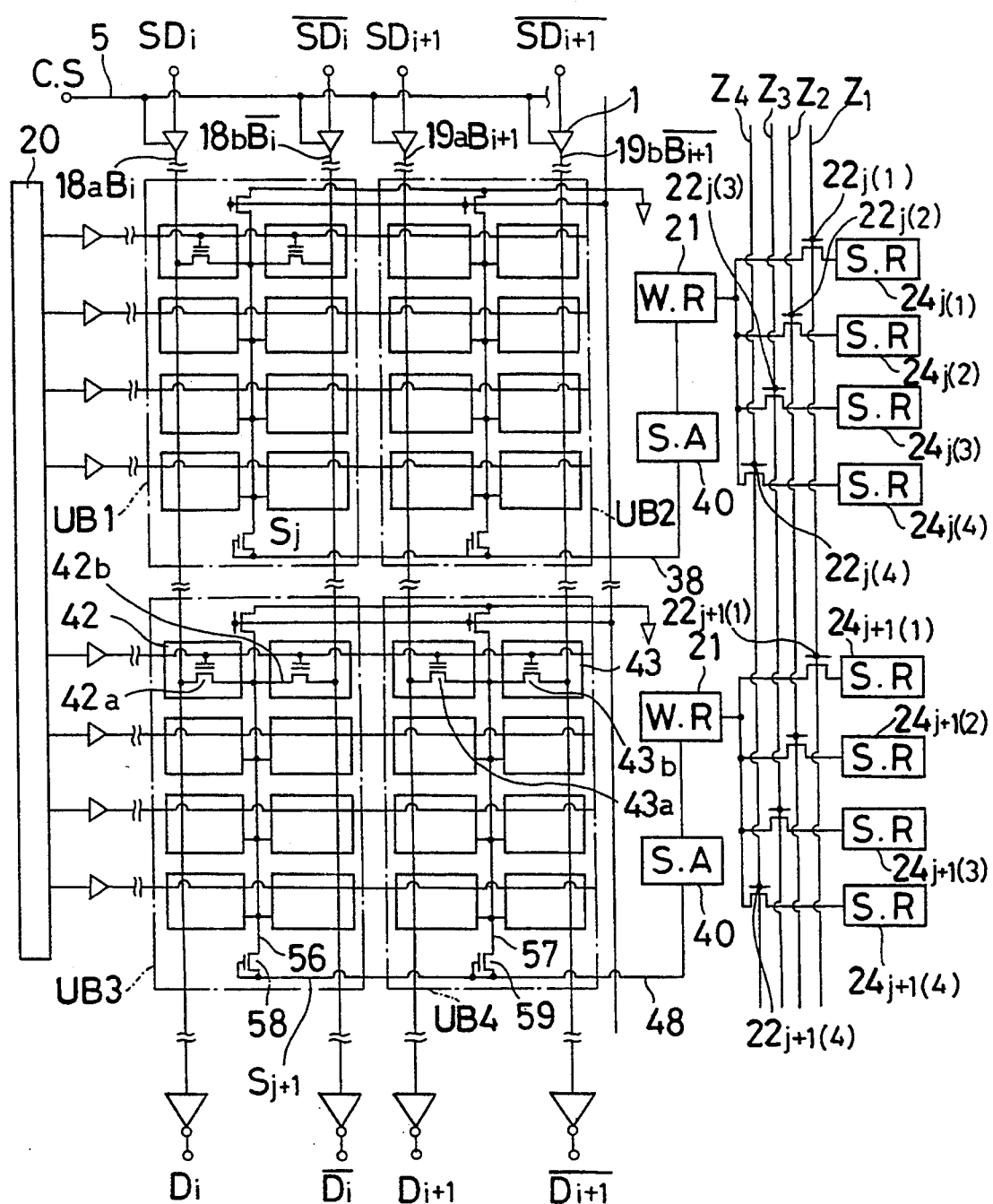
FIG. 25 is a diagram of a NOR-type memory array in other embodiment of the semiconductor integrated circuit according to the present invention.

FIG. 25 is a circuit diagram of a NOR-type memory array (CAROM array) in the semiconductor integrated circuit according to the fifth mode of the fourth aspect of the present invention.

Referring to FIG. 25, a description is subsequently given of an exemplary novel arrangement with respect to a technique of controlling the generation of the above-mentioned d.c. path.

The semiconductor integrated circuit shown in FIG. 25 according to the fifth mode of the present invention is a CAM memory allowing high-speed retrieval and free from the electric potential interference between the memory cells selected by the same word line even when a nonvolatile memory, particularly a stack flash EEPROM whose threshold voltage varies in a wide range is applied to the memory cell. The semiconductor integrated circuit shown in FIG. 25 is substantially similar in configuration to the semiconductor integrated circuit of FIG. 21 in the form of CAM with NOR-type ROM as a base, excluding the configuration of the memory cell and its connection to the match line, wherein like reference characters designate like or corresponding component parts, and the detailed description of them will be omitted.

Before a detailed description is given of the fifth mode, a study is made of problems arising from the application of the nonvolatile memory cell whose threshold voltage varies in a wide range to a large scale integrated CAM in order to clarify the essential point of the present invention.

Figure 31:
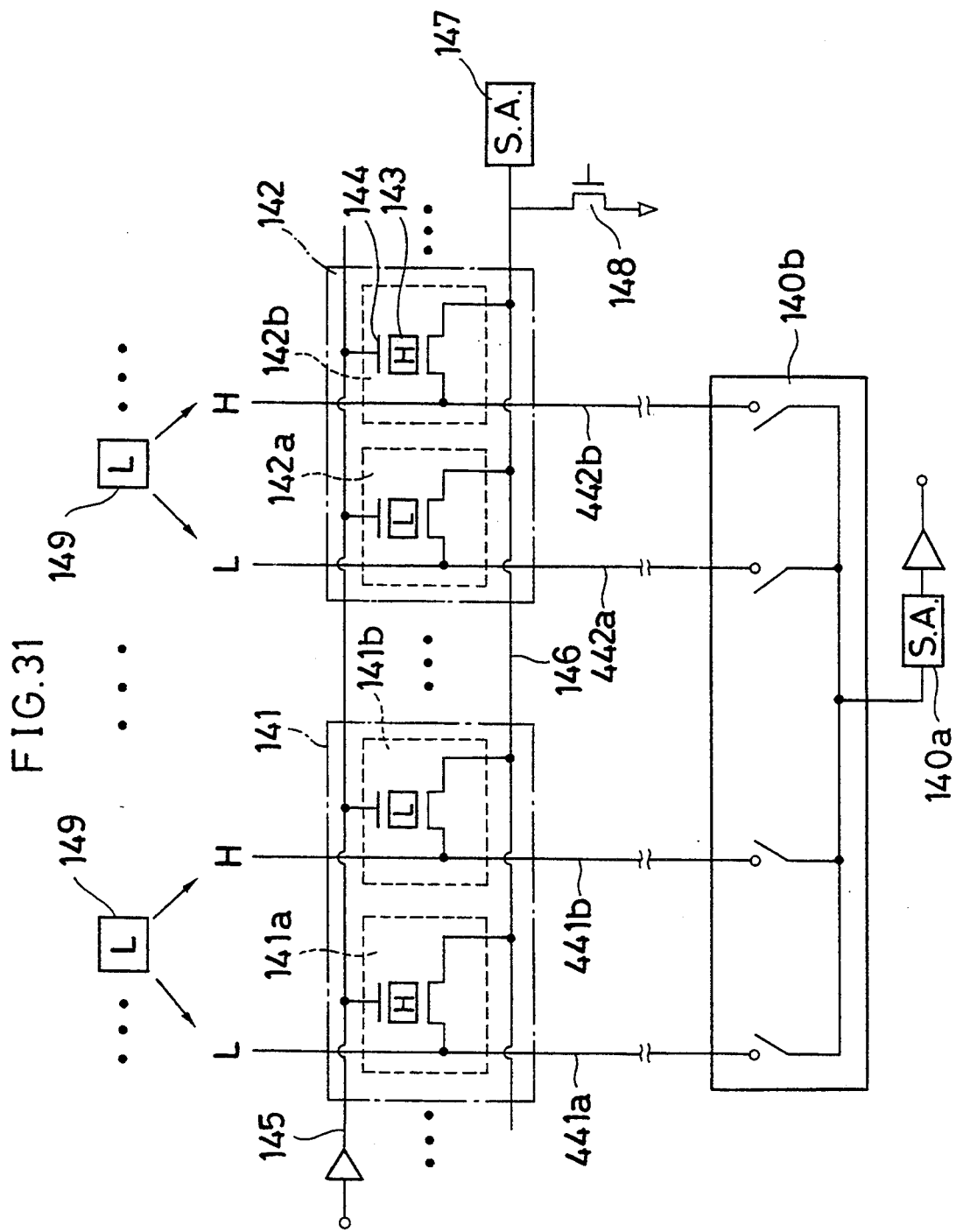
FIG. 31 is a circuit diagram of CAM using EEPROM.

FIG. 31 shows the structure of a flash EEPROM memory as a newly considered 2-bit CAM.

As shown in FIG. 31, a memory pair 141 comprising a set of memory cells 141a, 141b forms one CAM cell, so does a memory pair 142 comprising a set of memory cells 142a, 142b. In this case, a selection circuit 140b and a sense amplifier 140a provided ahead of data lines 441a, 441b, 442a, 442b are used to read data from each memory cell.

Incidentally, what is referred to in this example is known as a stack cell construction in which a control gate 144 is directly stacked on a floating gate 143 for accumulating electric charge and this structure is fit for large scale integration.

Figure 28:
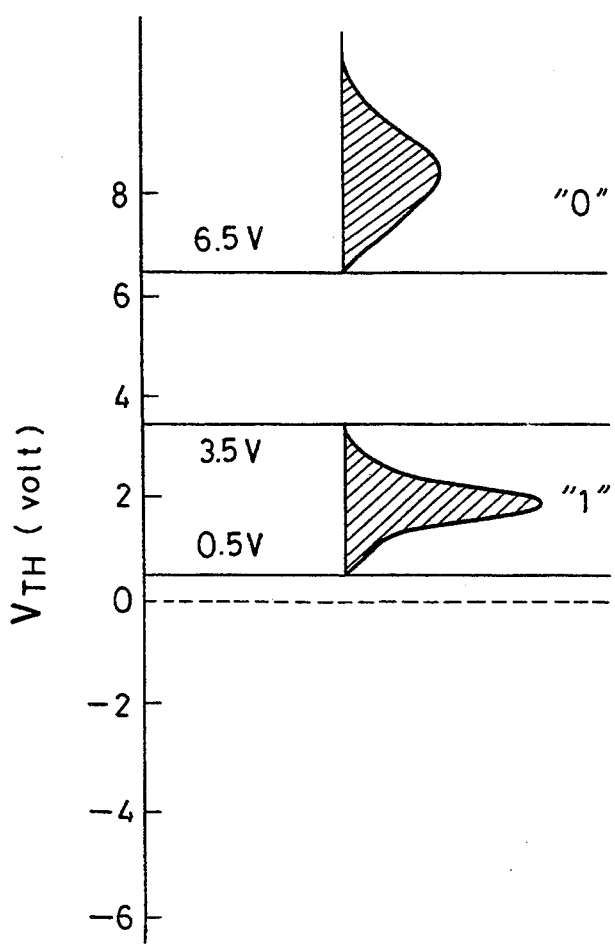
FIG. 28 is a graph showing variations of the threshold voltage $V_{TH}$ of EEPROM of FIG. 27.
Figure 29:
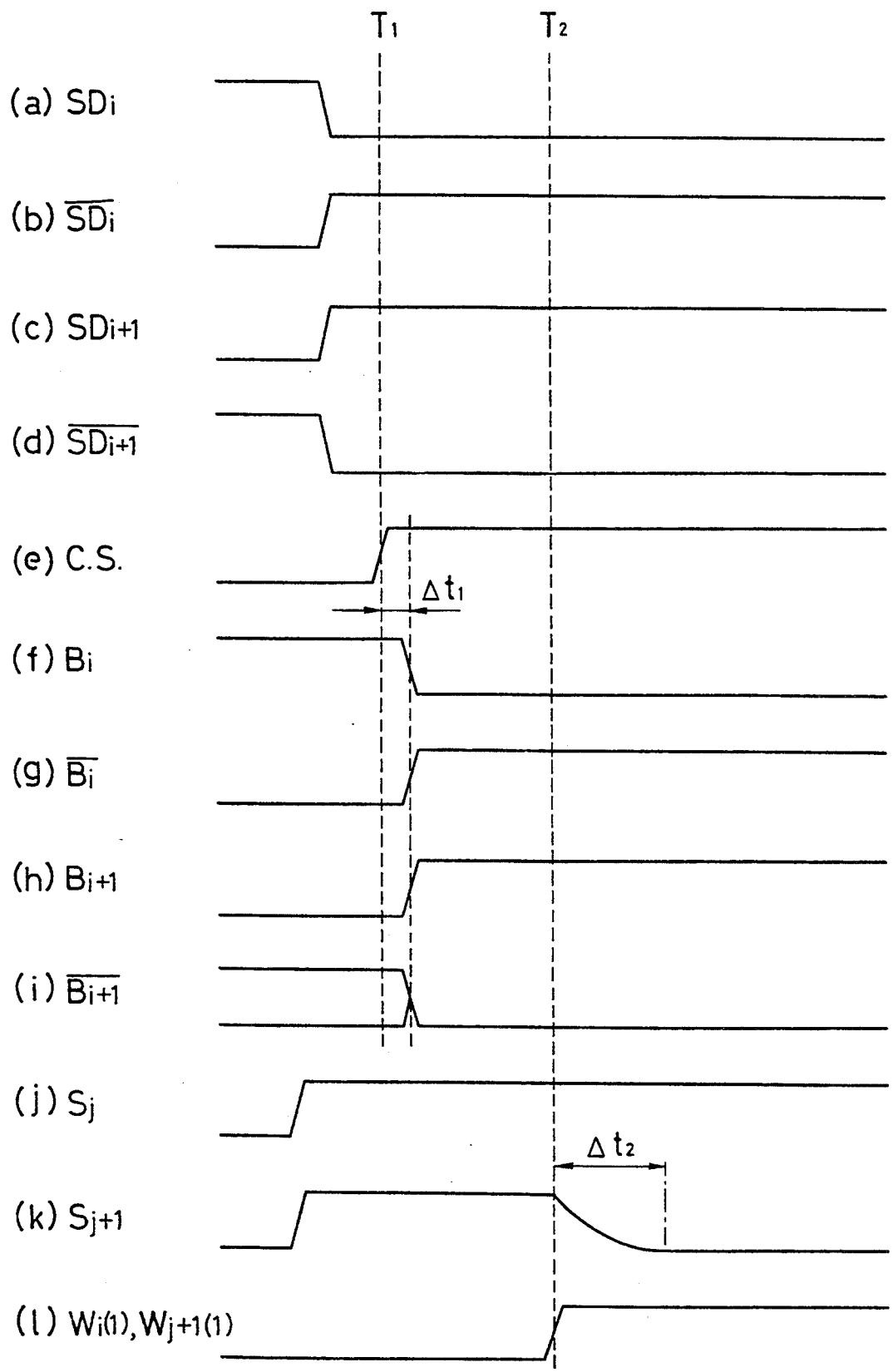
FIG. 29 is an exemplary timing chart showing data retrieval timing of the memory array of FIG. 25.

FIG. 28 shows variations of threshold voltage $V_t$, depending on the state in which the charge is accumulated in the floating gate 143 of each memory cell.

The low threshold voltage $V_t(L)$ of an ordinary stack memory cell substantially ranges from 0.5 to 3.5 V and has a variation of about 3 V. It is said to be extremely difficult in view of not only the structure but also the process of manufacture to reduce the variation further.

Nevertheless, the above-mentioned variation tends to become fatal in the case of the CAM configuration. As one of the points at issue, a description will be given of the fact further.

Electrons are injected into the floating gate 143 of the memory cell 141a. High threshold voltage $V_t$ (H) is defined as data ("0") L (low). The inverted low threshold voltage $V_t$ (L) is defined as ("1") H (high) for the memory cell 141b. The low threshold voltage $V_t$(L) is defined for the memory cell 142a, whereas the high threshold voltage $V_t$(H) is defined for the memory cell 142b. In other words, the ("0") L (low) data is defined for the CAM cell comprising the memory pair 141, whereas ("1") H (high) data is defined for CAM comprising the memory pair 142.

In this state, a case is considered where data "0" L (low), "0" L (low) of identity retrieval data 149 match each CAM cell.

First, a grounding transistor 148 is held OFF and an identity retrieval sense amplifier 147 is made active. This identity retrieval sense amplifier 147 is of a current drive type and has self-drive capability. Therefore, the electric potential of a match line 146 is set at about 1.5–2.0 V. The set electric potential is desired to be small enough in value not to affect the accumulated charge of the floating gate 143 and what is not greater than 2 V is considered to be generally essential.

With respect to the operation of CAM, the charge of the match line which is precharged with high electric potential is discharged by "0" L (low) of the data line of the inequality CAM cell and changes to low electric potential. The inequality match line causing the change represents inequality, whereas what maintains without the change represents identity.

In this example, data "1" H (high) of CAM cell of the memory pair 142 differs from retrieval data "0" L (low) and the match line 146 is discharged by the data line 442a "0" L (low) and caused to have low electric potential.

With respect to specific retrieval operation, 0 V of "0" L (low) electric potential of the identity retrieval data applied to the data line 441a, whereas 1.5–2.0 V of opposite "1" H (high) electric potential is applied to the data line 441b. Similarly, 0 V of "0" L (low) electric potential of the identity retrieval data is applied to the data line 442a, whereas 1.5–2.0 V of opposite "1" H (high) electric potential is applied to the data line 442b. For the reason stated above, the electric potential at the high state is also set as low as 1.5–2.0 V at this time.

When a selective word line 145 becomes active in that state, the memory cells 141a, 142b whose threshold voltage $V_t$ is $V_t$ (H) (>6.5 V: see FIG. 28) are held OFF. However, the memory cells 141b and 142a operate in a different way.

First, attention is directed to the memory cell 142a. The memory cell 142a has to be turned on to have inequality detected by pulling out the charge of the match line 146. However, the threshold voltage $V_t$ of this transistor ranges 0.5 to 3.5 V in value (see FIG. 28). Moreover, on the source electrode side is the data line 442b and 0 V has been applied thereto. Therefore, the voltage $V_w$ of the selective word line 145 has to be not lower than 3.5 V and normally about 4.5 V, which is higher by about 1 V than the former and this value is considered appropriate.

In other words, the electric potential of the match line 146 is caused by the 0 V electric potential of the data line 442 to fall only when the voltage of the selective word line 145 is set at $V_w \geq 4.5$ V. On the other hand, the identity retrieval sense amplifier 147 is of a current drive type and has drive capability. Consequently, the electric potential of the match line 146 ultimately drops to about 1.0–1.5 V and a voltage drop of about 0.5 V allows inequality to be detected.

Although the voltage drop is used to detect the inequality, the memory cell 141b of the CAM cell stored with the identity data becomes inconveniently situated.

When the electric potential of the three (drain, gate, source) electrodes of the memory cell 141b is taken into consideration, the gate complies with not lower than 4.5 V of the selective word line 145, the source with 1.0–1.5 V as the electric potential of the match line 146 and the drain with 1.5–2.0 V of the data line. In other words, the electric potential difference $V_{GS}$ between the gate and source of the transistor exceeds 3.0–3.5 (4.5−(1.0–1.5)) V.

Incidentally, the threshold voltage $V_t$ of the memory cell 141b is 0.5 V at the lowest (see FIG. 28), that is, $$V_{GS}(=3.0-3.5) > V_t(=0.5)$$

Even when a rise in the threshold voltage of the memory cell 141b due to the then substrate bias effect is taken into consideration, the memory cell 141b whose threshold voltage widely varies like 0.5–3.5 V is inevitably turned on. Consequently, a through current is caused to flow from the high electric potential of the data line 441b to the low electric potential of the data line 442a.

In the case of the associative memory, the identity retrieval operation is generally performed over the plurality of selective word lines. Therefore, the through current on each selective word line adds up to a great value in the whole chip and this poses a serious problem resulting in device inoperable.

The high electric potential of the data line 441b also raises the electric potential of the data match line 146 and a problem arising from this fact may make difficult the detection of electric potential difference by means of the identity retrieval sense amplifier 147.

Referring to the accompanying drawings, a detailed description is subsequently given of the semiconductor integrated circuit according to the present invention from the above point of view.

Figure 26:
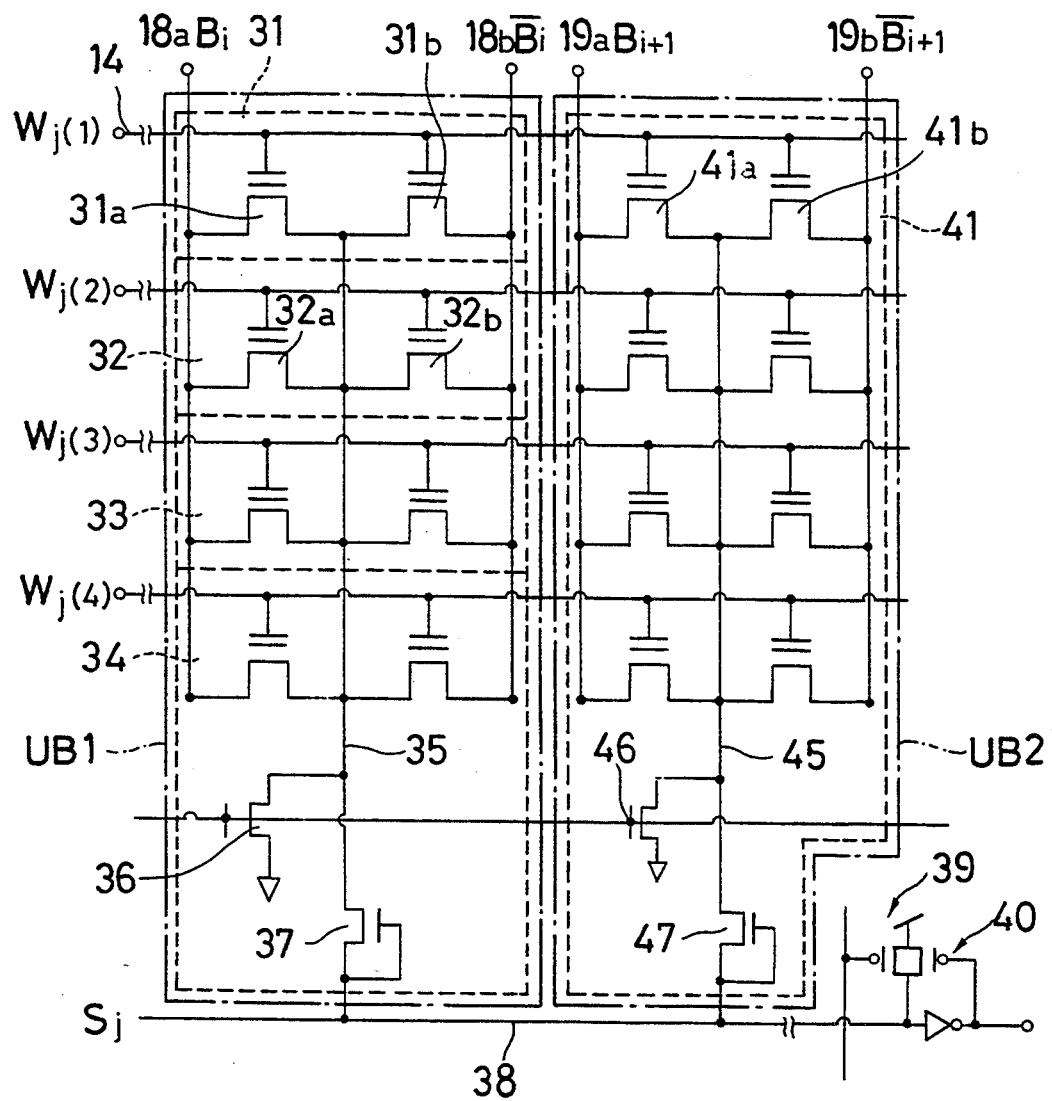
FIG. 26 is a partial enlarged circuit diagram of the memory array of FIG. 25.
Figure 27:
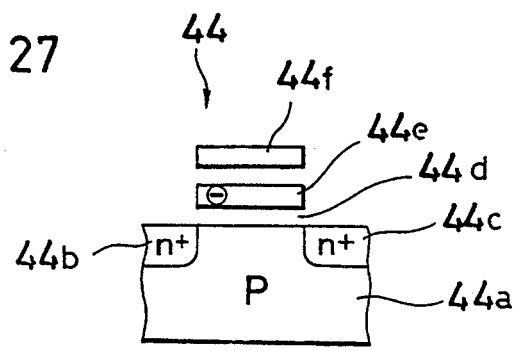
FIG. 27 is a structural sectional view of EEPROM for use in the memory cell of the memory array of FIG. 26.

In the CAM memory shown in FIG. 25, four sets of 2-bit memory cells as component units of CAM constitute one unit block. A unit block UB1 comprises, as shown in FIG. 26, memory cells 31, 32, 33, 34 and the memory cell 31 comprises, for instance, stack flash EEPROM cells 31a, 31b to which data are written always in directly-opposite storage conditions. In this case, 0 is to be written to the EEPROM cell 31a, whereas 1 is to be written to the EEPROM cell 31b. As shown in FIG. 27, for instance, EEPROM 44 is prepared by forming n-sources 44b, n-drains 44c on a P-substrate 44a, a tunnel oxide film 44d between the source and drain on the P-substrate 44a, a floating gate 44e thereon and a control gate 44f further thereon. "0" or "1" can be written thereto by injecting hot electrons into the floating gate 44e to raise the threshold voltage $V_{TH}$ up to over 5 V and erased by pulling the electrons out of the floating gate toward the side of the source 44b or the drain 44c. As shown in FIG. 28, "0" and "1" are written at not lower than $V_{TH}$ 6.5 V and 0.5–3.5 V, respectively.

In the memory cell 31, the drain of the EEPROM cell 31a is connected to a bit line (Bi) 18a, the drain of the EEPROM cell 31b to a bit bar line (B̄i) 18b and the sources of both cells 31a, 31b to a common source line 35. As for the memory cells 32, 33, 34, the entirely same arrangement as stated above excluding the contents of data is employed for the respective EEPROMs as components. A grounding transistor 36 is connected to the common source line 35 so that electric potential can be fixed to the ground electric potential. A unidirectional element 37 which functions as a selective transistor is connected to one end of the common source line 35 and further connected via the unidirectional element 37 to a match line 38. The unit block UB1 is thus configured. Moreover, a sense amplifier 40 including a precharge transistor 39 is connected to one end of the match line 38.

Like the unit block UB1, each of the unit blocks UB2, UB3, UB4 comprises four sets of memory cells including two EEPROM cells, a bit line, a bit bar line, a common source line, a grounding transistor and a unidirectional element.

In the example shown in FIG. 26, the memory cells 31, 41 can be regarded as equivalent to the memory cells 11a, 11b on condition that 0 is written to the ($V_{TH} \geq 6.5$ V) EEPROM cell 31a on the side of the bit line (Bi) 18a of the memory cell 40 of the unit block UB1; 1 is written to the ($V_{TH}=0.5-3.5$ V) EEPROM cell 31b on the side of the bit bar line (B̄i) 18b thereof; 1 is written to the ($V_{TH}=0.5-3.5$ V) EEPROM cell 41a on the side of the bit line (Bi+1) 19a of the memory cell 41 of the unit block UB2 to be selected by the same word line (Wj(1)); and 0 is written to the ($V_{TH} \geq 6.5$ V) EEPROM cell 41b on the side of the bit bar line (B̄i+1) 19b thereof. More specifically, if the word line (Wj(1)) 14 is driven to apply 5 V, for instance, EEPROMs 31a, 41b are not turned on as the threshold voltage $V_{TH}$ of the cells 31b, 41a is higher than the voltage applied to the word line even though the threshold voltage $V_{TH}$ varies (see FIG. 28) but EEPROMs 31b, 41a are turned on as the threshold voltage $V_{TH}$ of the cells 31b, 41a is lower than the voltage applied to the word line even though the threshold voltage $V_{TH}$ varies (see FIG. 28) to make the bit bar line 18b, the bit line 19a and the common source lines 35, 45 conduct, respectively. Moreover, EEPROMs 31b, 41a, whose electric potential is fixed by the respective grounding transistors 36, 46 to the ground electric potential at time of reading and the match line are made to conduct via the respective unidirectional elements 37, 47 at the time of identity retrieval.

At the time of reading, the bit line 18a is held high "1" and the bit line 19a is held low "0," and they are inverted by the inverters 4 to low "0" and "1," respectively. Therefore, 0 when it has been written to the memory cell 31 and 1 when written to the memory cell 41 can be read.

Provided identity retrieval data are 0, 1, on the other hand, the bit lines 18a, 19a are vested with a 0, 1 condition, whereas the bit bar lines 18b, 19b are vested with a 1, 0 condition. The threshold voltage $V_{TH}$ of the EEPROM cells 31a, 41b is not lower than 6.5 V at this time and the word line $W_{j(1)}$ 14 is supplied with 5 V and so that EEPROM cells 31a, 41b are held OFF. With respect to the EEPROM cells 31b, 41a, though their threshold voltage $V_{TH}$ shows low values 0.5–3.5 V, any of the bit bar line 18b and the bit line 19a equivalent to the drain or source electrode of the cell, or the common source line 35 and 45 has been charged up to "1 (high)" and even if they are held ON, will not discharge the precharged charge of the match line 38 connected to the source line 35 and 45. In other words, the match line 38 is free from electric potential variation and identity data is detected.

However, the result stated above is different when the word line $W_{j+1(1)}$ is driven at 5 V and when it is assumed that 1, 0, 1, 0 have sequentially been written to the respective EEPROM cells 42a, 42b, 43a, 43b of the memory cells 42, 43 selected by the word line $W_{j+1(1)}$ from the side of the bit line 18a.

The EEPROM cells 42b, 43b whose threshold voltage $V_{TH}$ is not lower than 6.5 V is held OFF. Even when the EEPROM cell 43a whose threshold voltage $V_{TH}$ is as low as 0.5–3.5 V is turned on, it will not discharge the precharged charge of the match line 48 connected to the common source line 57 as the bit line 19a or the common source line 57 equivalent to its drain or source electrode has been precharged with "1 (high)."

However, the EEPROM cell 42a whose threshold voltage $V_{TH}$ is as low as 0.5–3.5 V is held ON as the bit line 18a to be its drain electrode remains at "0 (low)" and precharged up to the common source line 56, so that the charge in the "1 (high)" state is pulled out. Moreover, the unidirectional element 58 is turned to the forward direction and the charge precharged to the match line 48 is also pulled out by the bit line 18a via the EEPROM cell 42a. The unidirectional element 58 is set to "0 (low)," that is, data inequality is detected.

On the other hand, the common source line 57 held "1 (high)" and the match line 48 held "0 (low)" are electrically separated and remain mutually unaffected as the unidirectional element 59 is inversely biased.

In other words, the memory cells stored with different contents are prevented from interfering with each other since they are not directly connected to the match line but connected via the unidirectional element. Although the memory cell includes a set of two EEPROH cells stored with directly-opposed contents, it is capable of selecting word voltage (e.g., 5 V) , however extensively the threshold voltage $V_{TH}$ of the cell varies as shown in FIG. 28. Moreover, the selection of such word voltage causes no electric potential collision resulting from different data electric potential applied to the bin line and the bit bar line within the memory cells at the time of identity retrieval.

The voltage that can be applied between the source and the drain of EEPROM constituting the memory cell of CAROM according to the present invention is restricted to about 1.5 –2.0 V in view of software write prevention. It is therefore necessary to ensure that the voltage applicable between the common source line and the bit or bit bar line substantially ranges from 1.5 to 2.0 V. Since the threshold voltage of the unidirectional element between the match line and the common source line is about 1 V in this example, the common source line will be charged with about 3.6 V if a 5-V power supply is used for precharging it. For this reason, the supply voltage of the precharge transistor 39 has to be set lower than 5 V by means of a step-down circuit or otherwise an external lower- voltage power supply is needed to precharge the common source lines 35, 45 with a electric potential difference of about 1.5–2.0 V. Notwithstanding, the used of such a step-down circuit makes it hard to secure a large current. The provision of the external power supply also results in supplying an additional external terminal, thus increasing cost.

In the preferred mode of the present invention, the unidirectional elements 37, 47, 58, 59 whose threshold voltage $V_{TH}$ is higher than that of any peripheral element, for instance, 3 V when power supply voltage $V_{dd}$ is 5 V are employed, whereby the step-down circuit and the external low-voltage power supply can be dispensed with.

Figure 30:
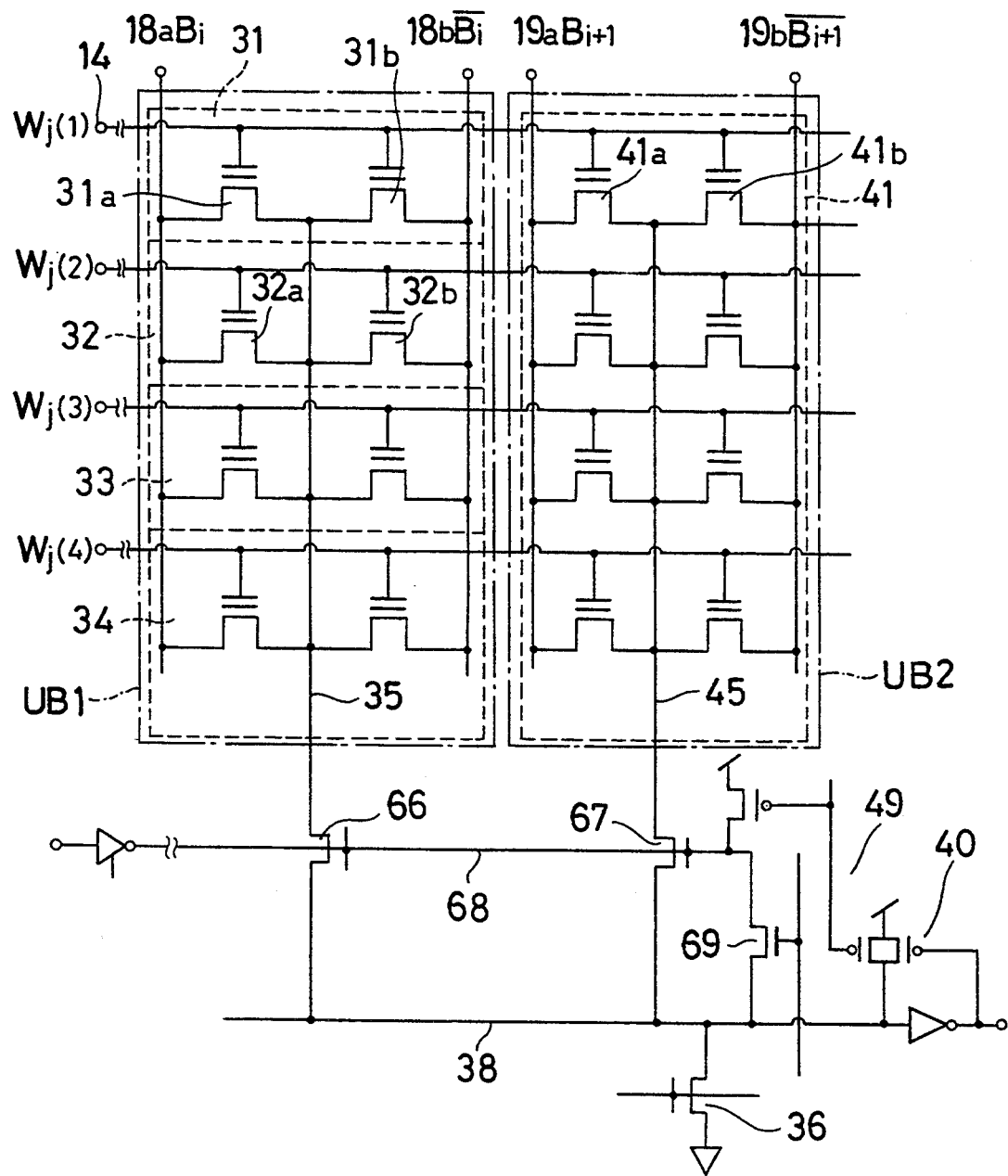
FIG. 30 is a structural diagram of a memory array in other embodiment of the semiconductor integrated circuit according to the present invention.

FIG. 30 shows a semiconductor integrated circuit according to a sixth mode of the present invention. The CAM memory shown in FIG. 30 is substantially similar in configuration to what is shown in FIG. 26, excluding the grounding transistor, the unidirectional element, the match line and the sense amplifier, wherein like reference characters designate like or corresponding component parts, and the detailed description of them will be omitted.

The CAM memory shown in FIG. 30 is different from what is shown in FIG. 26 in that: the common source lines 35, 45 are connected via transistors 66, 67 which function as a selective transistor to the match line 38; the gate electrodes of the transistors 66, 67 which function as a selective transistor are connected to a word line 68; the word line 68 is connected via a electric potential-equalizing transistor 69 to the match line 38; and one grounding transistor 36 and the sense amplifier 40 are connected to the match line 38. The CAM memory in this mode needs only one grounding transistor per match line instead of two of the grounding transistor and the unidirectional element per common source line in the CAM memory shown in FIG. 26. As a result, a layout area can be reduced as the number of necessary elements is decreased.

In this mode, the grounding transistor 36 is turned on at the time of reading to make the electric potential of the match line 38 the ground electric potential and the electric potential-equalizing transistor 69 is opened to set high the gates electrodes of the transistors 66, 67 so as to turn them on, whereby the common source lines 35, 45 and the match line 38 at the ground electric potential can be made to conduct. On the contrary, the match line is precharged by a precharge transistor 49 at the time of identity retrieval to turn on the electric potential- equalizing transistor 69 and to set it floating- high. Since the electric potential of the word line 68 also drops accordingly even though the charge of the match line 38 is discharged (pulled out) from the common source line 35 or 45 through the inequality memory cell, the word line is made to act as a unidirectional element by restraining the electric potential difference from exceeding the threshold voltage $V_{TH}$ of the transistors 66, 67 or by minimizing the period during which the electric potential difference exceed the $V_{TH}$. The through current between the bit lines or between the bit bar lines or between the bit line and the bit bar line or between the bit line and the bit bar line can thus be prevented.

If the threshold voltage $V_{TH}$ of the transistors 66, 67 is made higher (e.g., by about 3 V) than that on the circumference as in the case of the fifth mode, low-electric potential precharging by means of the 5-V power supply will be made possible.

As is obvious from the foregoing description, high-speed data retrieval can be implemented with accuracy in the fifth mode of the present invention even with the application of the nonvolatile memory such as EPROM and EEPROM ($E^2$PROM). Moreover, software write can be avoided and besides the data lines (bit and bit bar lines) are prevented from developing electrical mutual interference. When the unidirectional element used in this mode is what has a high threshold voltage, the charge-up of the whole can be covered by an ordinary, for instance, 5-V power supply without using an external low-voltage power supply and a step-down circuit. In addition, software write is also avoided.

In the sixth mode, the effect of the fifth mode can be attained with a smaller number of elements and the layout area can also be decreased.

According to the present invention, it is possible to provide a semiconductor integrated circuit free from retrieval mutual interference of the plurality of memory cells and high-speed retrievable without deteriorating the features of integrated ROM that has long been used as a database ROM. Moreover, what is based on the nonvolatile memory is capable of reloading data and besides CAM extremely higher in integration than the conventional SRAM can be configured.

The foregoing advantages are industrially very useful and can be developed into dominant technology for database processing expected to become more and more important in the age of large capacity database to come.

Although a description has been given of CAM memories according to the first and second aspects with NOR-type ROM as a base in the first to fourth modes of the present invention, ROM is capable of reloading data only once. Therefore, as stale above it may be applied to the nonvolatile memory. For instance, a MONOS nonvolatile memory may be used. As any known MONOS memory is usable, a detailed description will be omitted. Switching characteristics may be made variable by injecting electrons into a memory gate to increase the gate threshold value in order to form an enhancement type MOS or discharging electrons to form a depression type MOS. Moreover, the EEPROM used in the fifth to sixth modes of the present invention and other EPROMs, UVEPROMs and the like may needless to say be usable. The features of the CAM memory according to the third and fourth aspects of the present invention formed with them include making possible the reloading of data and its application to databases and the like is quite promising due to the fact that not only data reloading but also high-speed retrieval of optional data is possible.

Even in the fifth to sixth modes of the present invention, other EPROMs such as UVEPROM whose $V_{TH}$ is stable at about 1 V and other nonvolatile memories such as a MONOS nonvolatile memory may also be applicable. The application of them in these modes is most preferred when use is made of a nonvolatile memory whose threshold voltage varies.

Moreover, use may also be made of memories with two bits as a set or those which have a high degree of freedom in that some of them have one memory cell with two bits as a set and the remainder has one memory cell with one bit. Although NOR-type ROH has been used as a base in the first to six modes, the application of NAND-type ROM, as will be described later, is also possible in each mode or aspect of the present invention.

In the second to sixth modes of the present invention, only one match line is provided to correspond to a plurality of the control word lines. The present invention, however, is not limited to this particular case and the circuit configurations having preventing means for preventing the through current between data lines in the CAM memory configurations of the third to sixth modes described above and the seventh mode described after shown in FIGS. 19 to 36 are applicable to the first and third aspects of the present invention by considering only one control word line in the control word lines and omitting other control word lines.

Referring to the seventh mode shown in FIGS. 32 to 36 inclusive, a detailed description of a semiconductor integrated circuit according to a fifth aspect of the present invention.

in the seventh mode of the present invention, each unidirectional element provided at one outermost end of each transistor chain can be used to intercept the current flowing from each data line connected to the outermost of the other end of each transistor chain to the match line, whereby short-circuiting between different potential data lines via a common match line of each transistor chain selected by the same word line can be restrained.

Moreover, the transistor formed with a nonvolatile transistor allows the contents of data to be freely reloaded.

Further, the retrieval (or control) word line provided for each memory transistor is sued commonly for each transistor chain to have storage (or holding means) means sequentially selectively hold the result retrieved by the retrieval word line. A large scale integrated CAM thus can be configured.

In addition, the threshold voltage value of the unidirectional element is set higher than that on its periphery to facilitate the formation of the nonvolatile memory.

In another embodiment, a means for connecting the control element to the gate electrode and the drain electrode (on the match line side) is used to actualize the function of the unidirectional element with the least number of elements.

Moreover, the contents of data are made freely reloadable by replacing the transistor of the transistor chain for storing the date with a nonvolatile transistor.

Further, each transistor chain is commonly used for the retrieval word lines of the respective memory transistors and the results of the retrieval word lines are sequentially selectively stored in storage means. In this way, a large scale integrated CAM is configured.

By setting the threshold voltage of the unidirectional element higher than that of its periphery, the electrical interference at the time of identity retrieval (short-circuiting between different potential data lines) is efficiently suppressed and the formation of the nonvolatile memory is facilitated.

Figure 32:
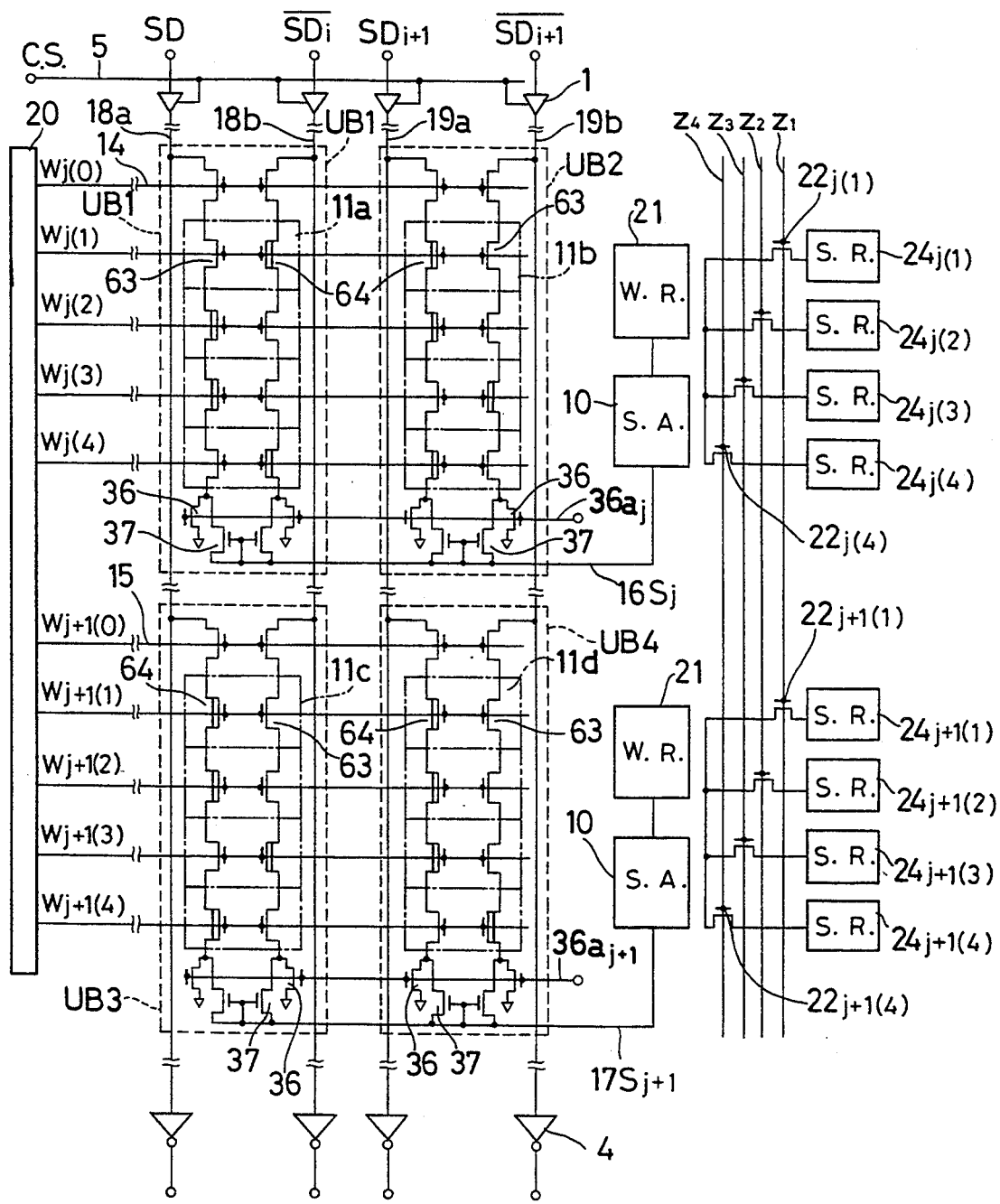
FIG. 32 is a circuit diagram of a NAND-type memory cell array in other embodiment of the semiconductor integrated circuit according to the present invention.

FIG. 32 shows a semiconductor integrated circuit according to the seventh mode of the present invention. A memory cell of FIG. 32 is an exemplary CAROM (Content Addressable Read Only Memory) in the form of NAND-type ROM.

For the purpose of simplification, a case is considered where five transistors connected in series constitute a transistor chain. Either one of the memory block UB1 (unit block 1) of FIG. 32 is equivalent to this chain. A description is given of the left-hand chain as a representative one.

The uppermost end of the transistor chain is connected to the data line 18a and one end of the first transistor is connected to the data line 18a. The first transistor is a chain control transistor for controlling whether or not the whole transistor chain is connected to the data line 18a and in this example, an enhancement transistor may be appropriated for the purpose. However, the transistor of this type is not restricted to this example and it is not necessarily one but may comprise more than one series transistors with an enhancement and a depression type in combination having a decode function.

In this case, four transistors are connected in series; namely, an enhancement transistor 63, a depression transistor 64, a depression transistor 64 and an enhancement transistor 63 in vertical order. Each of the transistors exhibits a peculiar storage condition, depending on the type. In this case, the enhancement transistor 63 is defined as "0" (L: low), whereas the depression transistor 64 as "1" (H: high).

The grounding transistor 36 and the unidirectional element 37 corresponding to the selective transistor are further connected in parallel thereunder. The unidirectional element 37 connects the gate electrode of the enhancement transistors to the drain electrode side (match line 16 side) to obtain unidirectional characteristics from the drain electrode side to the source electrode side. Ahead of them the match line $(S_j)$ 16, a sense amplifier (S.A.) 10, lies a working register (W.R.) 21, selective transistors $22_{j(1)}$, $22_{j(2)}$, $22_{j(3)}$, $22_{j(4)}$ and the storage register (S.R.) $24_{j(1)}$, $24_{j(2)}$, $24_{j(3)}$, $24_{j(4)}$.

On the other hand, the other (right-hand side) of the chain of the memory block UB1, though similar in configuration, store contents entirely opposite to those stored on the left-hand side. More specifically, the transistors selected by the respective four word lines $W_{j(1)}$, $W_{j(2)}$, $W_{j(3)}$, $W_{j(4)}$ are divided into those of the enhancement type and opposed depression one. This is one of the most important points in the present invention. As shown in FIG. 32, the same configuration has been employed in all of the memory unit blocks UB1, UB2, UB3, UB4.

FIG. 13 shows the state in which data has been stored as shown in FIG. 32. For instance, the second enhancement transistor 63 of the left-hand side transistor chain of the memory unit block UB1 controlled by the word line $W_{j(1)}$ of FIG. 13 expresses "0" (L: low) and the second depression transistor 64 of the right-hand side transistor chain expresses "1" (H: high). The CAM memory cell 11a with these two bits as a set expresses "0" (L: low). These are respectively expressed in the CAM memory cell 11a on the left-hand side of FIG. 13. Other CAM memories are similar to what has been picked up above.

Subsequently, an example of data retrieval operation according to the present invention will be described. First, all of the grounding transistors 36 are made nonactive by control lines $36_{aj}$, $36_{aj+1}$. Then the match lines $(S_j)$ 16, $(S_{j+1})$ 17 are precharged. At this time, the word lines $W_{j(0)}$, $W_{j+1(0)}$ still remain "0" (L: low). The other word lines $W_{j(1)}$, $W_{j(2)}$, $W_{j(3)}$, $W_{j(4)}$ and $W_{j+1}$, $W_{j+1(2)}$, $W_{j+1(3)}$, $W_{j+1(4)}$, though not restricted to theses, are totally held "1" (H: high).

Figure 33:
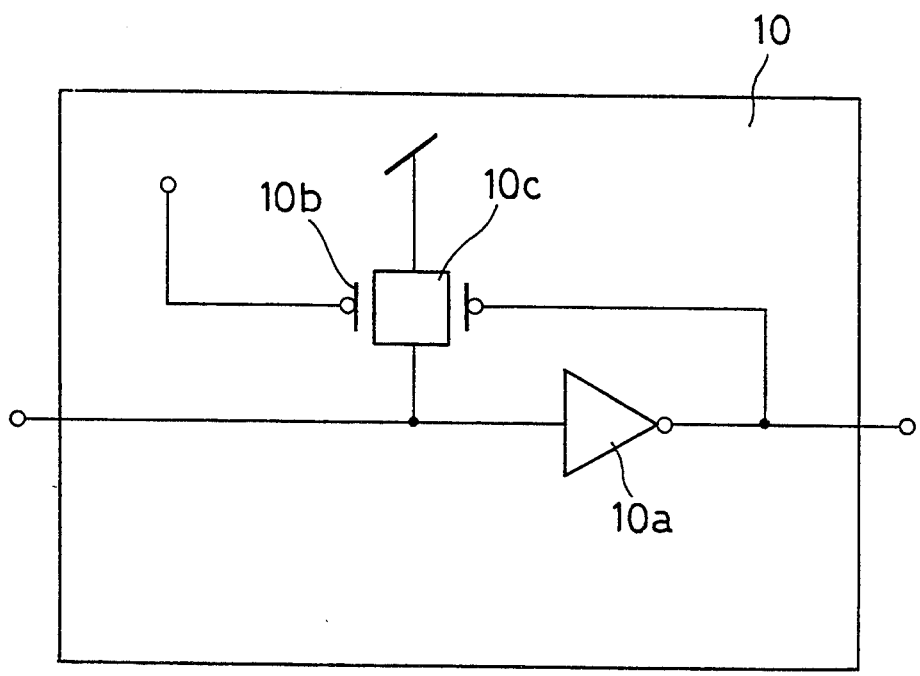
FIG. 33 is a circuit diagram showing an exemplary configuration of the sense amplifier of FIG. 32.

FIG. 33 shows a specific sense amplifier (S.A.) 10. A transistor 10b precharges the match lines 16, 17 to initialize them. In the identity retrieval operation, an inverter 10a is used to detect and output the potential variation of the match lines 16, 17 thus initialized and held "1" (H: high). A transistor 10c acts as a weak positive latch for restraining the influence of noise and the like.

In the present invention, ordinary NAND-type ROH with two bits as a set constitute the CAM memory cell. As shown in FIG. 32, two of the CAM memory cells 11a and 11b are selected by the control word line $W_{j(1)}$. Moreover, two of the CAM memory cells 11c and 11d are selected by the word line $W_{j+1(1)}$. Similarly, other CAM memory cells (those enclosed with a dotted line) are selected word to word; namely, there is one memory block every four CAM memory cells. In other words, one CAM memory cell is selected per memory block during the retrieval operation and identified with the retrieval data. However, a plurality of memory blocks are simultaneously compared in the vertical direction of the data line 18a, that is, in the parallel direction the word line $W_{j(0)}$. For instance, four CAM memory cells 11a, 11b, 11c, 11d selected by the word lines $W_{j+1(1)}$ are simultaneously compared with the retrieval data.

With the operation above as a premise, the retrieval operation will be described further. When the match lines 16, 17 are precharged, the retrieval data added to the data lines 18a, 18b and 19a, 19b start being identified. However, there still exists a rule governing the way of adding retrieval data to the data lines 18a, 18b, 19a, 19b. Assuming retrieval data are "0", "1" ($SD_i=0$, $SD_{i+1}=1$), "0" and "1" are added to the data lines 18a, 19a respectively and the inverted data are also added to the data lines 18b, 19b. In other words, the data line 18b is set at "1," whereas the data line 19b is set at "0."

Then the word line $W_{(0)}$ is set at "1" (H: high) and the memory blocks UB1, UB2 are selected and the word line $W_{j(1)}$ is set at "0" (L: low). On the other hand, the word line $W_{j+1(0)}$ is set at "1" (H: high) and the memory blocks UB3, UB4 are selected and the word line $W_{j+1(1)}$ is also set at "0" (L: low). The four CAM memory cells 11a, 11b, 11c, 11d are thus activated. In the NAND memory structure like this, 0 V in the "0" (L: low) voltage state is applied to a word line to be selected and 5 V in the "1" (H: high) voltage state is applied to all gates of transistors connected to the other series. In this state, it is detectable whether or not the transistor thus selected is turned off by the enhancement transistor 63 or whether it is held ON by the depression transistor 64. Consequently, 5 V in the "1" (H: high) state is totally applied to the word lines $W_{j(2)}$, $W_{j(3)}$, $W_{j(4)}$ and $W_{j+1(2)}$, $W_{j+1(3)}$, $W_{j+1(4)}$ for controlling the respective gates of the transistors connected to the other series.

Each of the match lines 16, 17 is considered in terms of the retrieval operation. First, consideration is directed no the retrieval operation of the match line 16, that is, the memory blocks UB1, UB2 selected by the word line $W_{j(0)}$.

When the word line $W_{j(1)}$ is set at "0," only the depression transistor 64 in the right-hand chain of the CAM memory cell 11a is turned on. However, the source and drain electrodes of the depression transistor 64 are equivalent to one end of the data line 18b "1" (H: high) and that of the unidirectional element 37. Moreover, that one end of the unidirectional element is also held at "1" in conformity with the "1" potential (H: high) of the match line $(S_j)$ 16. Even though the depression transistor 64 is turned on, the data line 18b is prevented from affecting the match line $(S_j)$ 16. Similarly, the data line 19a and match line $(S_j)$ 16 are connected when the depression transistor 64 in the left-hand chain of the CAM memory cell 11b selected by the word line $W_{j(1)}$ is turned on; however, the precharged match line $(S_j)$ 16 remains at "1" (H: high) after all as their potentials are "1" (H: high).

In other words, the potential of the precharged march line $(S_j)$ 16 remains at "1" (H: high) without variation if the contents of the CAM memory cell 11a (="0") and the CAM memory cell 11b (="1") correspond to each other. This potential is detected by the sense amplifier (S.A.) 10 and the result thus detected is stored in the storage register (S.R.) $24_j$ via the working register (W.R.) 21 and the selective transistor $22_{j(1)}$.

Moreover, there are provided the selective transistors $22_{j(1)}$, $22_{j(2)}$, $22_{j(3)}$, $22_{j(4)}$ for selecting the respective storage register (S.R.) $24_{j(1)}$, $24_{j(2)}$, $24_{j(3)}$, $24_{j(4)}$. These registers and the selective transistors are to sequentially select and retain the results of retrieved identity each time the CAM memories are selected by the respective word lines $W_{j(1)}$, $W_{j(2)}$, $W_{j(3)}$, $W_{j(4)}$.

Subsequently, the memory blocks UB3, UB4 selected by the word line $W_{j+1(0)}$ are considered. When potential 0 V held at "0" (L: low) is supplied to the word line $W_{j+1(1)}$, the CAM memory cells 11c, 11d are activated. However, as far as the CAM memory cell 11d is concerned, it will not affect the match line $(S_{j+1})$ 17 as in the case of the CAM memory cell 11b.

This is not the case with the CAM memory cell 11c. Since the depression transistor 64 is located on the left-hand side of the CAM memory cell 11c, the data line 18a with the potential 0 V held at "0" (L: low) applied thereto is connected to one end of the unidirectional element 37. The other end of this unidirectional element is the match line $(S_{j+1})$ 17 precharged with "1" and consequently the charge of the match line $(S_{j+1})$ 17 is pulled out by the 0 V potential of the data line 18a via the unidirectional element 37 and the depression transistor 64 of the CAM memory cell 11c. The match line $(S_{j+1})$ 17 is set at "0" (L: low).

Even when the match line $(S_{j+1})$ 17 is set at "0" (L: low) and when the depression transistor 74 of the CAM memory cell 11d held ON, the depression transistor 64 and the match line $(S_{j+1})$ 17 are intercepted by the unidirectional element 37.

When the contents of the CAM memory cell 11c (="1") and the CAM memory cell 11b (="1") become different from identity retrieval data $SD_i$ (="0") and $SD_{i+1}$ (="1"), the potential of the precharged match line $(S_{j+1})$ 17 varies to "0" (L: low). This potential variation is detected by the sense amplifier (S.A.) 10 and the result thus detected is stored in the storage register (S.R.) $24_{j+1(1)}$ via the working register (W.R.) 21 and the selective transistor $22_{j(1)}$.

With respect to the CAM memory cell selected by any other word line of FIG. 32, the same identity retrieval operation is similarly performed. Although every word is subjected to simultaneous retrieval operation in the case of the ordinary CAM, even one word in all memory blocks is subjected to retrieval operation in this embodiment of the present invention. This is partly because the CAM memory according to the present invention is extremely smaller than she conventional one, partly because each of the CAM cells is hardly allowed to have the sense amplifier of a match line and partly because it is not always necessary to perform the retrieval operations at a time, depending on the use. In this example, it is the first time for the intended data to be retrieved after the retrieval operation has been repealed four times.

Figure 34:
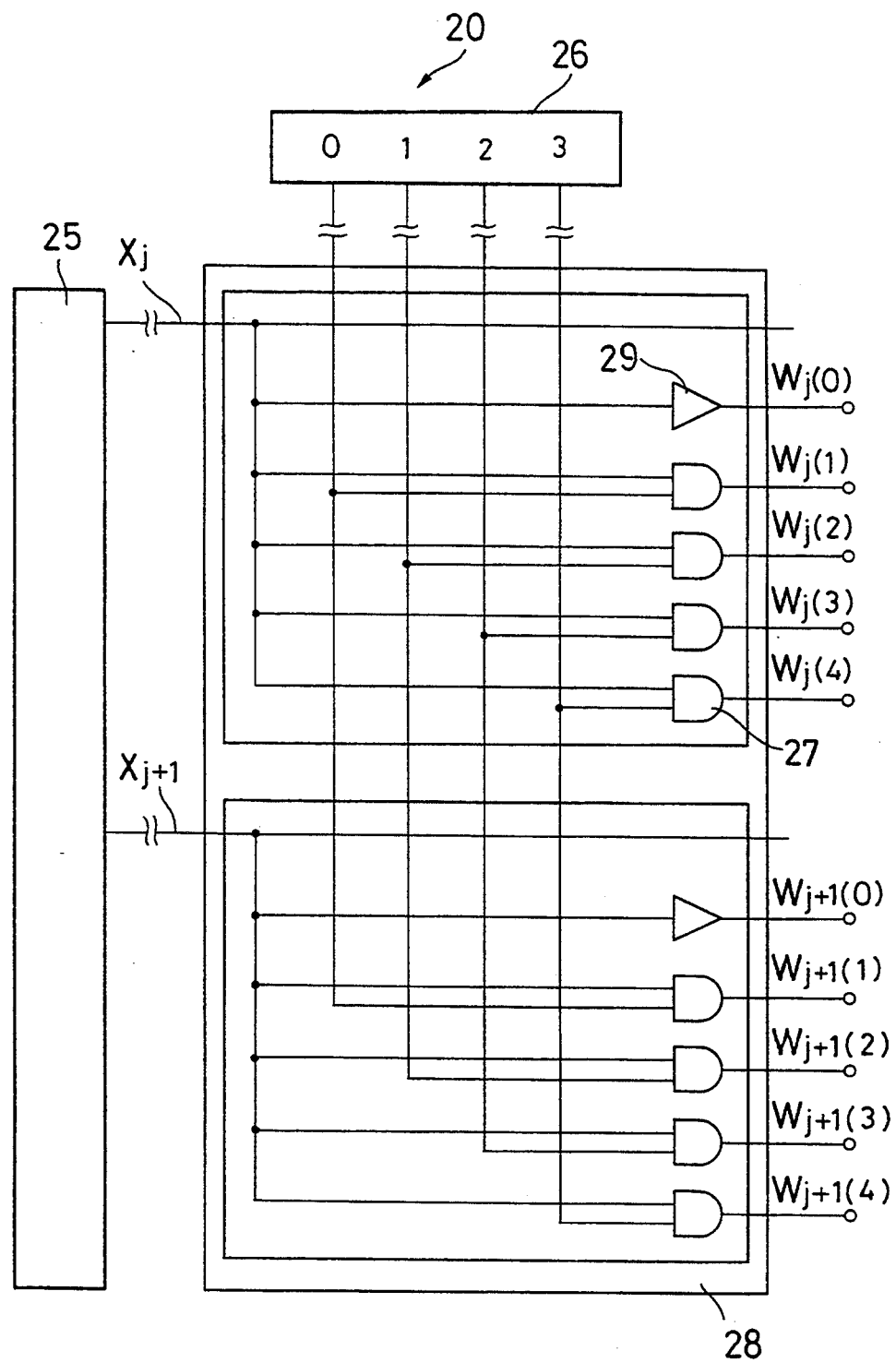
FIG. 34 is a circuit diagram showing an exemplary decode circuit for driving each word line of the memory cell of FIG. 32.

FIGS. 34 shows an exemplary address decoder circuit 20 for performing the retrieval operation. Memory block decoder lies $X_j$, $X_{j+1}$ are output from the main (upper order) decoder 25. Moreover, each of the sub-block decoders performs logic operations with each of the memory block decoder lines $X_j$, $X_{j+1}$ to determine the output of each word line. For instance, $W_{j(0)}$ receives the signal of the memory block decoder line $X_j$ with the buffer 29, whereas $W_{j(1)}$ is formed by ANDing the signal of the memory block decoder line $X_j$ by means of AND circuit 27 with the signal of the signal line 0 of the sub-block decoder 26.

At the time of retrieval, the memory block decoder lines $X_j$, $X_{j+1}$ become "1" and the signal lines 0, 1, 2, 3 of the sub-block decoder 26 sequentially become "1" and besides the CAM memory cell of each memory block is selected, whereby the result thus retrieved is stored in each storage register (S.R.).

Moreover, a NAND memory of FIG. 32 may also be used as an ordinary memory. A brief description will subsequently be given of data reading.

A description will be given of, for instance, a 2-bit transistor constituting the CAM memory cell 11a. First, the grounding transistor 36 is activated and the data lines 18a, 18b are precharged. Subsequently, the word line $W_{j(0)}$ for the block selection is set at "1" (H: high), whereas the wore line $W_{j(1)}$ for the memory block selection is set at "0" (L: low). Then only the left-hand transistor chain in which the memory cell is the depression transistor 64 is turned on and the data line 18b is grounded via the grounding transistor 36. Moreover, the other data line 18a remains at "1" (H: high) and these are invertedly output by the inverter 4. As a result, the left-hand enhancement transistor 63 forming the CAM cell 11a expresses "0," whereas the right-hand depression transistor 64 expresses "1." Consequently, it is only necessary to use these memories as an ordinary memory by forming them in a given form or as data desired to be subjected to the identity retrieval operation with opposed two bits as a set.

Figure 35:
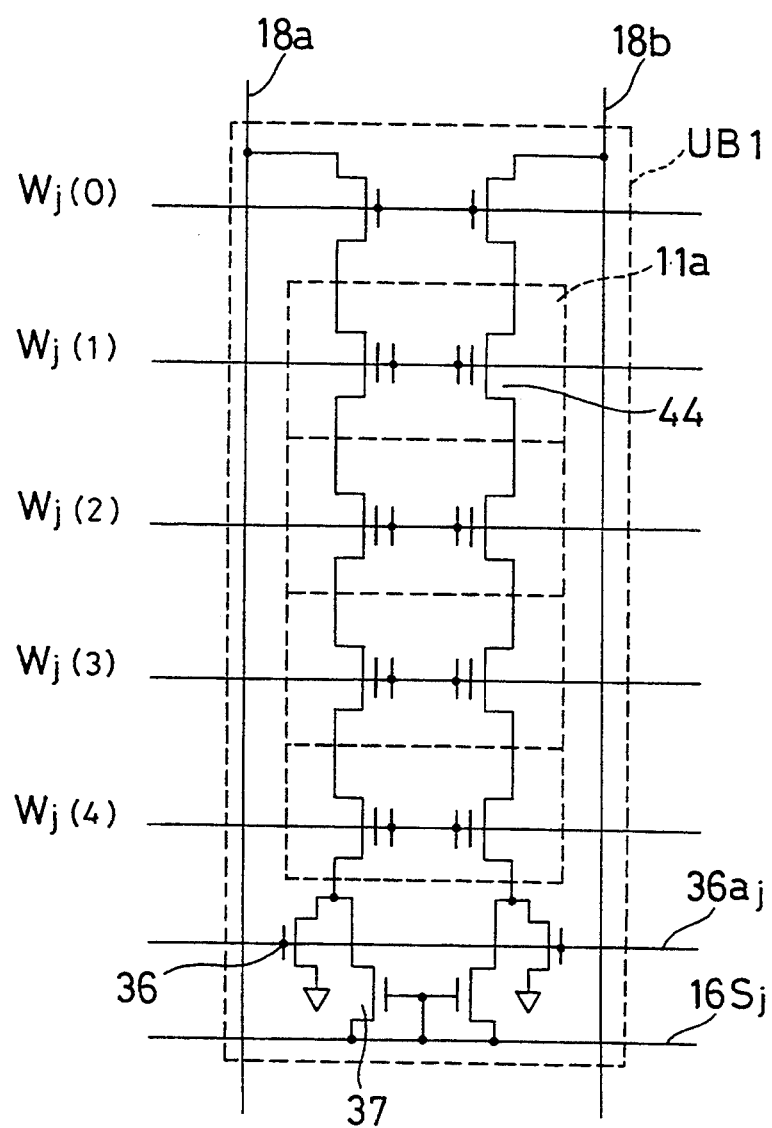
FIG. 35 is a circuit diagram of another memory block with a nonvolatile memory as a base in other embodiment of the semiconductor integrated circuit according to the present invention.

Moreover, data is solid in the above-mentioned ROM construction. The data storage transistor to be incorporated during the process of manufacture is not limited to a depression transistor but may be an EPROM or EEPROM type reloadable transistor as far as their construction is concerned. FIG. 35 shows an example, which is similar in construction to what is shown in FIG. 32, wherein only a storage transistor portion comprises a floating gate EEPROM transistor 44.

The basic operation comprises the steps of injecting electrons into the floating gate to form an enhancement transistor with threshold voltage $V_{TH}$ ranging from 0.5–3.5 V and conversely pulling out electrons therefrom to form a depression transistor whose VTH approximately ranging from −1 V to −6 V. The detailed description has been given in Masaki Momodomi et al., "A 4-Mb NAND EERPOM with Tight Programmed Vt Distribution," IEEE J. Solid-State Circuits, Vol 1126, No. 4, pp. 429–499. April 1991.

In the case of an ordinary EEPROM, the potential difference between the source and drain of the storage transistor may be set as low as about 2 V to minimize the influence of the data reading on the signal charge accumulated in the floating gate.

In the case of the sense amplifier 10 without the capability of driving the current shown in an embodiment of the present invention, the precharged voltage of the match line is lowered so as to meet the requirements above during the time of identity retrieval operation.

Moreover, by reducing the threshold voltage $V_{TH}$ of the unidirectional element 37 up to 3 V but not by reducing the precharged voltage, the lowermost electrode of the transistor chain may be suppressed to about 2 V via the unidirectional element 37 even though the match lines 16, 17 are precharged with 5 V.

Further, by making the sense amplifier 10 itself a current drive type amplifier, it is possible to set the voltage of the match lines 16, 17 in a range of 1.5–2.0 V in the state of conformity or non-conformity.

Figure 36:
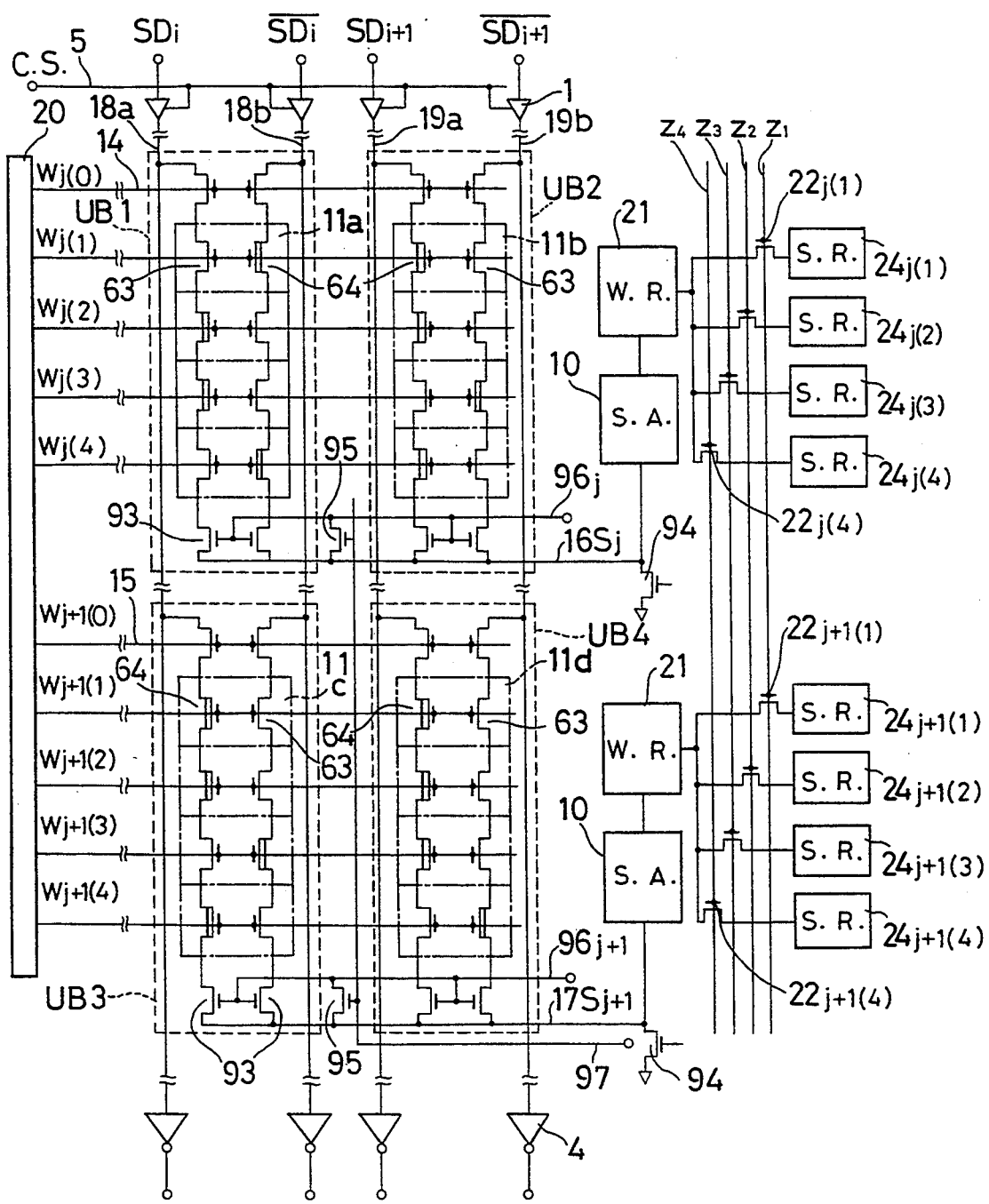
FIG. 36 is a circuit diagram of a different memory cell array in other embodiment of the semiconductor integrated circuit according to the present invention.

FIG. 36 shows another embodiment of the present invention. In this case, the stored data and retrieval data are made thoroughly similar to those described in the preceding embodiment for simplification. Therefore, the different is attributed to a unidirectional element.

With special attention riveted to the memory block UB3, one end of a control transistor 93 is connected to the lowermost end of the transistor chain, whereas the other end thereof is connected to the match line ($S_{j+1}$) 17. A grounding transistor 94 is also used to ground the match line ($S_{j+1}$) 17. In addition, there exists a connection transistor 95 for connecting the gate electrode of the control transistor 93 to the drain electrode thereof (on the side of the match line ($S_{j+1}$) 17).

With this arrangement, the match line ($S_{j+1}$) 17 and the control signal line are precharged with "1" (H: high) and set floating-high. Moreover, a connection transistor 95 is made active to initialize the match line ($S_{j+1}$) 17. The retrieval operations is similarly performed as in the case of the preceding embodiment. At this time, the grounding transistor 94 needless to say remains inactive.

When the retrieval operation is started, the word line $W_{j+1(0)}$ is set at "1" and the word line $W_{j+1(1)}$ is set at "0." Then the charge of the match line ($S_{j+1}$) 17 is pulled out by the "0" (L: low) potential 0 V of the data line 18a, whereby the potential of the match line ($S_{j+1}$) 17 is reduced. However, the connection transistor 95 constantly maintains the potential difference $\Delta V$ at 0 V between the gate and drain electrodes (on the side of match line ($S_{j+1}$) 17) of the control transistor 93. In other words, the connection transistor 95 makes the control transistor 93 act as a unidirectional element, so that the current is prevented from constant flowing from "1" potential of the data line 19a to the constant match line ($S_{j+1}$) 17.

Needless to say, the potential difference between the gate and drain electrodes (on the side of match line ($S_{j+1}$) 17) of the control transistor 93 takes an extremely small value for an extremely short period. This is because a slight delay occurs during the time the potential is caused to vary by resistance or capacity component as these transistors or connection wires are mounted on the semiconductor substrate. However, such resistance or else is not constantly present and the potential difference $\Delta V$ can be suppressed within an allowable range by increasing the number of transistors 95 to be connected or by adopting low-resistance wiring.

The allowable range stated above makes it a condition that the control transistor 93 on the side of the data line 19a in the stat of "1" is turned on and that no potential recovery of the match line ($S_{j+1}$) 17 is produced. In other words, the allowable range should be not higher than the threshold voltage (not lower than the threshold voltage $V_{TH}=0.8$ V fabricated by the normal substrate bias effect) of the control transistor with the then match line ($S_{j+1}$) 17 as what is appropriated to the source electrode. The above means ms competent enough to realize the object.

Moreover, the operation is facilitated by setting the fabricated threshold voltage $V_{TH}$ of the control transistor 93 at about 3 V, that is, setting it higher than that of any transistor on the periphery thereof. The setting of a high threshold voltage $V_{TH}$ is very important for protecting data in the memory cell at the time this configuration is developed into EPROM or EEPROM as in the case of the preceding embodiment.

In other words, the function of the unidirectional element can be performed by the connection transistor 95 and the control transistor 93 at the time of data retrieval in this embodiment. When they are operated as ordinary memories, the connection transistor 95 is made inactive and the control transistor 93 as well as the grounding transistor 94 is operated to permit the stored data to be read.

The effect of this arrangement lies in the fact that two of the transistors such as the unidirectional element and the grounding transistor per transistor can be dispensed with, so that higher integration becomes possible.

Although a description has been given of a NAND-type ROM memory by way of example, needless to say it is also possible to use a nonvolatile memory including EPROM or EEPROM as a memory cell as in the case of the preceding embodiment.

The present invention is intended to implement the idea of providing a NAND-type CAM memory with ROM or a nonvolatile memory as a base.

The unidirectional element or the grounding transistor is provided at the lower most end (with the side of the data line as the uppermost end) of each transistor chain constituting the NAND memory and the CAM memory with two bits as a set is used, whereby electrical interference between the retrieval CAM memory cells can be suppressed. Moreover, the use of the sense amplifier for detecting the results of word retrieval in each memory block and the selective means for selecting the results on a retrieval word basis and storing the result in the identity retrieval holding means can realize the idea of providing extremely large scale integrated CAM.

As the unidirectional element makes possible the suppression of electrical interference, moreover, ordinary memory data can be stored partially so as to practically provide large scale integrated CAM savoring of greater freedom.

In addition, CAM with not only special ROM but also a nonvolatile memory as a base is of high utility value applicable to high-speed retrieval functions and flexible data bases featuring optional key words in the age of information. Its industrial utility is therefore prominent.

What is claimed is:

1. A semiconductor integrated circuit comprising:
    a first data line;
    a second data line;
    a match line;
    a control word line;
    first connection means for controllably electrically connecting the control word line to the match line;
    potential float means for controllably allowing a potential of the control word line to float; and
    a memory cell, comprising:
    second connection means for providing a circuit path between the match line and one of the first data line and the second data line, and
    enable means for selectively enabling the circuit path;
    wherein the potential float means and the first connection means are enabled during a data retrieval operation to allow the potential of the control word line to positively correlate to an electric potential of the match line.

2. The semiconductor integrated circuit of claim 1, wherein said match line further has potential detecting means for detecting the electric potential of said match line.

3. The semiconductor integrated circuit of claim 1, wherein said match line further has fixing means for fixing the electric potential of said match line.

4. The semiconductor integrated circuit of claim 1, wherein the second connection means comprises a first storage unit providing a first circuit path between the match line and the first data line and a second storage unit providing a second circuit path between the match line and the second data line.

5. The semiconductor integrated circuit of claim 4, wherein said first and second storage units each comprise a coupler.

6. The semiconductor integrated circuit of claim 4, wherein each of said first and second storage units comprises a nonvolatile memory element, each nonvolatile memory element connected to the enable means.

7. The semiconductor integrated circuit of claim 4, wherein said first and second storage units each comprise a nonvolatile memory element.

8. The semiconductor integrated circuit of claim 7, wherein said nonvolatile memory element is a MONOS-type nonvolatile memory element.

9. The semiconductor integrated circuit of claim 1, wherein the enable means is a selective transistor.

10. The semiconductor integrated circuit of claim 9, wherein said selective transistor is a unidirectional element.

11. The semiconductor integrated circuit of claim 10, wherein said unidirectional element has a threshold voltage higher than that of any peripheral element.

12. A semiconductor integrated circuit comprising:
a plurality of retrieval memory word cells, the plurality of cells arranged in a rectangular matrix array, the array having a plurality of rows of cells and a plurality of columns of cells;
a plurality of control word lines, each control word line associated with a corresponding row of cells;
a plurality of match lines, each match line associated with a corresponding plurality of rows of cells;
a plurality of first data lines, each first data line associated with a corresponding column of cells;
a plurality of second data lines, each second data line associated with a corresponding of column of cells; and
a plurality of potential detecting means for detecting an electrical potential of a match line, each potential detecting means connected to a corresponding match line;
wherein each retrieval memory word cell comprises:
connection means for providing a circuit path between the corresponding match line and one of the corresponding first and second data lines, and
enable means for controllably enabling the circuit path; and
wherein the corresponding control word line operates the enable means of each of the memory cells of the corresponding row during a data retrieval operation to electrically connect the corresponding match line to various ones of the plurality of first and second data lines.

13. The semiconductor integrated circuit of claim 12 wherein each of said first and second storage units comprises a nonvolatile memory element, each nonvolatile memory element connected to the enable means.

14. The semiconductor integrated circuit of claim 12, wherein said match line further has fixing means for fixing the electric potential of said match line.

15. The semiconductor integrated circuit of claim 12, further comprising a plurality of potential float means, each potential float means for allowing a potential of a corresponding control word line to float and a plurality of second connection means, each connection means for connecting a corresponding control word line to the corresponding match line, said plurality of connection means and said plurality of potential float means being activated during the data retrieval operation, the electric potential of said match line becoming positively correlated to the potential of said control word line.

16. The semiconductor integrated circuit of claim 12, further comprising holding means for holding the result of a detection made by said potential detecting means on each retrieval memory word block.

17. The semiconductor integrated circuit of claim 12, further comprising means for driving the plurality of control word lines corresponding to each of said retrieval memory word blocks in a predetermined order.

18. The semiconductor integrated circuit of claim 12, wherein the enable means is a selective transistor.

19. The semiconductor integrated circuit of claim 12, wherein the connection means comprises a first storage unit providing a first circuit path between the match line and the first data line and a second storage unit providing a second circuit path between the match line and the second data line.

20. The semiconductor integrated circuit of claim 19, wherein said first and second storage units each comprises a coupler.

21. The semiconductor integrated circuit of claim 20, wherein each said storage unit is composed of a nonvolatile memory element.

22. The semiconductor integrated circuit of claim 21, wherein said nonvolatile memory element is a MONOS-type nonvolatile memory element.

23. The semiconductor integrated circuit of claim 20, further comprising a common connection line connected to one of the couplers of the first and second storage units of the memory in the plurality of retrieval memory word blocks, the enabling means and couplers of the enable means, and one unidirectional element provided between said common connection line and each of said plurality match lines.

24. The semiconductor integrated circuit of claim 23, further comprising fixing means for fixing an electric potential of said common connection line.

25. The semiconductor integrated circuit of claim 23, wherein each said unidirectional element has a threshold voltage higher than that of any peripheral element.

26. The semiconductor integrated circuit of claim 20, further comprising a common connection line connected to one of the couplers of the first and second storage units of the memory in the plurality of retrieval memory word blocks, said enable means and couplers of the enable means; a control element provided between said common connection line and said match line; and a connection means for connecting a gate electrode of said control element to said match line.

27. The semiconductor integrated circuit of claim 26, further comprising fixing means for fixing the electric potential of said match line.

28. The semiconductor integrated circuit of claim 26, wherein said control element has a threshold voltage higher than that of any peripheral element.

29. A semiconductor integrated circuit, comprising:
a match line;
a first data line;
a second data line;
a memory cell, comprising:
connection means for selectively providing a circuit path between the match line and one of the first and second data lines, and
enable means for controllably enabling the circuit path;
a control word line controlling the connection means; and
a control line controlling the enable means;
wherein the control word line and control line control the connection means and enable means to connect the match line to one of the first and second data lines during a data retrieval operation.

30. The semiconductor integrated circuit of claim 29, further comprising potential detecting means for detecting an electric potential of said match line.

31. The semiconductor integrated circuit of claim 29, wherein said match line further has fixing means for fixing an electric potential of said match line.

32. The semiconductor integrated circuit of claim 29, wherein the connection means comprises a first storage unit providing a first circuit path between the match line and the first data line and a second storage unit providing a second circuit path between the match line and the second data line.

33. The semiconductor integrated circuit of claim 32, further comprising a unidirectional element provided between said match line, and one of the first and second storage units and said enable means.

34. The semiconductor integrated circuit of claim 32, wherein each said storage unit comprises a nonvolatile memory element.

35. The semiconductor integrated circuit of claim 34, wherein each of said first and second storage units comprises a nonvolatile memory element, and a connection line of both said nonvolatile memory elements is connected to the enable means.

36. The semiconductor integrated circuit of claim 34, wherein each said nonvolatile memory element is at least one of an EPROM, an EEPROM and an UVEPROM.

37. The semiconductor integrated circuit of claim 34, wherein one of said first and second storage units is a depletion-mode transistor, another of said first and second storage units is an enhancement-mode transistor, and the enable means is connected to each of the depletion-mode and enhancement-mode transistors in series.

38. The semiconductor integrated circuit of claim 34, further comprising potential float means for allowing a potential of the control line to float and connection means for connecting the control line to said match line, said connection means and said potential float means being activated during a data retrieval operation, a potential of said match line becoming positively correlated to the potential of said control line.

39. The semiconductor integrated circuit of claim 29, wherein the enable means is at least one selective transistor provided between at least one of the connection means and the match line and the connection means and the first and second data lines.

40. The semiconductor integrated circuit of claim 39, wherein said at least one selective transistor has a threshold voltage higher than that of any peripheral circuit.

41. The semiconductor integrated circuit of claims 39, wherein said at least one selective transistor is a unidirectional element.

42. The semiconductor integrated circuit of claim 41, wherein said unidirectional element has a threshold voltage higher than that of any peripheral element.

43. A semiconductor integrated circuit, comprising:
a plurality of retrieval memory cells, the plurality of cells arranged in a rectangular matrix array, the array having a plurality of rows of cells and a plurality of columns of cells;
a plurality of control word lines, each control word line associated with a corresponding row of cells;
a plurality of match lines, each match line associated with a corresponding plurality of rows of cells;
a plurality of sets of first and second data lines, each set associated with a corresponding column of cells; and
a plurality of potential detecting means, each potential detecting means connected to a corresponding match line;
wherein each memory cell comprises:
connection means for selectively providing a circuit path between the corresponding match line and one of the first and second data lines of the corresponding set of first and second data lines,
enable means for controllably enabling the circuit path, and
a control line controlling the enable means, wherein the corresponding control word line controls the connection means; and
wherein the corresponding control word line and control line control the connection means of each cell of the corresponding row to establish the circuit paths between the sets of first and second data lines and the corresponding match line during a data retrieval operation.

44. The semiconductor integrated circuit of claim 43, further comprising fixing means for fixing an electric potential of said match line.

45. The semiconductor integrated circuit of claim 43, further comprising potential float means for allowing a potential of the control line to float and connection means for connecting said control line to said match line.

46. The semiconductor integrated circuit of claim 43, further comprising potential float means for allowing a potential of the control word line to float and connection means for connecting the control word line to said match line, said connection means and said potential float means being activated during the data retrieval operation, a potential of said match line becoming positively correlated to the potential of said control word line.

47. The semiconductor integrated circuit of claim 43, further comprising holding means for holding the result of a detection made by said potential detecting means for each retrieval memory word block.

48. The semiconductor integrated circuit of claim 43, further comprising means for driving the plurality of control word lines corresponding to each of said retrieval memory word blocks in a predetermined order.

49. The semiconductor integrated circuit of claim 43, wherein the connection means comprises a first storage unit providing a first circuit path between the match line and the first data line and a second storage unit providing a second circuit path between the match line and the second data line.

50. The semiconductor integrated circuit of claim 49, further comprising at least one selective transistor provided between said match line and said first and second storage units, and a control line for controlling said selective transistor, said control word line and said control line controlling the connection between each of said first and second data lines of the corresponding set of data lines and said corresponding match line connection states of said first and second storage units.

51. The semiconductor integrated circuit of claim 49, wherein one of said first and second storage units in the memory cell is a depletion-mode transistor and another of said first and second storage units is an enhancement-mode transistor.

52. The semiconductor integrated circuit of claim 49, wherein said selective transistor has a threshold voltage higher than that of any peripheral element.

53. The semiconductor integrated circuit of claim 49, wherein each said storage unit comprises a nonvolatile memory element.

54. The semiconductor integrated circuit of claim 53, wherein said nonvolatile memory element comprises at least one of an EPROM, an EEPROM and a UVE-PROM.

55. The semiconductor integrated circuit of claim 49, further comprising a common connection line connected to the first and second storage units of each memory block of the plurality of retrieval memory word blocks, wherein said enable means is provided between one end of said common connection line and said match line.

56. The semiconductor integrated circuit of claim 55, further comprising fixing means for fixing an electric potential of said common connection line.

57. The semiconductor integrated circuit of claim 43, wherein the enable means is at least one selective transistor provided between at least one of the connection means and the match line and the connection means and the first and second data lines.

58. The semiconductor integrated circuit of claim 57, wherein said selective transistor is a unidirectional element.

59. The semiconductor integrated circuit of claim 58, wherein said unidirectional element has a threshold voltage higher than that of any peripheral element.

60. A semiconductor integrated circuit, comprising:
a first transistor chain comprising a plurality of serially connected transistors;
a second transistor chain comprising a plurality of serially connected transistors;
a first data line connected to a first end of the first transistor chain;
a second data line connected to a first end of the second transistor chain;
a match line;
potential detecting means for detecting an electrical potential of the match line; and
a selective transistor connecting the match line to second ends of each of the first and second transistor chains.

61. The semiconductor integrated circuit of claim 60, wherein one of enhancement-mode and depletion-mode transistors form said first and second transistor chains, depending on storage data of the first and second data lines, respectively and wherein each transistor chain includes one of an enhancement-mode and a depletion-mode transistor forms at least one of the transistors of said transistor chains as a chain control transistor, irrespective of said storage data.

62. A semiconductor integrated circuit of claim 60, wherein said selective transistor is a unidirectional element.

63. The semiconductor integrated circuit of claim 62, further comprising fixing means for fixing electric potentials of said second ends of said first and second transistor chains.

64. The semiconductor integrated circuit of claim 62, wherein said unidirectional element has a threshold voltage higher than that of any peripheral element.

65. The semiconductor integrated circuit of claim 60, further comprising connection means for connecting said match line to one control line connecting to the gate electrodes of said two selective transistor connected to said first and second selective transistor chains.

66. The semiconductor integrated circuit of claim 65, wherein said selective transistor connected to the second ends of said first and second transistor chains has a threshold voltage higher than that of any peripheral circuit.

67. The semiconductor integrated circuit of claim 65, further comprising mixing means for fixing an electric potential of said match line.

68. The semiconductor integrated circuit of claim 60, further comprising potential float means for allowing a potential of the control line to float and connection means for connecting the control line to said match line, said connection means and said potential float, means being activated during the data retrieval operation, and a potential of said match line is positively correlated to the potential of said control line.

69. The semiconductor integrated circuit of claim 68, further comprising a plurality of word lines for driving respective gates from the outermost transistors among the transistors constituting said first and second transistor chains on one side toward the other side, said plurality of word lines being commonly used for said first and second transistor chains, and holding means for selectively holding results of retrieval from said potential detection means, said holding means corresponding to one of the plurality of word lines other than those used to control said chain control transistor.

70. The semiconductor integrated circuit of claim 69, further comprising means for driving the plurality control lines of each said retrieval memory word block in a predetermined order.

71. The semiconductor integrated circuit of claim 68, wherein said first and second transistor chains each comprises one of enhancement-mode and depletion-mode transistors, depending on the storage data.

72. A semiconductor integrated circuit of claim 61, wherein nonvolatile transistors form parts of said first and second transistor chains.

73. The semiconductor integrated circuit of claim 60, wherein nonvolatile transistors form portions of said first and second transistor chains and wherein one of an enhancement-mode and a depletion-mode transistor forms at least one of the transistors of each said transistor chains as a chain control transistor.

74. The semiconductor integrated circuit of claim 60, further comprising a plurality of word lines driving respective gates from the outermost transistors among the transistors constituting said first and second transistor chains on one side toward the other side, each of said plurality of word lines being commonly connected to said first and second transistor chains, and holding means for selectively holding results of retrieval from said potential detection means, said holding means corresponding to ones of the plurality of control lines not used to control said chain control transistor.

75. The semiconductor integrated circuit of claim 74, further comprising means for driving the respective control word lines of said retrieval memory word blocks in order predetermined.

76. A semiconductor integrated circuit comprising:
   a transistor;
   a first signal line connected to one of a source electrode of the transistor and a drain electrode of the transistor;
   a second signal line connected to the other of the source and drain electrodes;
   a control word line connected to a gate of the transistor;
   connection means for controllably electrically connecting the first signal line to the control word line; and
   potential float means for allowing an electrical potential of the control word line to float;
   wherein the transistor operates as a unidirectional element between the first signal line and the second signal line when the connection means and potential float means are activated.

77. A semiconductor integrated circuit comprising:
   a memory cell;
   a match line;
   a control word line;
   a first data line;
   a second data line;
   potential float means for allowing a potential of the control word line to float;
   connection means for electrically connecting the control word line to the match line; and
   control means for operating the potential float means and the connection means during a data retrieval operation so that the potential of the control word line positively correlates to a potential of the match line;
   wherein the memory cell comprises a first storage means for providing a first circuit path between the match line and the first data line;
   second storage means for providing a second circuit path between the match line and the second data line; and
   enable means for controllably enabling one of the first and second circuit paths; and
   wherein the potential float means and the first connection means are enabled during a data retrieval operation to allow the potential of the control word line to positively correlate to a potential of the match line.

* * * * *